(12) United States Patent
Kimura

(10) Patent No.: US 9,123,672 B2
(45) Date of Patent: Sep. 1, 2015

(54) SEMICONDUCTOR DEVICE

(75) Inventor: Hajime Kimura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1421 days.

(21) Appl. No.: 10/822,848

(22) Filed: Apr. 13, 2004

(65) Prior Publication Data

US 2004/0189567 A1   Sep. 30, 2004

Related U.S. Application Data

(62) Division of application No. 10/004,483, filed on Dec. 6, 2001, now Pat. No. 6,724,012.

(30) Foreign Application Priority Data

Dec. 14, 2000 (JP) ................................. 2000-379987

(51) Int. Cl.
  *H01L 27/32*  (2006.01)
  *H01L 27/12*  (2006.01)
  *H01L 27/146*  (2006.01)
  (Continued)

(52) U.S. Cl.
  CPC .......... *H01L 27/3234* (2013.01); *G06F 3/0412* (2013.01); *H01L 27/14678* (2013.01); *H04N 1/028* (2013.01); *H04N 1/02805* (2013.01); *H04N 1/0313* (2013.01); *H04N 1/0314* (2013.01); *G02F 1/13454* (2013.01); *G06F 3/042* (2013.01); *G09G 3/2085* (2013.01); *G09G 3/3225* (2013.01); *G09G 3/3266* (2013.01); *G09G 3/3648* (2013.01); *G09G 3/3659* (2013.01); *G09G 3/3674* (2013.01); *G09G 2310/0202* (2013.01); *H01L 27/12* (2013.01); *H01L 27/14609* (2013.01);
  (Continued)

(58) Field of Classification Search
  CPC ..... G06F 3/0412; G06F 3/042; G09G 3/3648; G09G 3/3659; G09G 3/3674; G09G 3/2085; G09G 3/3225; G09G 3/3266; G09G 2310/0202
  USPC ............................................ 345/81, 100, 207
  See application file for complete search history.

(56) References Cited

U.S. PATENT DOCUMENTS

4,695,859 A    9/1987 Guha et al.
5,313,055 A    5/1994 Shiratsuki et al.
(Continued)

FOREIGN PATENT DOCUMENTS

EP   0 553 823    8/1993
EP   0 730 258    9/1996
(Continued)

*Primary Examiner* — Kathy Wang-Hurst
*Assistant Examiner* — David Tung
(74) *Attorney, Agent, or Firm* — Eric J. Robinson; Robinson Intellectual Property Law Office, P.C.

(57) ABSTRACT

A semiconductor device in which a reduction in size and thinness are realized is provided. The semiconductor device of the present invention can realize a reduction in size by forming light emitting elements as a light source, and photodiodes as photoelectric conversion elements on the same substrate. Further, it becomes possible to control two signal lines by using one driver circuit with using an output switching circuit. As a result, it becomes possible to reduce the area occupied by the driver circuits of the semiconductor device, and the semiconductor device can be made smaller.

85 Claims, 28 Drawing Sheets

(51) Int. Cl.
  *H04N 1/028*   (2006.01)
  *H04N 1/031*   (2006.01)
  *G02F 1/1345*  (2006.01)
  *G09G 3/36*    (2006.01)
  *G09G 3/20*    (2006.01)
  *G09G 3/32*    (2006.01)
  *G06F 3/041*   (2006.01)
  *G06F 3/042*   (2006.01)

(52) U.S. Cl.
  CPC .... *H01L 27/14643* (2013.01); *H01L 27/14665* (2013.01); *H01L 27/3244* (2013.01); *H01L 2251/5315* (2013.01)

(56) References Cited

U.S. PATENT DOCUMENTS

| | | | |
|---|---|---|---|
| 5,818,412 A | 10/1998 | Maekawa | |
| 5,818,413 A | 10/1998 | Hayashi et al. | |
| 6,243,155 B1 * | 6/2001 | Zhang et al. | 349/199 |
| 6,246,180 B1 * | 6/2001 | Nishigaki | 315/169.3 |
| 6,404,137 B1 * | 6/2002 | Shodo | 315/169.1 |
| 6,424,326 B2 | 7/2002 | Yamazaki et al. | |
| 6,445,372 B1 | 9/2002 | Asai | |
| 6,480,305 B1 * | 11/2002 | Resman | 358/482 |
| 6,724,012 B2 * | 4/2004 | Kimura | 257/72 |
| 7,196,699 B1 * | 3/2007 | Kubota et al. | 345/211 |
| 2001/0022565 A1 | 9/2001 | Kimura | |
| 2002/0044208 A1 | 4/2002 | Yamazaki et al. | |
| 2002/0047550 A1 | 4/2002 | Tanada | |
| 2002/0079512 A1 | 6/2002 | Yamazaki et al. | |
| 2003/0035652 A1 * | 2/2003 | Kubo et al. | 396/213 |
| 2004/0189567 A1 | 9/2004 | Kimura | |

FOREIGN PATENT DOCUMENTS

| | | |
|---|---|---|
| JP | 05-216441 | 8/1993 |
| JP | 05-219301 A | 8/1993 |
| JP | 05-252344 A | 9/1993 |
| JP | 07-261932 | 10/1995 |
| JP | 08-234703 | 9/1996 |
| JP | 11125841 A * | 5/1999 |
| JP | 11-282411 | 10/1999 |
| JP | 2001-324958 | 11/2001 |
| JP | 4302346 | 7/2009 |

* cited by examiner

Fig.4A

|  |  | display mode | monochrome read in |
|---|---|---|---|
| light emitting element portion | source signal line driver circuit | pulse | on |
|  | video signal | pulse | on |
|  | EG | pulse | on |
|  | ER | pulse | off |
| sensor portion | SS |  | pulse |
|  | SG | off | pulse |
|  | SR | off | pulse |

Fig.4B

|  |  | display mode | color read in | | |
|---|---|---|---|---|---|
|  |  |  | R | G | B |
| light emitting element potion | source signal line driver circuit | pulse | on | on | on |
|  | video signal (R) | pulse | on | off | off |
|  | video signal (G) | pulse | off | on | off |
|  | video signal (B) | pulse | off | off | on |
|  | EG | pulse | on | on | on |
|  | ER | pulse | off | off | off |
| sensor portion | SS |  | pulse | pulse | pulse |
|  | SG | off | pulse | pulse | pulse |
|  | SG | off | pulse | pulse | pulse |

SEMICONDUCTOR DEVICE

BACKGROUND OF THE INVENTION

1. Field of the Invention

The present invention relates to a semiconductor device which has a light source and is structured by photoelectric conversion elements arranged and a plurality of transistors (hereafter referred to as TFTs) in a matrix shape. Further, the present invention relates to a semiconductor device which has photoelectric conversion elements, light emitting elements, and a plurality of transistors formed on an insulating surface or on a semiconductor substrate. The semiconductor device of the present invention has a function as an image sensor and a display function of an image.

2. Description of the Related Art

Developments in solid state imaging devices which has photoelectric conversion elements such as diodes and CCDs, for reading out electric signals with image information, from character information, drawing information, or the like on a page, have been advancing in recent years. The solid state imaging devices are used in devices such as scanners and digital cameras.

Solid state imaging devices which has photoelectric conversion elements can be roughly categorized into line sensor and area sensor types. Line sensors scan a subject using photoelectric conversion elements formed in a linear shape to take in image information as an electric signal.

In area sensors, on the other hand, also referred to as contact type area sensors, photoelectric conversion elements provided in a plane (planar shape) are disposed on a subject and then take in image information as an electric signal. Unlike line sensors, it is not necessary to perform scanning operations of the photoelectric conversion elements with area sensors, and therefore it is unnecessary to employ components such as a motor used during scanning.

Devices which have image sensors such as line sensors or area sensors are referred to as semiconductor devices in this specification. FIG. 5 shows a schematic diagram of the structure of a conventional semiconductor device. Reference numeral 1001 denotes a CCD (CMOS) image sensor, and an optical system 1002 such as a rod lens array is disposed on the image sensor 1001. The optical system 1002 is disposed so that an image of a subject 1004 is reflected on (irradiated to) the image sensor 1001. In FIG. 5, the image relationship of the optical system 1002 is taken as being non-magnifying. A light source 1003 is disposed in a position where light can be irradiated to the subject 1004. Components such as LEDs or fluorescent lamps are employed as the light source 1003 used for the semiconductor device shown in FIG. 5. A glass 1005 is then placed below the subject 1004. The subject 1004 is disposed above the glass 1005.

Light emitted form the light source 1003 is irradiated to the subject 1004 through the glass 1005. The light irradiated to the subject is reflected by the subject 1004, and then made incident upon the optical system 1002 through the glass 1005. The light made incident to the optical system 1002 then inputs to the image sensor 1001, and information of the subject 1004 undergoes photoelectric conversion in the image sensor 1001. Then, a signal showing information on the subject 1004 which was electrically inverted is read out to the outside. The image sensor 1001 reads out information of the subject 1004 line by line, a scanner 1006 is moved after one line portion is read by the image sensor 1001, and then similar operations are repeated.

Light from the light source 1003 is irradiated to the subject 1004 through a medium, the glass 1005, in the semiconductor device described above and shown in FIG. 5. Thus, there are cases in which the light is not uniformly irradiated with this structure, and this becomes a problem. Further, the light reflected by the subject 1004 is irradiated to the image sensor 1001 through another medium, the optical system 1002. Therefore, There is occurred a problem that irregularities are caused by the fact that the image becomes lighter in certain portions and darker in other portions when the information subject 1004, which is read in, is shown on the image.

In addition, it is difficult to control the size of the optical light system 1002 and the size of the light source 1003 with the aforementioned structure of the semiconductor device. Namely, it is difficult to make the size of the optical system 1002 and the size of the light source 1003 smaller than a certain fixed size. As a result, the semiconductor device itself is prevented from being made smaller and thinner.

SUMMARY OF THE INVENTION

With the above circumstances, an object of the present invention is therefore to provide a semiconductor device in which irregularities in brightness are not caused in a read-in image. In addition, an object of the present invention is to provide a semiconductor device that has been made smaller and thinner.

The present invention provides a semiconductor device in which a plurality of pixels are formed in matrix on the same substrate, each pixel has a photoelectric conversion element, a light emitting element, and a thin film transistor (TFT) for controlling the elements. A semiconductor device that has been made smaller and thinner can be provided by forming the light emitting elements and the photoelectric conversion elements on the same substrate.

The light emitting elements function as light sources, and light emitted from the light emitting elements is reflected by a subject, and then irradiated to the photoelectric conversion elements. An electric current occurs at this point when the light reflected by the subject is irradiated to the photoelectric conversion elements, and an electric signal with image information of the subject (image signal) is taken into the semiconductor device. Image information can thus be read by using the photoelectric conversion elements. The light emitted from the light emitting elements is uniformly irradiated to the subject with the above structure, and therefore irregularities of the read-in image in brightness do not develop in the semiconductor device of the present invention.

Further, a signal line driver circuit and an output switching circuit are used as driver circuits of the semiconductor device in the present invention. The signal line driver circuit outputs timing signals to the output switching circuit based on signals input from the outside. The output switching circuit outputs different timing signals to signal lines connected to the TFTs of the light emitting element portion, and to signal lines connected to the TFTs of the sensor portion. In other words, it becomes possible with employing the output switching circuit to control two signal lines by using one driver circuit. As a result, it becomes possible to make the area occupied by the driver circuits of the semiconductor device smaller, and a reduction in size of the semiconductor device can be realized.

Note that the present invention is effective in semiconductor devices with any kind of structure which has light emitting elements and photoelectric conversion elements. Furthermore, the present invention is also effective in semiconductor devices which has liquid crystal elements that use a front light or a back light as a light source, instead of light emitting elements.

Note that the term "connection" has a meaning of electrical connection throughout this specification.

BRIEF DESCRIPTION OF THE DRAWINGS

In the accompanying drawings:

FIGS. 4A and 4B are diagrams of signals input to TFTs formed in pixels;

FIG. 12 is a timing chart of light emitted from light emitting elements when an image is read in;

FIG. 15 is a timing chart of light emitted from light emitting elements when an image is read in;

DETAILED DESCRIPTION OF THE PREFERRED EMBODIMENTS

[Embodiment Mode 1]

Figure 6:
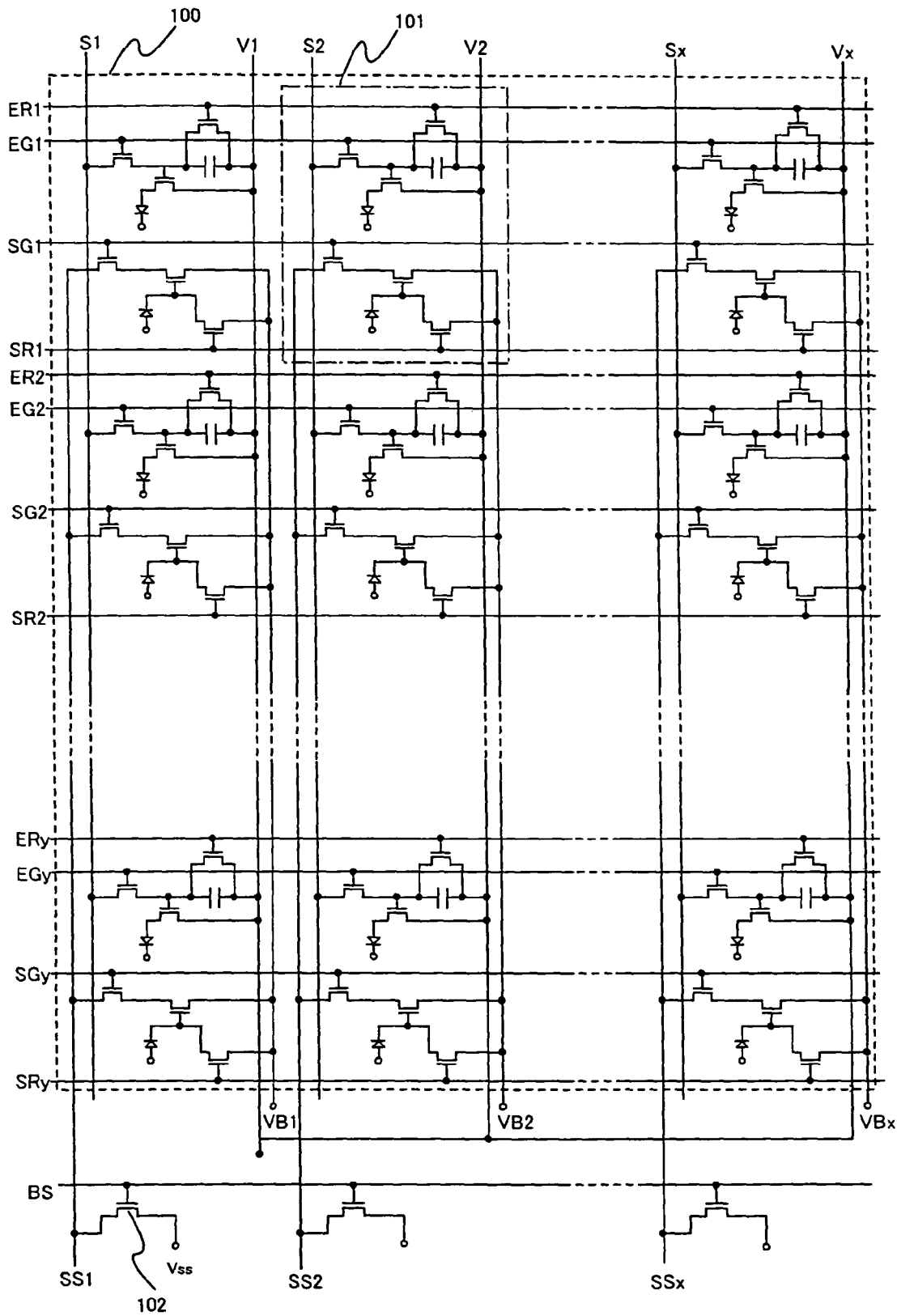
FIG. 6 is a circuit diagram of a pixel portion of the present invention.

A semiconductor device of the present invention is explained with reference to FIG. 6. A pixel portion of a semiconductor device, in which light emitting elements, photoelectric conversion elements, and a plurality of thin film transistors (TFTs) are arranged in a matrix shape and formed on the same substrate, is shown in FIG. 6. The pixel portion has a plurality of pixels. Photodiodes are used as photoelectric conversion elements in embodiment mode 1.

Self light emitting elements such as EL elements are referred to as light emitting elements in this specification. Light emitting elements have: a layer containing an organic compound from which electroluminescence, generated by applying an electric field, can be obtained (hereinafter referred to as an organic compound layer); an anode layer; and a cathode layer. There are light emission occurring during returning to a ground state from a singlet excitation state (fluorescence) and light emission occurring during returning to a ground state from a triplet excitation state (phosphorescence) as types of luminescence in organic compounds, and either type or both types of light emission can be used.

Note that all layers formed between an anode and a cathode are defined as an organic compound layer in this specification. Specifically, light emitting layers, hole injecting layers, electron injecting layers, hole transporting layers, electron transporting layers, and the like are included in the organic compound layer. Light emitting elements basically have a structure in which an anode, a light emitting layer, and a cathode are laminated in order. In addition to this structure, structures such as one in which an anode, a hole injecting layer, a light emitting layer, and a cathode are laminated in order, and one in which an anode, a hole injecting layer, a light emitting layer, an electron transporting layer, and a cathode are laminated in order may also be used. An element formed by an anode, an organic compound layer, and a cathode is referred to as a light emitting element throughout this specification.

Further, and one of the following can be freely used as the photoelectric conversion elements employed in this specification: PN type photodiodes, PIN type diodes, avalanche type diodes, npn embedded type diodes, Schottky type diodes, photo transistors, photo conductors, and the like.

A pixel portion 100 has source signal line S1 to Sx, electric power source supply lines V1 to Vx, selection signal lines EG1 to ECGy, reset signal lines ER1 to ERy, sensor selection lines SG1 to SGy, sensor reset signal lines SR1 to SRy, sensor signal output lines SS1 to SSx, and sensor electric power source lines VB1 to VBx.

The pixel portion 100 has a plurality of pixels. A pixel 101 has one of the source signal line S1 to Sx, one of the electric power source supply lines V1 to Vx, one of the selection signal lines EG1 to EGy, one of the reset signal lines ER1 to ERy, one of the sensor selection signal lines SG1 to SGy, one of the sensor reset signal lines SR1 to SRy, one of the sensor signal output lines SS1 to SSx, and one of the sensor electric power source lines VB1 to VBx.

One of a source region and a drain region of a bias TFT 102 is connected to one of the sensor signal output lines SS1 to SSx, and the other one is connected to a voltage Vss (used for the bias TFT). Further, a gate electrode of the bias TFT 102 is connected to a bias signal line BS. Note that the voltage Vss (used for the bias TFT) is connected if the bias TFT 102 is an n-channel TFT, and that a voltage Vdd (used for the bias TFT) is connected if the bias TFT 102 is a p-channel TFT.

Figure 7:
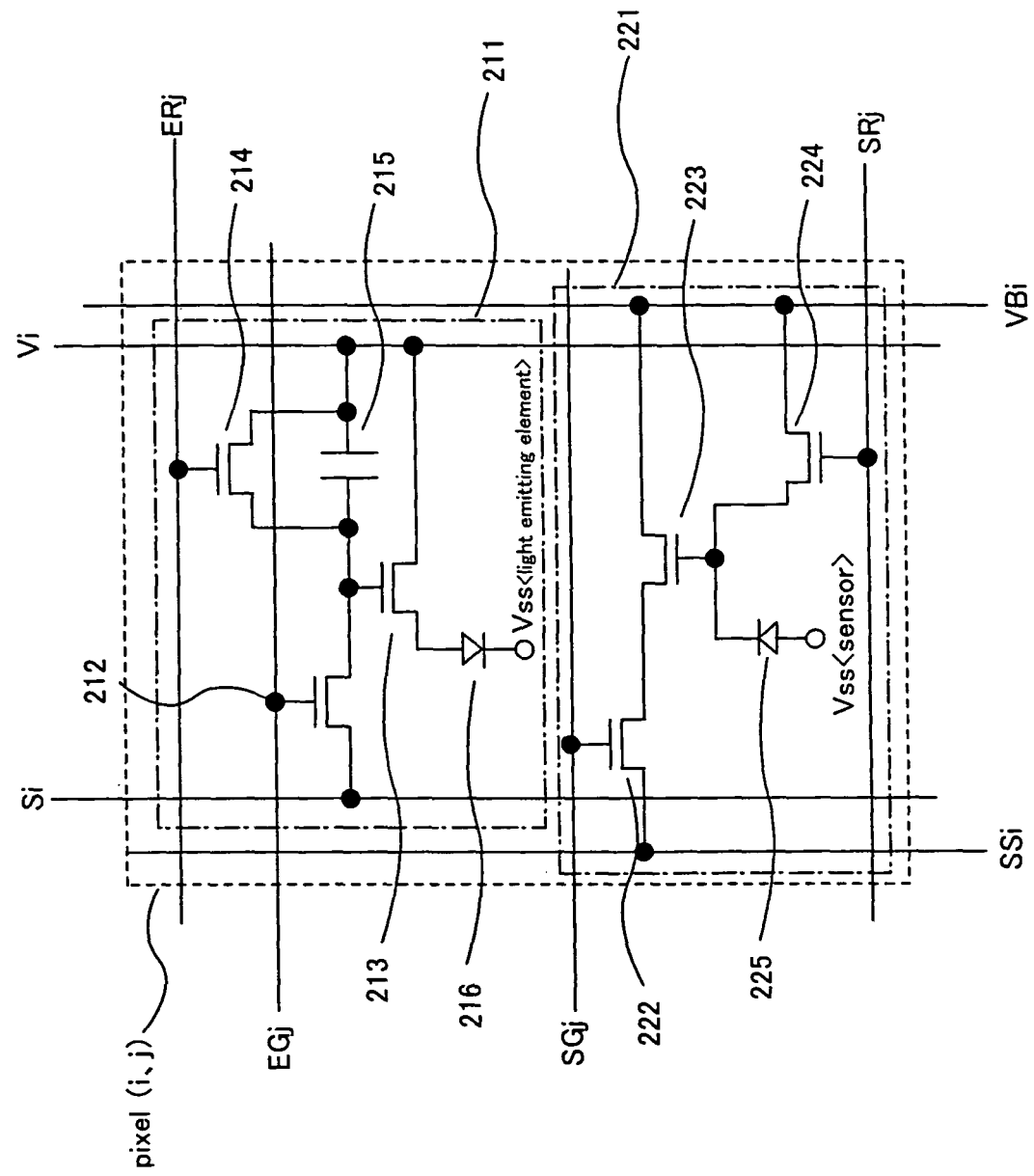
FIG. 7 is a circuit diagram of a pixel portion of the present invention.

Refer to FIG. 7. A detailed circuit structure of the pixel 101 is shown in FIG. 7. A region surrounded by the dotted line is a pixel of a number i column and a number j row of the pixel portion 100 shown in FIG. 6 and is referred to as a pixel (i,j) in this specification. A pixel (i,j) has a source signal line Si, an electric power source supply line Vi, a sensor signal output wiring SSi, sensor electric power source line VBi, a selection-signal line EGj, a reset signal line ERj, a sensor selection signal line SGj, and a sensor reset signal line SRj.

Note that a light emitting element, a photoelectric conversion element, and a plurality of transistors for controlling the elements are formed in the pixels of the semiconductor device of the present invention. In order to simplify the explanation, one pixel is separated into a light emitting element portion and a sensor portion in this specification. The light emitting element and the plurality of transistors for controlling the light emitting element are taken together as the light emitting element portion. Further, the photoelectric conversion element and the plurality of transistors for controlling the photoelectric conversion element are taken together as the sensor portion.

The pixel (i,j) has a light emitting element portion 211 and a sensor portion 221. The light emitting element portion 211 has a selection TFT 212, a driver TFT 213, a reset TFT 214, a capacitor 215, and a light emitting element 216. Although the capacitor 215 is formed in the pixel (i,j) in FIG. 7, the capacitor 215 need not be formed.

The light emitting element 216 is composed of an anode, a cathode, and an organic compound layer formed between the anode and the cathode. The anode becomes a pixel electrode if the anode is connected to a source region or a drain region of the driver TFT 213, and the cathode becomes an opposing electrode. Conversely, the cathode becomes the pixel electrode if the cathode is connected to the source region or the drain region of the driver TFT 213, while the anode becomes the opposing electrode.

A gate electrode of the selection TFT 212 is connected to the selection signal line EGj. One of a source region and a drain region of the selection TFT 212 is connected to the source signal line Si, and the other one is connected to a gate electrode of the driver TFT 213. The selection TFT 212 is a TFT which functions as a switching element in writing in a signal to the pixel (i,j).

One of the source region and the drain region of the driver TFT 213 is connected to the electric power source supply line Vi, and the other one is connected to the light emitting element 216. The capacitor 215 is connected to the gate electrode of the driver TFT 213 and to the electric power source supply line Vi. The driver TFT 213 is a TFT which functions as an element for controlling electric current supplied to the light emitting element 216 (electric current control element).

One of a source region and a drain region of the reset TFT 214 is connected to the electric power source supply line Vi, and the other one is connected to the gate electrode of the driver TFT 213. A gate electrode of the reset TFT 214 is connected to the reset signal line ERj. The reset TFT 214 is a TFT which functions as an element for erasing (resetting) the signal written into the pixel (i,j).

Further, the pixel (i,j) has a sensor selection TFT 222, a sensor driver TFT 223, and a sensor reset TFT 224 as the sensor portion 221. In addition, the pixel (i,j) has a photodiode 225 as a photoelectric conversion element in embodiment mode 1.

The photodiode 225 has an n-channel terminal, a p-channel terminal, and a photoelectric conversion layer formed between the n-channel terminal and the p-channel terminal. One of the p-channel terminal and the n-channel terminal is connected to a voltage Vss (used for the sensor), and the other one is connected to a gate electrode of the sensor driver TFT 223.

A gate electrode of the sensor selection TFT 222 is connected to the sensor selection signal line SGj. One of a source region and a drain region of the sensor selection TFT 222 is connected to a source region of the sensor driver TFT 223, and the other one is connected to the sensor signal output line SSi. The sensor selection TFT 222 is a TFT which functions as a switching element when the a signal of photodiode 225 is output.

A drain region of the sensor driver TFr 223 is connected to the sensor electric power source line VBi, and the source region of the sensor driver TFr 223 is connected to the source region or the drain region of the sensor selection TFT 222. The sensor driver TFT 223 forms a source follower circuit together with the bias TFT 102. It is therefore preferable that the polarity of the driver TFT 223 and the polarity of the bias TFT 102 be the same.

A gate electrode of the sensor reset TFT 224 is connected to the sensor reset signal line SRj. One of a source region and a drain region of the sensor reset TFT 224 is connected to the sensor electric power source line VBi, and the other one is connected to the photodiode 225 and to the gate electrode of the sensor driver TFT 223. The sensor reset TFT 224 is a TFT which functions as an element for initializing the photodiode 225.

Note that there are a case in which the light emitting element portion has the light emitting element, the selection TFT, the driver TFT, and the reset TFr (3 transistors/cell, Tr/cell), and a case in which the light emitting element portion has the light emitting element, the selection TFT, and the driver TFT (2 Tr/cell). Furthermore, there are no limitations on the number of TFTs contained within the light emitting element portion although a detailed explanation is omitted in this specification. As the light emitting element portion of the pixels of the semiconductor device according to the present invention, any of the following cases may also be applied; a case in which there are 4 TFTs within one pixel (4 Tr/cell), a case in which there are 5 TFTs within one pixel (5 Tr/cell), a case in which there are 6 TFTs-within one pixel (6 Tr/cell), and the like.

Figure 1:
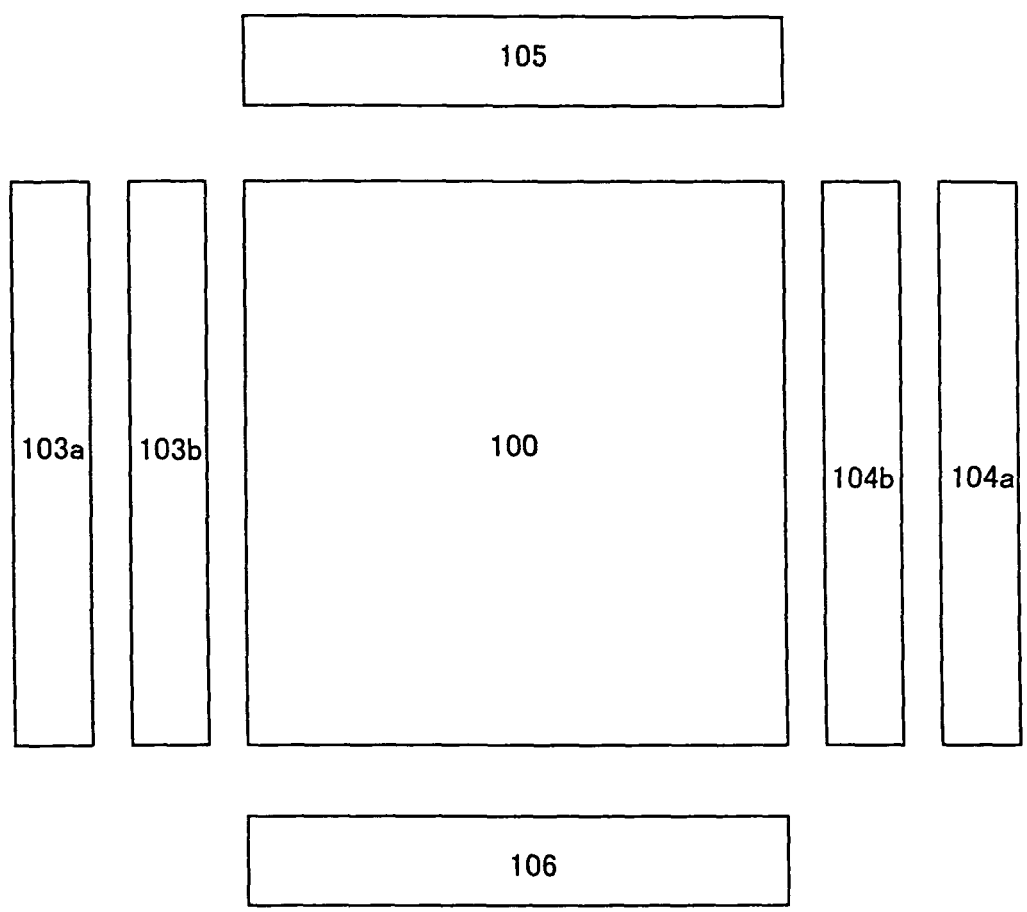
FIG. 1 is a schematic diagram of a semiconductor device of the present invention.

Subsequently, please refer to FIG. 1. A schematic diagram of a semiconductor device according to the present invention is shown in FIG. 1. A selection signal line driver circuit 103a and a selection output switching circuit 103b are formed in the periphery of the pixel portion 100, and a reset signal line driver circuit 104a and a reset output switching circuit 104b are formed. In addition, a source signal line driver circuit 105 and a sensor source signal line driver circuit 106 are formed.

Figure 2B:
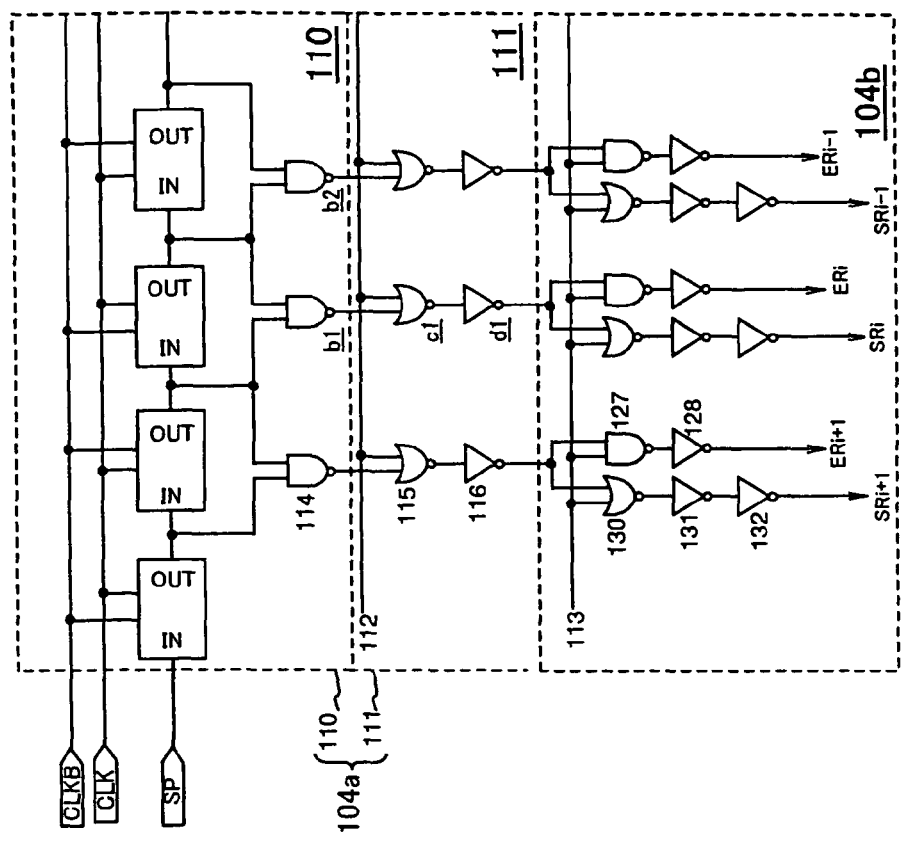
FIGS. 2A and 2B are circuit diagrams of a driver circuit in a semiconductor device of the present invention.
Figure 2A:
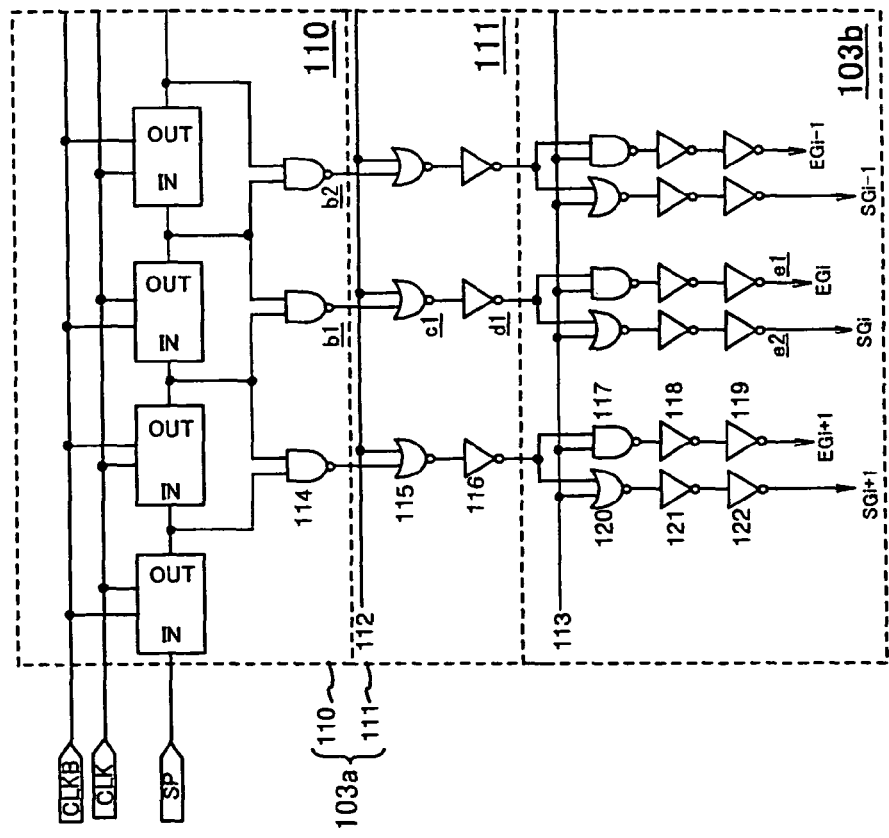
Figure 3:
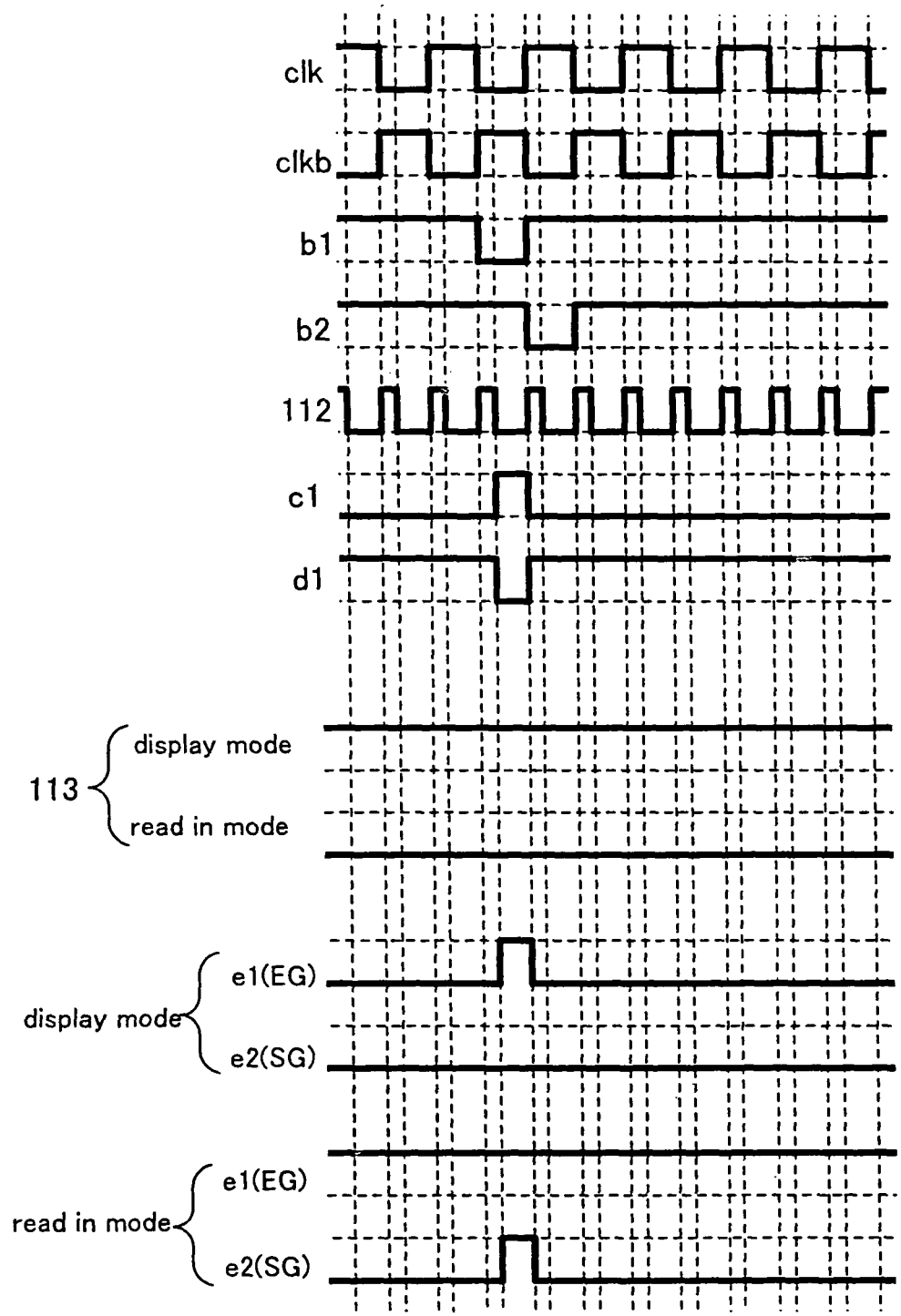
FIG. 3 is a timing chart diagram of a driver circuit of the present invention.
Figure 5:
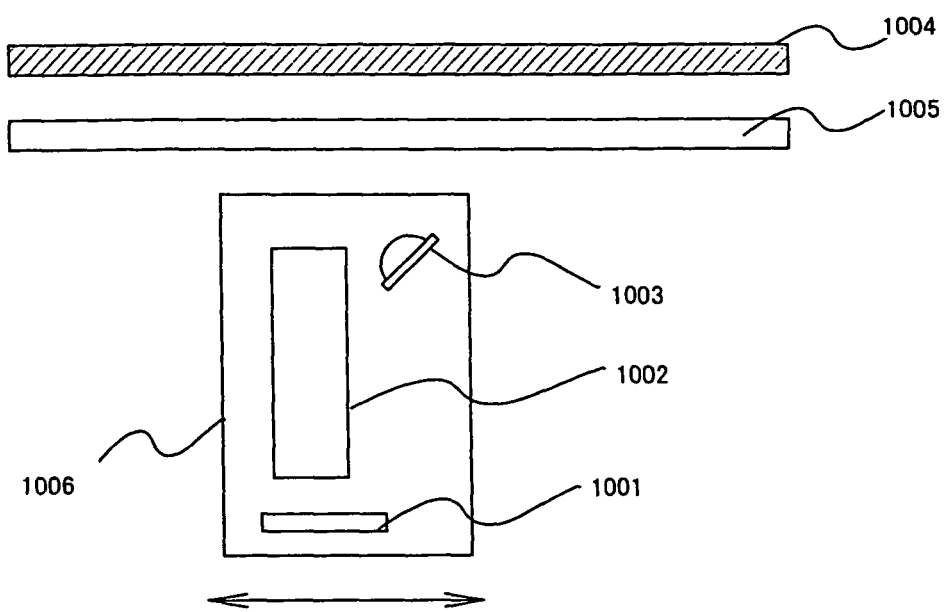
FIG. 5 is a schematic diagram of a conventional semiconductor device.

Refer to FIGS. 2A and 2B. FIG. 2A shows the selection signal line driver circuit 103a and the selection output switching circuit 103b. FIG. 2B shows the reset signal line driver circuit 104a and the reset output switching circuit 104b. Furthermore, although explained in embodiment mode 2, a timing chart of signals output from the selection signal line driver circuit 103a and from the selection output switching circuit 103b shown by FIG. 2A are shown in FIG. 3, and therefore may be referred to as needed.

FIG. 2A is used first to explain the selection signal line driver circuit 103a and the selection output switching circuit 103b. FIG. 2B is used next in explaining the reset signal line driver circuit 104a and the reset output switching circuit 104b.

Details on the selection signal line driver circuit 103a and the selection output switching circuit 103b is explained first using FIG. 2A. The selection signal line driver circuit 103a shown in FIG. 2A and the reset signal line driver circuit 104*a* shown in FIG. 2B have shift registers 110 and pulse width control circuits 111. The selection signal line driver circuit 103*a* and the reset signal line driver circuit 104*a* have the shift registers 110 and the pulse width control circuits 111. However, the pulse width control circuits 111 need not be formed when not necessary, and the selection signal line driver circuit 103*a* and the reset signal line driver circuit 104*a* may also have only the shift registers 110.

The shift registers 110 generate timing signals based on signals input from the outside. The term signals input from the outside indicates signals such as clock signals, clock bank signals, and start pulses. The timing signals are then input to the pulse width control circuits 111 adjacent to the shift registers 110 from a plurality of NAND circuits 114 provided in the shift registers 110.

A pulse width control wiring 112 outputs timing signals with smaller pulse widths compared to the pulse widths of the timing signals input from the shift registers.

The pulse width control circuits 111 have, for example, a plurality of NOR circuits 115 and a plurality of inverter circuits 116 in embodiment mode 1. As shown in FIGS. 2A and 2B, input terminals of two NOR circuits 115 are connected to output terminals of the pulse width control wiring 112 and the NAND circuit 114. Further, output terminals of the NOR circuits 115 are connected to input terminals of the inverter circuit 116. The NOR circuit 115 outputs a signal to the inverter circuit 116 by taking the non-disjunction of the timing signal input from the NAND circuit 114 and the signal input from the pulse width control wiring 112.

An output terminal of the inverter circuit 116 is connected to an input terminal of a NAND circuit 117 and to an input terminal of a NOR circuit 120. The inverter circuit 116 outputs signals to two wirings by taking the inversion of the signal input from the NOR circuit 115. The input terminal of the NAND circuit 117 is connected to one of two wirings, and the input terminal of the NOR circuit 120 is connected to the other one of the two wirings.

As shown in FIG. 2A, one inverter circuit, or a plurality of inverter circuits, is connected to an output terminal of the NAND circuit 117 and to an output terminal of the NOR circuit 120 in some cases.

Note that the inverter circuit need not be connected to the output terminal of the NAND circuit 117 and to the output terminal of the NOR circuit 120. In this case, a selection signal line EG is connected to the output terminal of the NAND circuit 117 and a sensor selection signal line SG is connected to the output terminal of the NOR circuit 120.

The number of the inverter circuits differs depending on the case of the NAND circuit 117 and the case of the NOR circuit 120 when the inverter circuits are connected. One inverter circuit, or a plurality of inverter circuits, is connected to the output terminal of the NAND circuit 117, and the selection signal line EG is connected in the end. One inverter circuit, or a plurality of inverter circuits, is connected to the output terminal of the NOR circuit 120, and the sensor selection signal line SG is connected in the end. Furthermore, the number of the inverter circuits differs in accordance with the polarity of the TFTs to which the selection signal line EG and the sensor selection signal line SG are connected.

The number of the inverter circuits connected to the output terminal of the NAND circuit 117, and the number of the inverter circuits connected to the output terminal of the NOR circuit 120 are explained below on their respective signal lines.

The case of the selection signal line EG is explained first. The selection signal line EG is connected to the end of the output terminal of the NAND circuit 117. If the selection TFT connected to the selection signal line EG is an n-channel TFT, then the number of inverter circuits connected to the output terminal of the NAND circuit 117 is an even number. Further, if the selection TFT is a p-channel TFT, then the number of inverter circuits connected to the output terminal of the NAND circuit 117 is an odd number.

A case of using an n-channel TFT as the selection TFT is shown in FIG. 2A as an example; in which two inverter circuits (even number) are connected. An input terminal of an inverter circuit 118 is connected to the output terminal of the NAND circuit 117. An input terminal of an inverter circuit 119 is then connected to an output terminal of the inverter circuit 118. The selection signal line EG is connected to an output terminal of the inverter circuit 119.

The case of the sensor selection signal line SG is explained next. The sensor selection signal line SG is connected to the end of an output terminal of an NOR circuit 120. The number of inverter circuits connected to the output terminal of the NOR circuit 120 is an even number when an n-channel TFT is used as the sensor selection TFT connected to the sensor selection signal line SG. Further, the number of inverter circuits connected to the output terminal of the NOR circuit 120 is an odd number when a p-channel TFT is used as the sensor selection TFT.

A case in which the sensor selection TFT is an n-channel TFT is shown in FIG. 2A as an example, in which two (an even number) inverter circuits are connected. An input terminal of an inverter circuit 121 is connected to an output terminal of the NOR circuit 120. An input terminal of an inverter circuit 122 is connected to an output terminal of the inverter circuit 121, and the sensor selection signal line SG is connected to an output terminal of the inverter circuit 122.

The reset signal line driver circuit 104*a* and the reset output switching circuit 104*b* are explained next using FIG. 2B. The reset signal line driver circuit 104*a* has the shift register 110 and the pulse width control circuit 111. The shift register 110 and the pulse width control circuit 111 are described above, and therefore the explanation is omitted here.

The number of the inverter circuits connected to an output terminal of a NAND circuit 127, and the number of the inverter circuits connected to the output terminal of a NOR circuit 130 are explained below by their respective signal lines.

The case of the reset signal line ER is explained first. The reset signal line ER is connected to the end of the output terminal of the NAND circuit 127. If the reset TFT connected to the reset signal line ER is an n-channel TFT, then the number of inverter circuits connected to an output terminal of the NAND circuit 127 is an odd number. Further, if the reset TFT is a p-channel TFT, then the number of inverter circuits connected to the output terminal of the NAND circuit 127 becomes an even number.

A case of using an n-channel TFT as the reset TFT is shown in FIG. 2B as an example; in which one inverter circuit (odd number) is connected. An input terminal of an inverter circuit 128 is connected to the output terminal of the NAND circuit 127. The reset signal line ER is connected to an output terminal of the inverter circuit 128.

The case of the sensor reset signal line SR is explained next. The sensor reset signal line SR is connected to the end of an output terminal of the NOR circuit 130. The number of inverter circuits connected to the output terminal of the NOR circuit 130 is an even number when an n-channel TFT is used as the sensor reset TFT connected to the sensor reset signal line SR. Further, the number of inverter circuits connected to the output terminal of the NOR circuit 130 becomes an odd number when a p-channel TFT is used as the sensor reset TFT.

A case in which the sensor reset TFT is an n-channel TFT is shown in FIG. 2B as an example; in which two (an even number) inverter circuits are connected. An input terminal of an inverter circuit 131 is connected to an output terminal of the NOR circuit 130. An input terminal of an inverter circuit 132 is connected to an output terminal of the inverter circuit 131, and the sensor reset signal line SR is connected to an output terminal of the inverter circuit 132.

Note that one circuit of one of the following pairs is referred to as a first logical circuit, and the other one is referred to as a second logical circuit in this specification: the NAND circuit 117 and the NOR circuit 120; and the NAND circuit 127 and the NOR circuit 130, all described above.

One of the first logical circuit and the second logical circuit is a NAND circuit, and the other one is a NOR circuit. Further, one may be a NAND circuit while the other is an OR circuit. In addition, one may be an AND circuit and the other may be a NOR circuit, or one may be an AND circuit and the other may be an OR circuit.

Signal lines connected to the first logical circuit and to the second logical circuit are assumed to be a first signal line and a second signal line, respectively, in this specification.

One of the first signal line and the second signal line is a selection signal line, and the other one is a sensor selection signal line. Further, one may be a selection signal line, and the other a sensor reset signal line. One may also be a reset signal line, while the other is a sensor selection signal line. Additionally, one may be a reset signal line, and the other may be a sensor reset signal line.

TFTs connected to the first signal line and to the second signal line are assumed to be a first TFT and a second TFT throughout this specification.

One of the first TFT and the second TFT is a selection TFT, and the other one is a sensor selection TFT. Further, one may be a selection TFT, and the other a sensor reset TFT. One may also be a reset TFT, while the other is a sensor selection TFT. Additionally, one may be a reset TFT, and the other may be a sensor reset TFT.

The semiconductor device of the present invention is characterized by comprising an image sensing function, and an image display function; the semiconductor device therefore has two modes (a read in mode and a display mode). An operator selects the read in mode in using the image sensing function, and selects the display mode in using the image display function.

The light emitting elements 216 for forming the pixel portion 100 uniformly emit light throughout the entire screen in the case of the read in mode, and therefore function as a light source. Light from the light source (the light emitted from the light emitting elements 216) is reflected by a subject. The photodiodes 225 receive the light reflected by the subject, and can read in information on the subject.

Further, an image is displayed by the plurality of light emitting elements 216 forming the pixel portion 100 in the case of the display mode. The photodiodes 225 of the sensor portion 221 do not function in the case of the display mode, and the semiconductor device of the present invention possesses a function which is similar to that of a normal display device.

Signals in accordance with the read in mode and the display mode described above are respectively input to a mode control wiring 113.

The input terminal of the NAND circuit 117 is connected to the mode control wiring 113 and to the output terminal of the inverter circuit 116 in FIG. 2A, and the output terminal of the NAND circuit 117 is connected to the input terminal of the inverter circuit 118. The NAND circuit 117 outputs signals to the input terminal of the inverter circuit 118 by taking the non-conjunction of input signals. The output terminal of the inverter circuit 118 is connected to the input terminal of the inverter circuit 119. The inverter circuit 118 outputs signals to the input terminal of the inverter circuit 119 by taking the inversion of the input signals. The output terminal of the inverter circuit 119 is connected to the selection signal line EG, and the inverter circuit 119 outputs signals to the selection signal line EG by taking the inversion of the input signals.

The input terminal of the NOR circuit 120 is connected to the mode control wiring 113 and to the output terminal of the inverter circuit 116 in FIG. 2A, and the output terminal of the NOR circuit 120 is connected to the input terminal of the inverter circuit 121. The NOR circuit 120 outputs signals to the input terminal of the inverter circuit 121 by taking the non-disjunction of input signals. The output terminal of the inverter circuit 121 is connected to the input terminal of the inverter circuit 122. The inverter circuit 121 outputs signals to the input terminal of the inverter circuit 122 by taking the inversion of the input signals. The output terminal of the inverter circuit 122 is connected to the sensor selection signal line SG, and the inverter circuit 122 outputs signals to the sensor selection signal line SG by taking the inversion of the input signals.

The input terminal of the NAND circuit 127 is connected to the mode control wiring 113 and to the output terminal of the inverter circuit 116 in FIG. 2B, and the output terminal of the NAND circuit 127 is connected to the input terminal of the inverter circuit 128. The NAND circuit 127 outputs signals to the input terminal of the inverter circuit 128 by taking the non-conjunction of input signals. The output terminal of the inverter circuit 128 is connected to the reset signal line ER. The inverter circuit 128 outputs signals to the reset signal line ER by taking the inversion of the input signals.

The input terminal of the NOR circuit 130 is connected to the mode control wiring 113 and to the output terminal of the inverter circuit 116 in FIG. 2B, and the output terminal of the NOR circuit 130 is connected to the input terminal of the inverter circuit 131. The NOR circuit 130 outputs signals to the input terminal of the inverter circuit 131 by taking the non-disjunction of input signals. The output terminal of the inverter circuit 131 is connected to the input terminal of the inverter circuit 132. The inverter circuit 131 outputs signals to the inverter circuit 132 by taking the inversion of the input signals. The output terminal of the inverter circuit 132 is connected to the sensor reset signal line SR, and the inverter circuit 132 outputs signals to the sensor reset signal line SR by taking the inversion of the input signals.

The selection output switching circuit 103*b* and the reset output switching circuit 104*b* are shown in FIGS. 2A and 2B as driver circuits of the semiconductor device of the present invention, but these are just examples. Although NAND circuits are used in FIGS. 2A and 2B, AND circuits may also be used as substitutes for the NAND circuits. Further, OR circuits may also be used as substitutes for the NOR circuits. In addition, a NAND circuit and a NOR circuit, or an AND circuit and an OR circuit, may also be substituted. In other words, it is possible for a designer to freely design the circuit structures of the signal line driver circuit and the output switching circuit.

Note that the signal line driver circuit denotes one of the selection signal line driver circuit and the reset signal line driver circuit in this specification. Further, the output switching circuit denotes one of the selection output switching circuit and the reset output switching circuit.

[Embodiment Mode 2]

Please refer to FIG. 3. A timing chart of signals in the driver circuits shown in embodiment mode 1 is shown in FIG. 3. A timing chart of signals output from the selection signal line driver circuit 103a and from the selection output switching circuit 103b is shown as one example in embodiment mode 2, and the operation of the selection signal line driver circuit 103a and the selection output switching circuit 103b is explained below.

Signals output from arbitrary adjacent NAND circuits 114 in FIG. 2A are assumed to be reference symbols b1 and b2. Timing signals with a smaller pulse width than the pulse width of the timing signals output from the NAND circuits 114 are output from the pulse width control wiring 112, as shown in FIG. 3. The output terminal of the NAND circuit 114 and the pulse width control wiring 112 are connected to the input terminal of the NOR circuit 115, and the input terminal of the inverter circuit 116 is connected to the output terminal of the NOR circuit 115. The NOR circuit 115 outputs a signal denoted by reference symbol c1 to the inverter circuit 116 by taking the non-disjunction of the timing signal input from the NAND circuit 114 and the signal input from the pulse width control wiring 112. The inverter circuit 116 inverts the signal input form the NOR circuit 115 and outputs a signal denoted by reference symbol d1.

Different signals are output from the mode control wiring 113 in accordance with the cases of the display mode and the read in mode, as shown in FIG. 3. It is assumed that a high signal is always input in the display mode, and a low signal is always input in the read in mode in embodiment mode 2.

The mode control wiring 113 and the output terminal of the inverter circuit 116 are connected to the input terminal of the NAND circuit 117, and the input terminal of the inverter circuit 118 is connected to the output terminal of the NAND circuit 117. The NAND circuit 117 outputs a signal to the inverter circuit 118 by taking the non-conjunction of the timing signal input from the inverter circuit 116 and the signal input from the mode control wiring 113. The input terminal of the inverter circuit 119 is connected to the output terminal of the inverter circuit 118. The inverter circuit 118 inverts the input signal and outputs the inverted signal to the inverter circuit 119. The selection signal line EG is connected to the output terminal of the inverter circuit 119. The inverter circuit 119 inverts the input signal, and outputs a signal denoted by reference symbol e1 to the selection signal line EG.

Also, the mode control wiring 113 and the output terminal of the inverter circuit 116 are connected to the input terminal of the NOR circuit 120, and the input terminal of the inverter circuit 121 is connected to the output terminal of the NOR circuit 120. The NOR circuit 120 outputs a signal to the inverter circuit 121 by taking the non-distinction of the timing signal input from the inverter circuit 116 and the signal input from the mode control wiring 113. The output terminal of the inverter circuit 120 is connected to the input terminal of the inverter circuit 121. The inverter circuit 121 inverts the input signal and outputs the inverted signal to the inverter circuit 122. The sensor selection signal line SG is connected to the output terminal of the inverter circuit 122. The inverter circuit 122 inverts the input signal, and outputs a signal denoted by reference symbol e2 to the sensor selection signal line EG.

The signals output to the selection signal line EG and to the sensor selection signal line SG are different, as shown in FIG. 3. Further, the signals output to the selection signal line EG and to the sensor selection signal line SG are differerent depending on the case of the display mode and the case of the read in mode.

Input terminals of two different circuits are connected to the output terminal of the inverter circuit 116. The term "input terminals of two different circuits" denotes the input terminal of the NAND circuit 117 and the input terminal of the NOR circuit 120.

The case of inputting a high signal to the mode control wiring 113 is explained, along with the case of inputting a low signal.

The case of inputting a high signal to the mode control wiring 113 is explained first. A high signal, which is a signal similar to the signal output from the output terminal of the inverter circuit 116, is output to the selection signal line EG connected to the NAND circuit 117. Further, a signal always maintaining a fixed voltage is output to the sensor selection signal line SG connected to the NOR circuit 120 regardless of the signal output from the output terminal of the inverter circuit 116.

The case of inputting a low signal to the mode control wiring 113 is explained next. A low signal, which is a signal similar to that of the inverter circuit 116, is output to the sensor selection signal line SG connected to the NOR circuit 120. Further, a signal always maintaining a fixed voltage is output to the selection signal line EG connected to the NAND circuit 117 regardless of the output of the inverter circuit 116.

Note that it is possible to freely combine embodiment mode 2 with embodiment mode 1.

[Embodiment Mode 3]

Please refer to FIGS. 4A and 4B. A signal generated from a source signal line driver circuit, signals input to TFTs respectively connected to the selection signal line EG and to the reset signal line ER, and a video signal imparted to the light emitting element portion 211 are. shown in FIG. 4A in the case of monochrome read in of a subject. The term "video signal" denotes a digital video signal or an analog video signal. Further, signals input to the TFTs respectively connected to a sensor signal output line SS, to the sensor selection signal line SG, and to the sensor reset signal line SR in the sensor portion 221 are shown in FIG. 4A. Note that FIGS. 6 and 7 may be referred to regarding the structure of a pixel portion in embodiment mode 3.

The selection TFT 212, the reset TFT 214, the sensor selection TFT 222, and the sensor reset TFT 224 are all n-channel TFTs in embodiment mode 3. Further., the driver TFT 213 is a p-channel TFT. Signals corresponding to the polarities of these TFTs are shown in FIG. 4A. Note that the polarities of the selection TFT 212, the reset TFT 214, the sensor selection TFT 222, the sensor reset TFT 224, and the driver TFT 213 can be freely designed. However, it is necessary to design a circuit which is capable of outputting signals corresponding to the polarity of the TFT in that case.

An on signal is a high signal and an off signal is a low signal when the TFT polarity is n-channel. Further, an on signal is a low signal and an off signal is a high signal if the TFT polarity is p-channel.

Signals input to the light emitting element portion and to the sensor portion during the display mode and during the read in mode are explained using FIG. 4A here. Note that a case of reading in a monochrome subject is shown in FIG. 4A, while a case of reading in a color subject is shown in FIG. 4B. Only the case in which the monochrome subject is read in is explained in embodiment mode 3 using FIG. 4A. Reading in a color subject is discussed in embodiment 2.

The display mode is explained first. An image is displayed with the plurality of light emitting elements 216 forming the pixel portion 100 in the display mode. The photodiodes 225 of the sensor portion 221 do not function in that case, and are always in an off state, and the semiconductor device has a function similar to that of a normal display device.

Note that the sensor portion 221 is not always in an off state and may always be in an on state instead. The sensor portion 221 may also be made not to function as always being in an on state. However, if the sensor portion 221 is kept in an on state, there is electric power consumption in circuits such as the source follower circuit. Considering the electric power consumption, it is therefore preferable that the sensor portion 221 always be in an off state. Furthermore, the electric power consumption can be controlled by placing the sensor portion 221 in an off state.

Electric current flows and there is electric power consumption in the driver circuit in switching from an on state to an off state, and inn switching from an off state to an on state. In order to control the electric power consumption, the voltage of each circuit element structuring the driver circuit is made not to change, and therefore an electric current is made not to flow. In other words, the electric power consumption can be controlled by always making the sensor portion 221 be in an off state.

Pulse signals are generated from the source signal line driver circuit. Further, the selection signal line EG and the reset signal line ER input pulse signals to the TFTs respectively connected thereto. A pulse signal is input as a video signal. Note that the term pulse signal indicates a signal in which the voltage changes temporally.

The sensor portion 221 does not function in the display mode, as stated above. The sensor source signal line SS does not output a signal to the TFT connected thereto, and a fixed voltage is maintained. Further, off signals (low signals in embodiment mode 3) are always input to the TFTs respectively connected to the sensor selection signal line SG and to the sensor reset signal line SR. The signals input to the sensor selection signal line SG and to the sensor reset signal line SR are not pulse signals, but rather are signals in which a fixed voltage is always maintained. Thus, the sensor selection signal line SG and the sensor reset signal line SR therefore always maintain a fixed voltage in the display mode. As a result, electric current does not flow in the sensor portion 221 and thus it does not function.

The read in mode is explained next. A case of reading in a monochrome subject is explained using FIG. 4A in embodiment mode 3. The light emitting elements 216 forming the pixel portion 100 uniformly emit light through the entire screen, and function as a light source during the read in mode. Light from the light source (light emitted from the light emitting elements 216) is reflected by the subject, and the photodiodes 225 receive the reflected light. As a result, information regarding the subject can be read in.

It is necessary that the light emitting elements 216 emit light uniformly in the light emitting element portion 211. An on signal (a high signal in embodiment mode 3) is generated from the source signal line driver circuit. Further, an off signal (a low signal in embodiment mode 3) is input to the TFTs connected to the reset signal line ER. A signal which is capable of placing the driver TFTs in an on state is input to the driver TFTs as a video signal. Namely, an on signal (a low signal in embodiment mode 3) is input as the video signal. Furthermore, pulse signals are input to the TFTs respectively connected to the sensor signal output signal line SS, to the sensor selection signal line SG. and to the sensor reset signal line SR in the sensor portion 221.

The signals input to the TFTs thus differ in the read in mode and in the display mode in accordance with the signal lines.

Note that although only a case of performing monochrome read in of a subject is described in embodiment mode 3, the case of a color read in is explained in embodiment 2.

Note that it is possible to freely combine embodiment mode 3 with embodiment mode 1 and embodiment mode 2.

Embodiments

[Embodiment 1]

As shown in FIG. 7, the case of 3 Tr/cell in a light emitting element portion is explained in the embodiment modes. In embodiment 1, however, the case of a light emitting element portion with 2 Tr/cell is explained with reference to FIG. 8.

Figure 8:
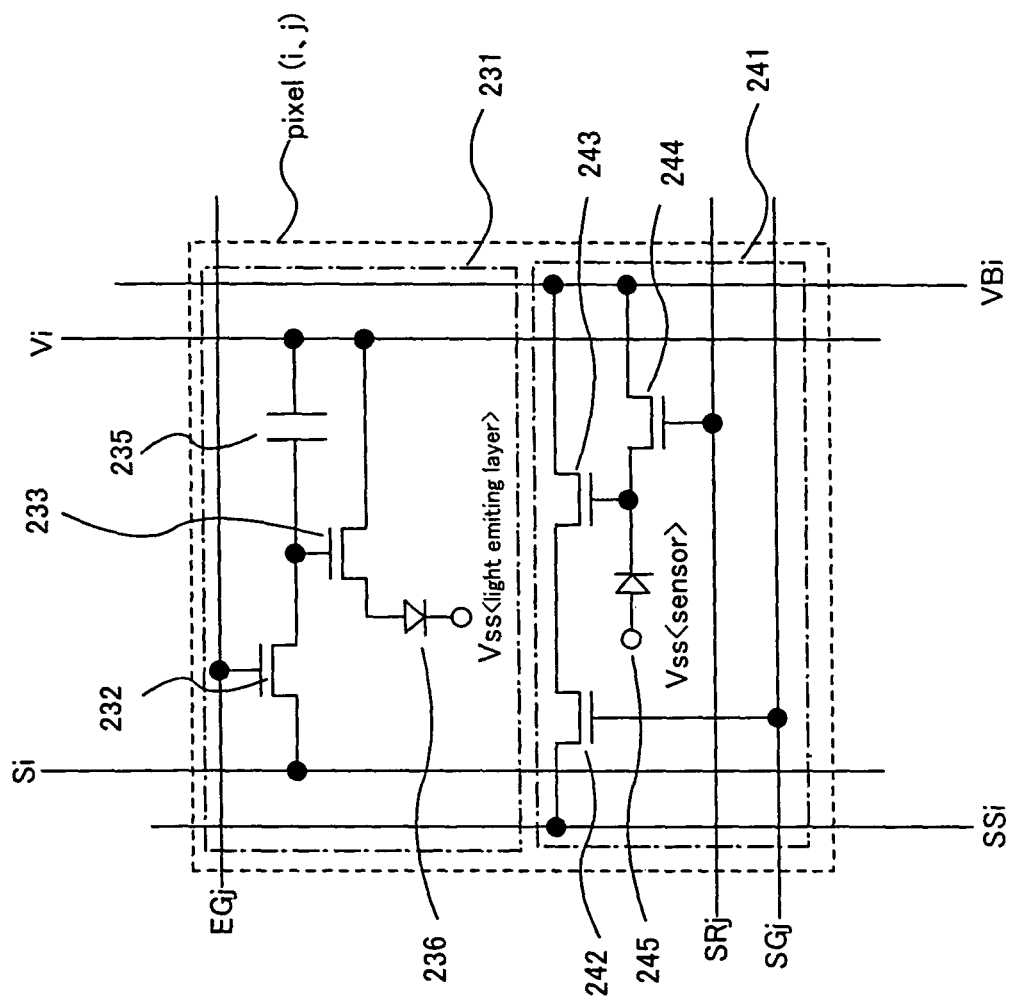
FIG. 8 is a circuit diagram of a pixel portion of the present invention.

FIG. 8 shows a detailed circuit structure of one pixel in the case of 2 Tr/cell in a light emitting element portion. A detailed circuit structure is shown for a pixel (i.,j) provided in a number i column and a number j row in a pixel portion. The pixel (i,j) has the source signal line Si, the electric power source supply line Vi, the sensor signal output line SSi, sensor electric power source line VBi, the selection signal line EGj, the sensor selection signal line SGj, and the sensor reset signal line SRj.

The pixel (i,j) has a light emitting portion 231 and a sensor portion 241. The light emitting element portion 231 has a selection TFT 232, a driver TFT 233, a capacitor 235, and a light emitting element 236. Although the capacitor 235 is formed in the pixel (i,j) in FIG. 8, the capacitor 235 need not be formed. The sensor portion 241 has a sensor selection TFT 242, a sensor driver TFT 243, a sensor reset TFT 244, and a photodiode 245.

The light emitting element 236 is composed of an anode, a cathode, and an organic compound layer formed between the anode and the cathode. The anode becomes a pixel electrode and the cathode becomes an opposing electrode if the anode is connected to a source region or a drain region of the driver TFT 233. Conversely, the cathode becomes the pixel electrode and the anode becomes the opposing electrode if the cathode is connected to the source region or the drain region of the driver TFT 233.

A gate electrode of the selection TFT 232 is connected to the selection signal line EGj. One of a source region and a drain region of the selection TFT 232 is connected to the source signal line Si, and the other one is connected to a gate electrode of the driver TFT 233. The selection TFT 232 is a TFT which functions as a switching element during write in of a signal to the pixel (i,j).

One of the source region and the drain region of the driver TFT 233 is connected to the electric power source supply line Vi, and the other one is connected to the light emitting element 236. The capacitor 235 is connected to the gate electrode of the driver TFT 233 and to the electric power source supply line Vi. The driver TFT 233 is a TFT which functions as an element for controlling electric current supplied to the light emitting element 236 (electric current control element).

The photodiode 245 has an n-channel terminal, a p-channel terminal, and a photoelectric conversion layer provided between the n-channel terminal and the p-channel terminal. One of the p-channel terminal and the n-channel terminal is connected to the voltage Vss (used for the sensor), and the other one is connected to a gate electrode of the sensor driver TFT 243.

A gate electrode of the sensor selection TFT 242 is connected to the sensor selection signal line SGj. One of a source region and a drain region of the sensor selection TFT 242 is connected to a source region of the sensor driver TFT 243, and the other one is connected to the sensor signal output line SSi. The sensor selection TFT 242 is a TFT which functions as a switching element when the signals from the photodiode 245 are output.

A drain region of the sensor driver TFT 243 is connected to the sensor electric power source line VBi, and the source region of the sensor driver TFT 243 is connected to the source region or the drain region of the sensor selection TFT 242. The sensor driver TFT 243 forms a source follower circuit together with a bias TFT (not shown in the figure). It is therefore preferable that the polarity of the driver TFT 243 and the polarity of the bias TFT be the same.

A gate electrode of the sensor reset TFT 244 is connected to the sensor reset signal line SRj. One of a source region and a drain region of the sensor reset TFT 244 is connected to the sensor electric power source line VBi, and the other one is connected to the photodiode 245 and to the gate electrode of the sensor driver TFT 243. The sensor reset TFT 244 is a TFT which functions as an element for initializing the photodiode 245.

A plurality of the pixels shown in FIG. 8 are formed on the same substrate in a matrix shape in the pixel portion. Driver circuits are formed in the periphery of the pixel portion, and a source signal line driver circuit and a sensor source signal line driver circuit are formed as driver circuits for controlling the source signal lines S and the sensor signal output lines SS.

Further, a signal line driver circuit is formed for controlling the selection signal lines EG and the sensor selection signal liens SG. An output switching circuit is connected to the signal line driver circuit. Further, the signal line driver circuit is not limited to controlling the selection signal liens EG and the sensor selection signal lines SG, but also may be formed for controlling the selection signal lines EG and the sensor reset signal lines SR. In this case, an output switching circuit is connected to the signal line driver circuit.

Note that it is possible to apply the invention disclosed in Japanese Patent Application No. 2000-067793 by the applicant of the present invention to the semiconductor device in embodiment 1 with 2 Tr/cell in the light emitting element portion.

Further, it is possible to freely combine embodiment 1 with embodiment modes 1 to 3.

[Embodiment 2]

Figure 9:
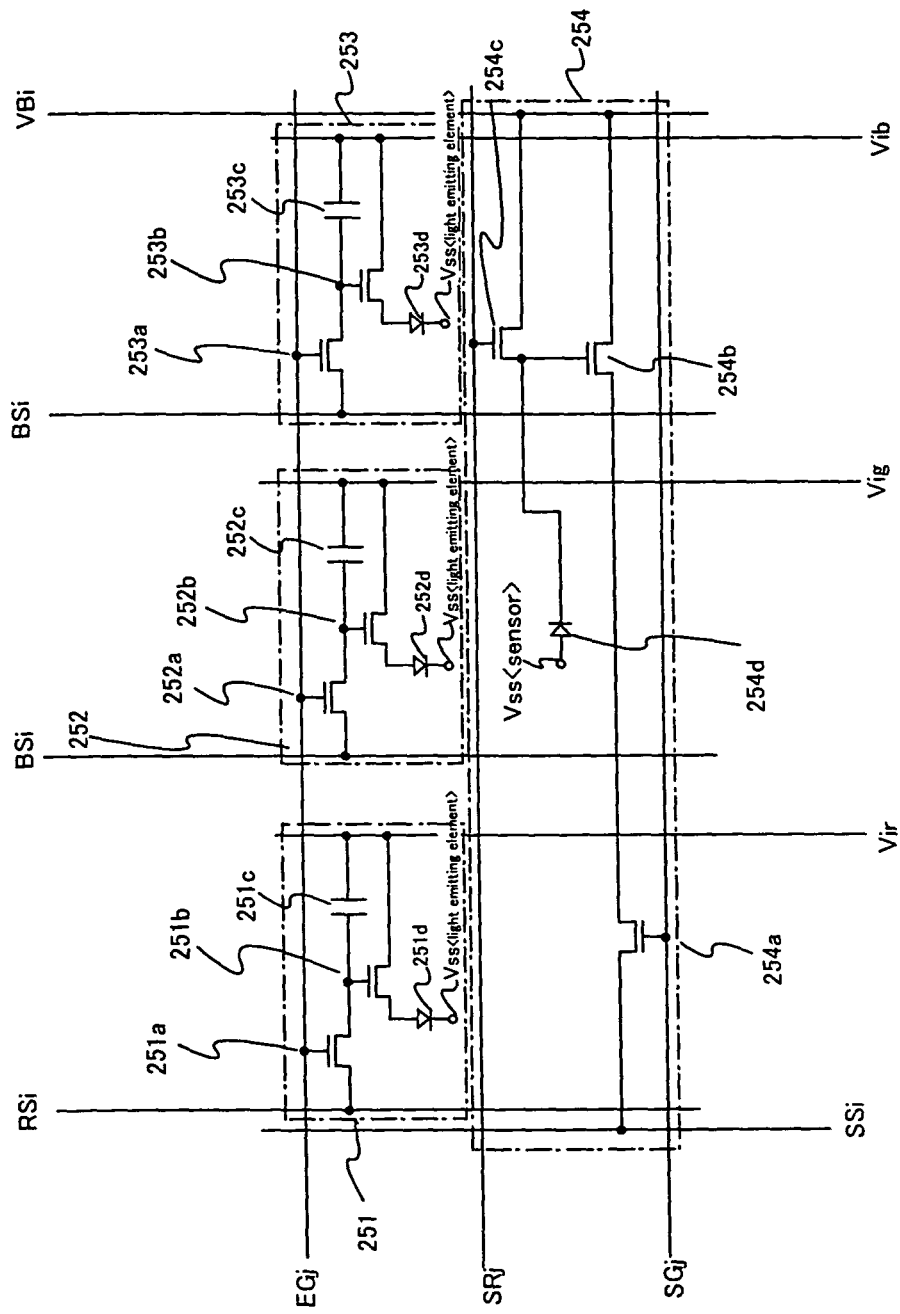
FIG. 9 is a circuit diagram of a pixel portion of the present invention.

The case in which a light emitting portion has 2 Tr/cell is explained in embodiment 1, and an example of forming three light emitting element portions each with 2 tr/cell and one sensor portion in one pixel, is explained in embodiment 2 using FIG. 9. Note that pixels may also be formed by using three light emitting element portions each with 3 Tr/cell and one sensor portion, or even in the case where other circuit structure is used. Further, a pixel portion can be formed by the pixels.

Please refer to FIG. 9. Three light emitting element portions are formed for the three primary colors of light, red (R), green (G), and blue (B). A light emitting element portion 251 is used for red (R), and has a selection TFT 251a, a driver TFT 251b. a capacitor 251c, and a light emitting element 251d.

A light emitting element portion 252 is used for green (G), and has a selection TFT 252a, a driver TFT 252b, a capacitor 252c, and a light emitting element 252d.

A light emitting element portion 253 is used for blue (B), and has a selection TFT 253a, a driver TFT 253b, a capacitor 253c, and a light emitting element 253d.

Each of he light emitting element 251d, 252d, and 253d is composed of an anode, a cathode, and a light emitting layer formed between the anode and the cathode. The anode becomes a pixel electrode and the cathode becomes an opposing electrode if the anode is connected to a respective source regions or drain regions of the driver TFT 251d, 252b, and 253b. Conversely, the cathode becomes the pixel electrode and the anode becomes the opposing electrode if the cathode is connected to the respective source regions or drain regions of the driver TFT 251b, 252b, and 253b.

A sensor portion 254 has a sensor selection TFT 254a, a sensor driver TFT 254b, a sensor reset TFT 254c, and a photodiode 254d.

The photodiode 254d has an n-channel terminal, a p-channel terminal, and a photoelectric conversion layer formed between the n-channel terminal and the p-channel terminal. One of the n-channel terminal and the p-channel terminal is connected to the voltage Vss (used for the sensor), and the other one is connected to a gate electrode of the sensor driver TFT 254b.

A gate electrode of the sensor selection TFT 254a is connected to the sensor selection signal line SGj. One of a source region and a drain region of the sensor selection TFT 254a is connected to a source region of the sensor driver TFT 254b, and the other one is connected to the sensor signal output line SSi. The sensor selection TFT 254a is a TFT which functions as a switching element when signals from the photodiode 254d are output.

One of the drain region and the source region of the sensor driver TFT 254b is connected to the sensor electric power source line VBi, and the other one is connected to the source region or the drain region of the sensor selection TFT 254a. The sensor driver TFT 254b forms a source follower circuit together with a bias TFT (not shown in the figure). It is therefore preferable that the polarity of the sensor driver TFT 254b and the polarity of the bias TFT be the same.

A gate electrode of the sensor reset TFT 254c is connected to the sensor reset signal line SRj. One of a source region and a drain region of the sensor reset TFT 254c is connected to the sensor electric power source line VBi, and the other one is connected to the photodiode 254d and to the gate electrode of the sensor driver TFT 254d. The sensor reset TFT 254c is a TFT which functions as an element for initializing the photodiode 254d.

The pixel portion has a plurality of the pixels shown in FIG. 9 formed in a matrix shape on the same substrate. Driver circuits are formed in the periphery of the pixel portion. For example, a source signal line driver circuit for controlling a red color source signal line RS, a green color source signal line GS; and a blue color source signal line BS, and a sensor source signal line driver circuit for controlling the sensor signal output line SS may be formed.

Further, a signal line driver circuit is formed for controlling the selection signal lines EG and the sensor selection signal lines SG. An output switching circuit is connected to the signal line driver circuit. Further, the signal line driver circuit is not limited to controlling the selection signal lines EG and the sensor selection signal lines SG, but also may be formed for controlling the selection signal lines EG and the sensor reset signal lines SR. In this case, an output switching circuit is connected to the signal line driver circuit.

Note that it is possible to apply the invention disclosed in Japanese Patent Application No. 2000-067793 by the applicant of the present invention to the semiconductor device in embodiment 2 with 2 Tr/cell in the light emitting element portion.

Please refer to FIG. 4B. Signals input to the light emitting element portion and to the sensor portion in each of the display mode and the read in mode, are explained using FIG. 4B.

Signals generated from the source signal line driver circuit, signals output to the TFTs respectively connected to the selection signal line EG and to the reset signal line ER, and video signals imparted to the light emitting portions 251 to 253 are shown in FIG. 4B. Further, signals output to the TFTs respectively connected to the sensor signal output line SS, to the sensor selection signal line SG, and to the sensor reset signal line SR in the sensor portion 254 are shown. Note that FIG. 9 may be referred to regarding the structure of the pixels in embodiment 2.

It is assumed that the polarity of the driver TFTs contained in the light emitting element portions 251 to 253 is p-channel in embodiment 2, and the polarities of all other TFTs each are n-channel. It is possible to freely design the polarities of the respective TFTs, but it then becomes necessary to output signals corresponding to those polarities.

In other words, an on signal is a high signal and an off signal is a low signal when the TFT polarity is n-channel, and further, an on signal is a low signal and an off signal is a high signal when the polarity of the TFT to which the signal is input is p-channel. It is necessary to design so that the appropriate signals are input.

The light emitting element 251*d*, the light emitting element 252*d*. and the light emitting element 253*d* display an image in the display mode. The photodiode 254*d* of the sensor portion does not function in this case. Pulse signals are generated from the source signal line driver circuit in this case. Further, the pulse signals are output to the TFTs respectively connected to the selection signal line EG and to the reset signal line ER. A pulse signal is output as the video signal.

The sensor portion 254 does not function in the display mode. The sensor source signal line SS does not output a signal to the TFT connected thereto, and a fixed voltage is maintained. Further, off signals (low signals in embodiment 2) are always input to the TFTs respectively connected to the sensor selection signal line SG and to the sensor reset signal line SR. Note that the signals output from the sensor selection signal line SG and from the sensor reset signal line SR are not pulse signals, but rather are signals in which a fixed voltage is always maintained. The sensor selection signal line SG and the sensor reset signal line SR therefore always maintain a fixed voltage in the display mode. As a result, electric current does not flow in the sensor portion 254 and thus it does not function.

Note that it is possible to read in a color subject not only as a color image but also as a monochrome with the pixel structure shown in FIG. 9. The case of performing read in as a monochrome image is explained first in embodiment 2, and then read in as a color image is explained.

The read in mode in the case of reading a subject as a monochrome image is explained. The light emitting element 251*d*, the light emitting element 252*d*, and the light emitting element 253*d* emit light uniformly over the entire screen in the read in mode, and function as a light source. Light from the light source is reflected by the subject. The sensor portion 254 receives the light reflected by the subject, and information regarding the subject is read in. It is necessary that the light emitting element 251*d*, the light emitting element 252*d*, and the light emitting element 253*d* emit light uniformly in order to read in the subject information.

In this case, an on signal (a high signal in embodiment 2) is generated from the source signal line driver circuit. Further, an off signal (a low signal in embodiment 2) is input to the TFTs connected to the reset signal line ER. A signal which is capable of placing the driver TFFs 251*b*, 252*b*, and 253*b* in an on state is input to the driver TFTs 251*b*, 252*b*, and 253*b* as a video signal. Namely, an on signal (a low signal in embodiment 2) is input as the video signal.

The read in mode in the case of reading in the subject as a color image is explained next. The three light emitting element portions for the three primary colors of light, red (R), green (G), and blue(B) are formed in the case of reading in the subject as a color image. Images are read in three times, once each for red (R), green (G), and blue (B), and then one image is formed by superimposing the three images.

The pulse signals are thus output to the TFTs respectively connected to the sensor signal output signal line SS, to the sensor selection signal line SG, and to the sensor reset signal line SR in the sensor portion 254.

As to the case of performing read in of a subject as a color image, the cases of reading in an R image, a G image, and a B image are explained separately below.

The case of reading in an R image is explained first. An on signal is generated from the source signal line driver circuit. An on signal is input to a TFT connected to the selection signal line EG and an off signal is input to a TFT connected to the reset signal line ER. An on signal is then input to the R light emitting element portion 251 as a video signal, and an off signal is input to the G light emitting element portion 252 and an off signal is input to the B light emitting element portion 253.

The case of reading in a G image is explained next. An on signal is generated from the source signal line driver circuit. An on signal is input to a TFT connected to the selection signal line EG and an off signal is input to a TFT connected to the reset signal line ER. As a video signal, an on signal is then input to the G light emitting element portion 252, an off signal is input to the R light emitting element portion 251 and an off signal is input to the B light emitting element portion 253.

The case of reading in a B image is explained last. An on signal is generated form the source signal line driver circuit. An on signal is input to a TFT connected to the selection signal line EG and an off signal is input to a TFT connected to the reset signal line ER. As a video signal, the on. signal is then input to the B light emitting element portion 253, and an off signal is input to the R light emitting element portion 251 and an off signal is input to the G light emitting element portion 252.

The subject image is thus read in three times with dividing into the three colors R, G, and B, and the subject can be read in as a color image by later combining the three images.

The signals input to the TFTs thus differ in the read in mode and in the display mode in accordance with the signal lines.

Note that the case of forming three light emitting element portions and one sensor portion in one pixel, and then reading in a subject as a color image by pixel is explained in embodiment 2. However, it is possible to read in the subject as a monochrome image instead of reading in the subject as a color image when three light emitting element portions and one sensor portion are formed in one pixel. In other words, all of the three light emitting element portions in one pixel may be made to emit light in reading in as a monochrome image. Further, an arbitrary two of the light emitting element portions out of the three light emitting element portions in one pixel may be made to emit light, and an arbitrary one light emitting element portion out of the three light emitting element portions in one pixel may also be made to emit light. However, there is a case where red color portions of a subject are not read in when emitting light only from the red color (R) light emitting element portion.

Furthermore, it is possible to freely combine embodiment 2 with embodiment modes 1 to 3, and with embodiment 1.

[Embodiment 3]

Examples of using light emitting elements as a light source are shown in embodiment modes 1 to 3, and in embodiments 1 and 2, but a front light or a back light can also be used in a semiconductor device of the present invention. However, in this case, subject information obtained from an image sensor function is displayed by a liquid crystal element portion provided in a pixel portion of a semiconductor device.

Figure 10:
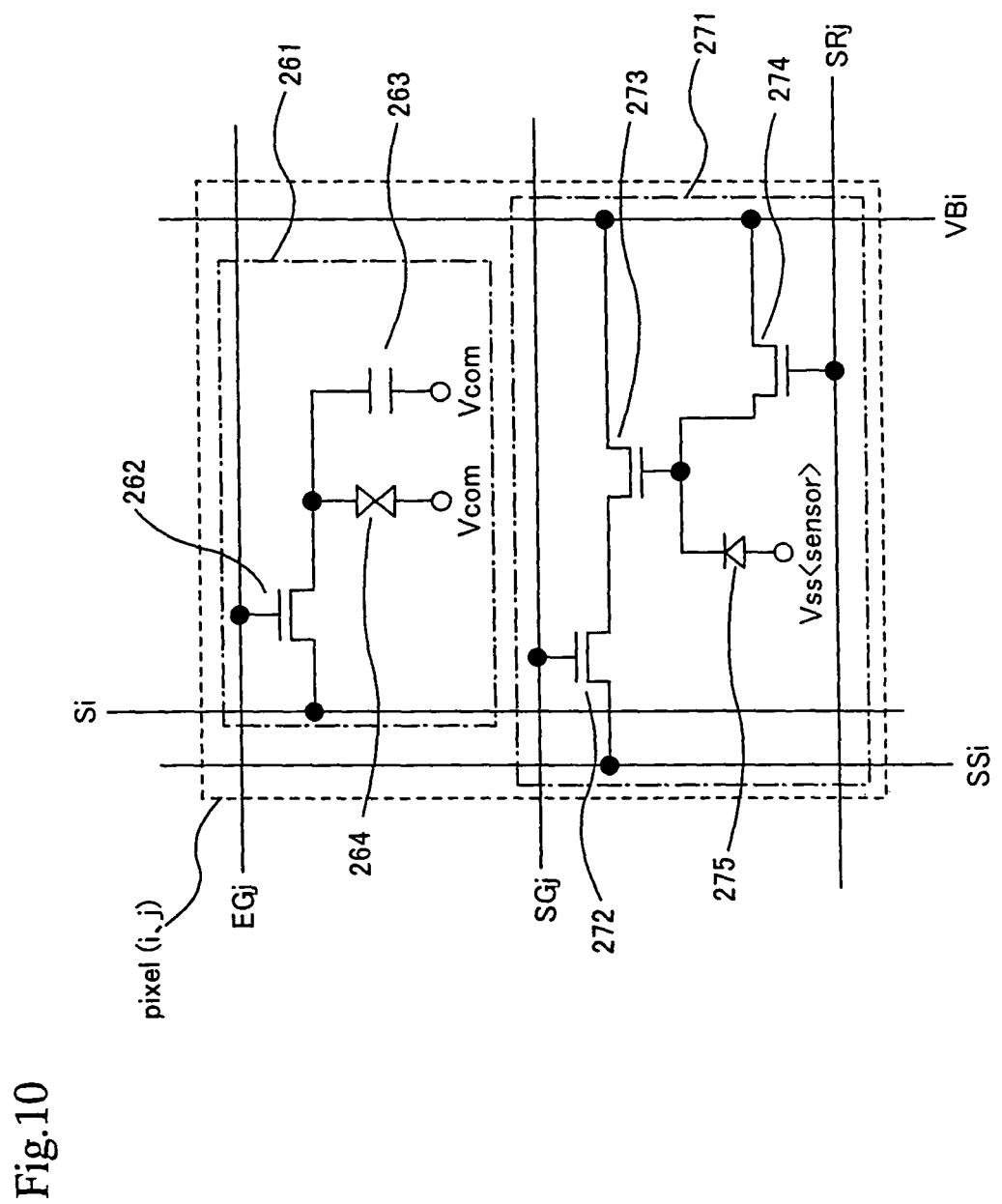
FIG. 10 is a circuit diagram of a pixel portion of the present invention.

Please refer to FIG. 10. One pixel has a liquid crystal element portion 261 and a sensor portion 271 in a semiconductor device of embodiment 3. The liquid crystal element portion 261 has a liquid crystal selection TFT 262, a capacitor 263, and a liquid crystal element 264. Further, the sensor portion 271 has a sensor selection TFT 272, a sensor driver TFT 273, a sensor reset TFT 274, and a photodiode 275.

A gate electrode of the liquid crystal selection TFT 262 is connected to the liquid crystal selection signal line EGj. One of a source region and a drain region of the selection TFT 262 is connected to the source signal line Si. and the other one is connected to the liquid crystal element 264 and to the capacitor 263. The liquid crystal selection TFT 262 is a TFT which functions as a switching element in writing a signal into the pixel (i,j).

A gate electrode of the sensor selection TFT 272 is connected to the sensor selection signal line SGj. One of a source region and a drain region of the sensor selection TFr 272 is connected to a source region of the sensor driver TFT 273, and the other one is connected to the sensor signal output line SSi. The sensor selection TFT 272 is a TFT which functions as a switching element when a signal of the photodiode 275 is output.

The drain region of the sensor driver TFT 273 is connected to the sensor electric power source line VBi, and the source region of the sensor driver TFT 273 is connected to the source region or the drain region of the sensor selection TFT 272. The sensor driver TFT 273 forms a source follower circuit together with a bias TFT (not shown in the figure). It is therefore preferable that the polarity of the sensor driver TFT 273 and the polarity of the bias TFT be the same.

A gate electrode of the sensor reset TFT 274 is connected to the sensor reset signal line SRj. One of a source region and a drain region of the sensor reset TFT 274 is connected to the sensor electric power source line VBi, and the other one is connected to the photodiode 275 and to the gate electrode of the sensor driver TFT 273. The sensor reset TFT 274 is a TFT which functions as an element for initializing the photodiode 275.

The pixel portion has a plurality of the pixels shown in FIG. 10 formed in a matrix shape on the same substrate. Driver circuits are formed in the periphery of the pixel portion. A liquid crystal source signal line driver circuit for controlling the source signal lines S, and a sensor source signal line driver circuit for controlling the sensor signal output lines SS are formed.

Further, a signal line driver circuit for controlling the liquid crystal selection signal lines EG and the sensor selection signal lines SG is formed. An output switching circuit is connected to the signal line driver circuit. The signal line driver circuit is not limited to controlling the liquid crystal selection signal lines EG and the sensor selection signal lines SG, and may also be formed in order to control the selection signal lines EG and the sensor reset signal lines SR. An output switching circuit is connected to the signal line driver circuit in this case as well.

Note that it is possible to freely combine embodiment 3 with embodiment modes 1 to 3, and with embodiments 1 and 2.

[Embodiment 4]

A method of driving the selection TFT 212 and the driver TFT 213 for controlling the operation of the light emitting elements 216 is explained in embodiment 4. Please refer to FIGS. 6 and 7 regarding the structure of the pixel portion 100 in embodiment 4.

Figure 11:
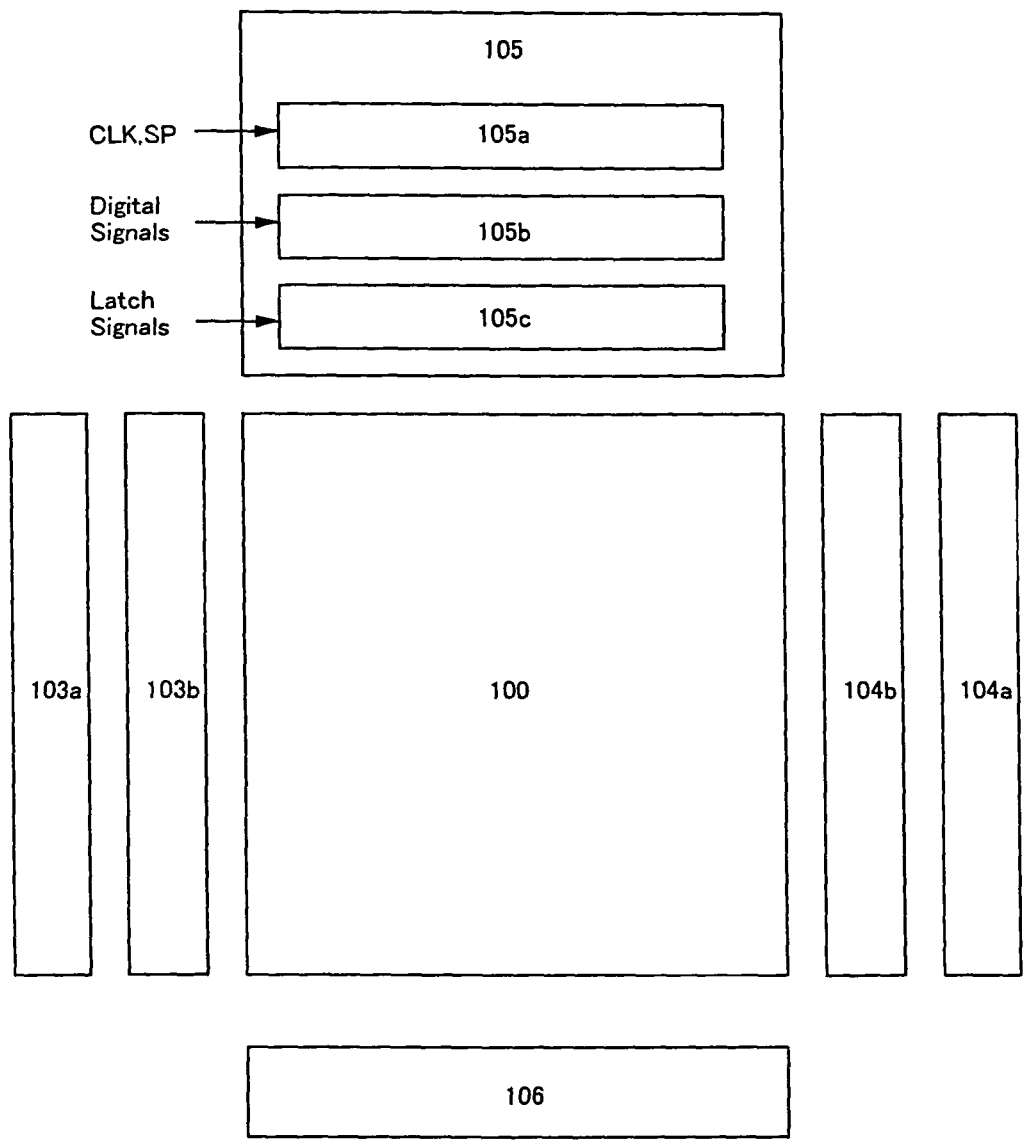
FIG. 11 is a schematic diagram of a semiconductor device of the present invention.

A block diagram of a semiconductor device of the present invention is shown in FIG. 11. The selection signal line driver circuit 103a and the selection output switching circuit 103b are formed in the periphery of the pixel portion 100, and the reset signal line driver circuit 104a and the reset output switching circuit 104b are also formed. Further, the source signal line driver circuit 105 and the sensor source signal line driver circuit 106 are formed in the periphery of the pixel portion 100.

The source signal line driver circuit 105 has a shift register 105a, a latch (A) 105b, and a latch (B) 105c. A clock signal CLK and a start pulse SP are input to the shift register 105a in the source signal line driver circuit 105. The shift register 105a generates timing signals in order based upon the clock signal CLK and the start pulse SP, and the timing signals are supplied one after another to downstream circuits.

Note that the timing signals from the shift register circuit 105a may be buffer amplified by a circuit such as a buffer (not shown in the figure) and then supplied one after another to the downstream circuits as buffer amplified timing signals. The load capacitance (parasitic capacitance) of a wiring to which the timing signals are supplied is large because many of the circuits and elements are connected to the wiring. The buffer is formed in order to prevent dullness in the rise and fall of the timing signal, generated because the load capacitance is large.

The timing signals from the shift register 105a are supplied to the latch (A) 105b. The latch (A) 105b has a plurality of latch stages for processing digital signals. The latch (A) 105b writes in and holds the digital signals simultaneously with the input of the timing signals.

Note that the digital signals may be input in order to a plurality of latch stages of the latch (A) 105b when the latch (A) 105b takes in the digital signals. The plurality of latch stages in the latch (A) 105b may also be divided into several groups and the digital signals may be input simultaneously by group, namely divided drive may also be performed. Note that the number of groups is referred to as the number of divisions. For example, in the case of dividing the latch (A) into groups by four stages, this is called divided drive using four divisions.

A period until write in of the digital signal to all of the latch stages of the latch (A) 105b is complete is referred to as a line period. In other words, the line period is the time period from the point at which write in of the digital signal into the leftmost latch stage of the latch (A) 105b is started to the point at which write in of the digital signal into the rightmost latch stage of the latch (A) 105b is complete. In practice, the line period is a period in which a horizontal return period is added to the period described above.

A latch signal it supplied to the latch (B) 105c when one line period is complete. The digital signal written into and held in the latch A 105b is sent all at one to the latch (B) 105c at this instant, and is written into all of the latch stages of the latch (B) 105c, and held.

Write in of the digital signal is once again performed in order in the latch (A) 105b based on a timing signal from the shift register 105a after the latch (A) 105b sends the digital signal to the latch (B) 105c.

The digital signal written into and held in the latch (B) 105c is then input to the source signal lines S during a second line period.

Note that the structure of the source signal line driver circuit is not limited to the structure shown in embodiment 4.

Figure 12:
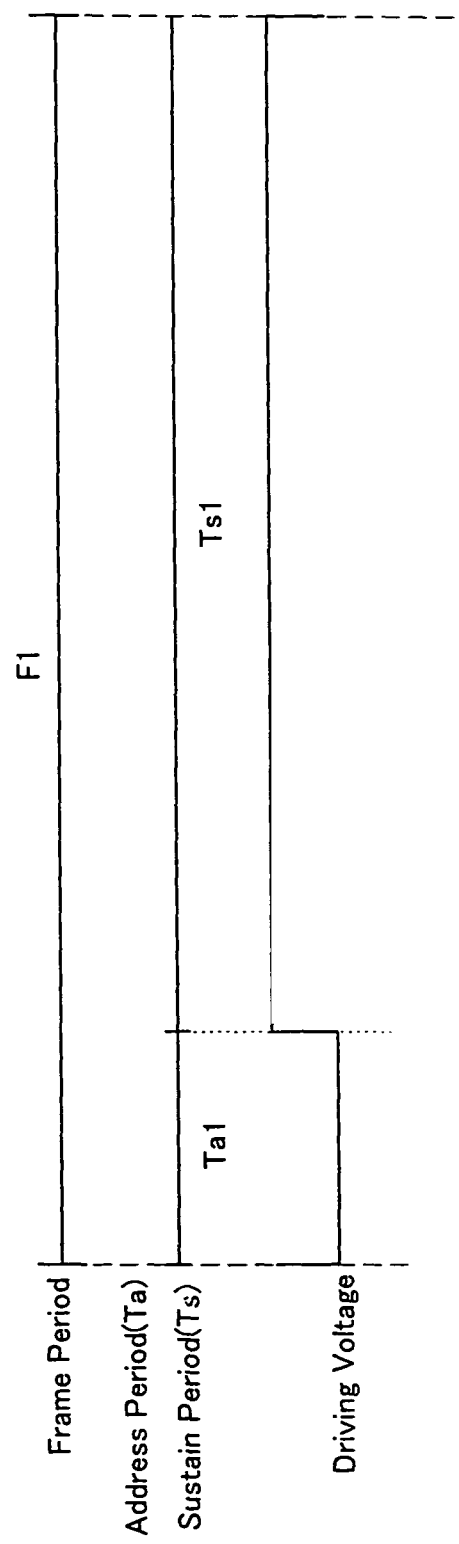

A timing chart in the case of driving the selection TFT 212 and the driver TFT 213, which control the operation of the light emitting elements 216 of the pixel portion 100, by a digital method is shown in FIG. 12. The driving method is explained below.

A period through which all of the pixels of the pixel portion 100 emit light is referred to as one frame period F. The frame period is divided into an address period Ta and a sustain period Ts. The address period is a period in which a digital signal is input to all of the pixels during one frame period. The sustain period (also referred to as a turn-on period) shows a period in which the Light emitting elements emit light, or do not display light, in accordance with the digital signal input to the pixels in the address period, and in which display is performed.

First, in the address period Ta, the electric potential of the opposing electrode of the light emitting element is maintained at the same height as the electric potential of the electric power source supply line V (electric power source potential.)

The selection TFT 212 connected to the selection signal line EG1 then is turned on in accordance with a gate signal input to the selection signal line EG1. A digital signal is next input from the source signal line driver circuit 105 to the source signal line S. The digital video signal input to the source signal line S is input to the gate electrode of the driver TFT 213 through the selection TFT 212 which is in an on state.

Next, all of the selection TFTs 212 connected to the selection signal line EG2 then turns on in accordance with a signal input to the selection signal line EG2. A digital video signal is next input from the source signal line driver circuit 105 to the source signal line S. The digital video signal input to the source signal line S is input to the gate electrode of the driver TFT 213 through the selection TFT 212 which is in an on state.

The above operations are repeated through the selection signal line EGy, the digital signal is input to the gate electrodes of the driver TFTs 213 of all of the pixels 101, and the address period Ta ends.

The sustain period Ts begins simultaneously with the end of the address period Ta. All of the selection TFTs 212 are placed in an off state in the sustain period Ts.

Then, at the same time as the sustain period begins, the electric potential of opposing electrodes of all of the light emitting elements 216 becomes high enough to have the electric potential difference from the electric power source potential at a level at which the light emitting elements 216 will emit light when the electric power source potential is applied to the pixel electrodes. Note that the electric potential difference between pixel electrodes and the opposing electrode is referred to as a driving voltage in this specification. Further, the driver TFTs 213 are placed in an on state in accordance with the video signal input to the gate electrode of the driver TFTs 213 of each pixel. Therefore, the electric power source potential is applied to the pixel electrodes of the light emitting elements 216, and the light emitting elements 216 of all pixels emit light.

One frame period is complete with the completion of the sustain period Ts.

Note that although an explanation of a method of driving an semiconductor device for reading in a subject as a monochrome image is made in embodiment 1, the case of reading in a subject as a color image is similar. However, in the case of a semiconductor device which reads in a color image, one frame period is divided into three sub-frame periods corresponding to RGB, and an address period and a sustain period are formed in each sub-frame period. A signal is input to all of the pixels such that only the light emitting elements of pixels corresponding to R will emit light, and only the light emitting elements for the color R perform light emission in the sustain period. Similarly in the sub-frame periods for G and B. only light emitting elements of pixels corresponding to the respective colors perform light emission during each sustain period.

It is important that each sustain period of the three sub-frame periods corresponding to RGB contains a sensor frame period for R, G, and B (SFr, SFg, SFb), respectively, in the case where the semiconductor device is used to read in a color image.

Further, it is possible to freely combine embodiment 4 with embodiment modes 1 to 3, and with embodiments 1 to 3.

[Embodiment 5]

A method of driving the selection TFTs 212 and the driver TFTs 213 for controlling the operation of the light emitting elements 216 witch differs from that of embodiment 4 is explained in embodiment 5. Please refer to FIGS. 6 and 7 regarding the structure of the pixel portion 100 in embodiment 5.

Figure 13:
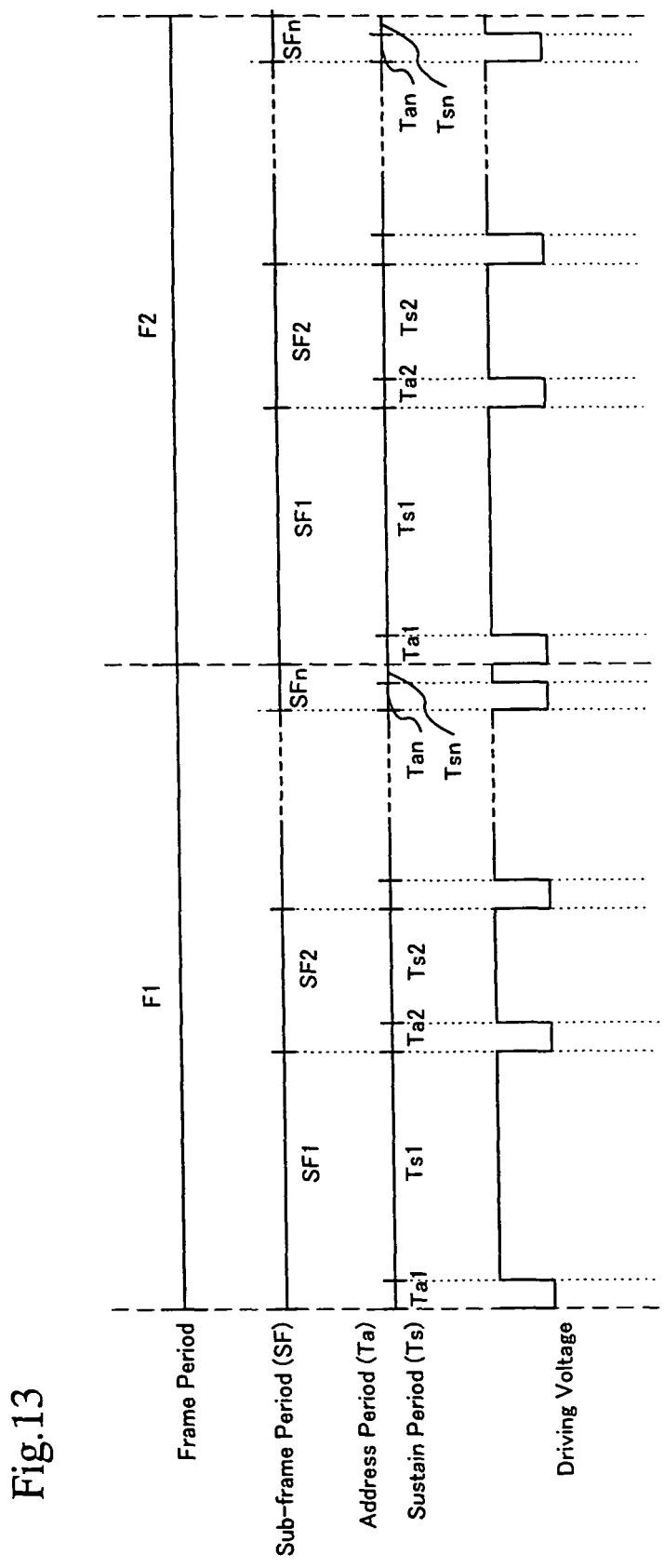
FIG. 13 is a timing chart of light emitted from light emitting elements when an image is displayed.

A timing chart for performing display of an image in the pixel portion 100 in the semiconductor device of the present invention by a digital method is shown in FIG. 13.

First, one frame period F is divided into n sub-frame periods SF1 to SFn. The number of sub-frame periods in one frame period also increases as the number of grey scales increases. Note that, when the pixel portion 100 of the semiconductor device displays an image, one frame period F shows a period during which all pixels 101 of the pixel portion 100 display one image.

It is preferable that 60 or more frame periods be formed each second in embodiment 5. It becomes possible to visually suppress image flicker by setting the number of images displayed each second to 60 or more.

The sub-frame period is divided into an address period Ta and a sustain period Ts. The address period is a period during which a digital video signal is input to all pixels within one sub-frame period . Note that the digital video signal is a digital signal having image information. The sustain period (also referred to as a turn-on period) shows a period during which the light emitting elements are placed in a state of emitting light, or a state of not emitting light, in accordance with the digital video signal input to the pixels in the address period, and display is performed.

The address periods Ta of the sub-frame periods SF1 to SFn are assumed to be address periods Ta1 to Tan, and the sustain periods Ts of the sub-frame periods SF1 to SFn are assumed to be sustain periods Ts1 to Tsn.

The electric potential of the electric power source supply lines (V) is maintained at a predetermined electric potential (electric power source potential).

First, the electric potential of the opposing electrodes of the light emitting elements is maintained at the same level as the electric power source potential in the address period Ta.

Next, all of the selection TFTs 212 connected to the selection signal line EG1 are placed in an on state in accordance with a signal input to the selection signal line EG1. The digital video signal is then input to the source signal lines S from the source signal line driver circuit 105. The digital video signal has "0" information or "1" information, one of which is a signal having a high voltage, while the other is a signal having a low voltage.

The digital video signal input to the source signal lines S is then input to the gate electrodes of the driver TFTs 213 through the selection TFTs 212 in the on state.

All of the selection TFTs 212 connected to the selection signal line EG1 are then placed in an off state, and all of the selection TFTrs 212 connected to the selection signal line EG2 are placed in an on state in accordance with a timing signal input to the selection signal line EG2. The digital video signal is then input to the source signal lines S from the source signal line driver circuit 105. The digital video signal input to the source signal lines S is input to the gate electrodes of the driver TFTs 213 through selection TFTs 212 in the on state.

The above operations are repeated through the selection signal line EGy, and the digital video signal is input to the gate electrodes of the driver TFTs 213 of all of the pixels 101, and the address period is complete.

The sustain period begins at the same time as the address period is completed. All of the selection TFTs are in an off state in the sustain period. The electric potential of the opposing electrodes of all of the light emitting elements becomes high enough to have the electric potential difference from the electric power source potential at the level at which the light emitting elements emit light when the electric power source potential is applied to the pixel electrodes.

When the digital video signal has "0" information, the driver TFTs 213 are placed in an off state in embodiment 5. The pixel electrodes of the light emitting elements 216 are therefore maintained at the electric potential of the opposing electrodes. As a result, the light emitting elements 216 do not emit light in the pixel into which a digital video signal having "0" information is input.

Conversely, when the digital video signal has "1" information, the driver TFTs 213 are placed in an on state. The electric power source potential is therefore applied to the pixel electrodes of the light emitting elements 216. As a result, the light emitting elements 216 of the pixels into which the digital video signal having "1" information is input emit light.

The light emitting elements are thus placed in a state in which they emit light or in a state in which they do not emit light in accordance with the information of the digital video signal input to the pixels, and the pixels perform display.

One sub-frame period is complete at the same time as the sustain period is complete. The next sub-frame period then appears, and once again the address period begins. The sustain period begins again after the digital video signal is input to all of the pixels. Note that the order of appearance of the sub-frame periods SF1 to SFn is arbitrary.

Similar operations are then repeated in the remaining sub-frame periods, and display is performed. After completing all of the n sub-frame periods, one image is displayed, and one frame period is complete. When one frame period is complete, the sub-frame period of the next frame period appears, and the aforementioned operations are repeated.

The lengths of the address periods Ta1 to Tan of the respective n sub-frame periods are each the same in the present invention. Further, the ratio of lengths of the n sustain periods Ts1, ..., Tsn is expressed by Ts1: Ts2: Ts3: ... : Ts(n-1): Tsn=$2^0:2^{-1}:2^{-2}: ... : 2^{-(n-2)}: 2^{-(n-1)}$.

The grey-scale of each pixel is determined in accordance with during which sub-frame periods in one frame period the pixel is made to emit light. For example, when n=8, pixels which emit light in Ts1 and Ts2 can express a brightness of 75%, assuming the brightness of pixels which emit light in all of the sustain periods to have a value of 100%, and in the case of selecting Ts3, Ts5, and Ts8, a brightness of 16% can be expressed.

Note that it is possible to freely combine embodiment 5 with embodiment modes 1 to 3, and with embodiments 1 to 4.

[Embodiment 6]

The electric potential of the opposing electrodes is maintained at the same electric potential as that of the electric power source potential during the address period in embodiments 4 and 5, and the light emitting elements do not emit light. An example which differs from those of embodiment 4 and embodiment 5 is explained in embodiment 6. Display may also be performed in the address period, similarly in the display of the display period, if an electric potential difference is always formed between the opposing electric potential and the electric power source potential, at a level at which the light emitting elements will emit light when the electric power source potential is applied to the pixel electrodes.

However, when combining embodiment 6 with a case of using the light emitting elements as a light source, it is important that the sensor frame period SF be contained within the frame period in a semiconductor device that reads in a monochrome image. Furthermore, it is important that the three sub-frame periods corresponding to RGB be contained with R, G, and B sensor frame periods, respectively, in a semiconductor device which reads in a color image.

In addition, when combining a case of image display in a sensor portion with embodiment 6, the entire sub-frame period becomes a period for performing display in practice, and therefore the lengths of the sub-frame periods are set so as to be SF1 :SF2: SF3: . . . :SF(n-1): SFn =$2^0: 2^{-1}: 2^{-2}: ... 2^{-(n-2)}: 2^{-(n-1)}$. An image having a higher brightness can be obtained in accordance with the above structure in comparison with the driver method in which light is not emitted during the address period.

Furthermore, it is possible to freely combine embodiment 6 with embodiment modes 1 to 3, and with embodiments 1 to 5.

[Embodiment 7]

A method of driving the selection TFTs 212 and the driver TFTs 213 for controlling the operation of the light emitting elements 216, that differs from those of embodiments 4 to 6, is explained in embodiment 7. Please refer to FIGS. 6 and 7 regarding the structure of the pixel portion 100 in embodiment 7.

Figure 14:
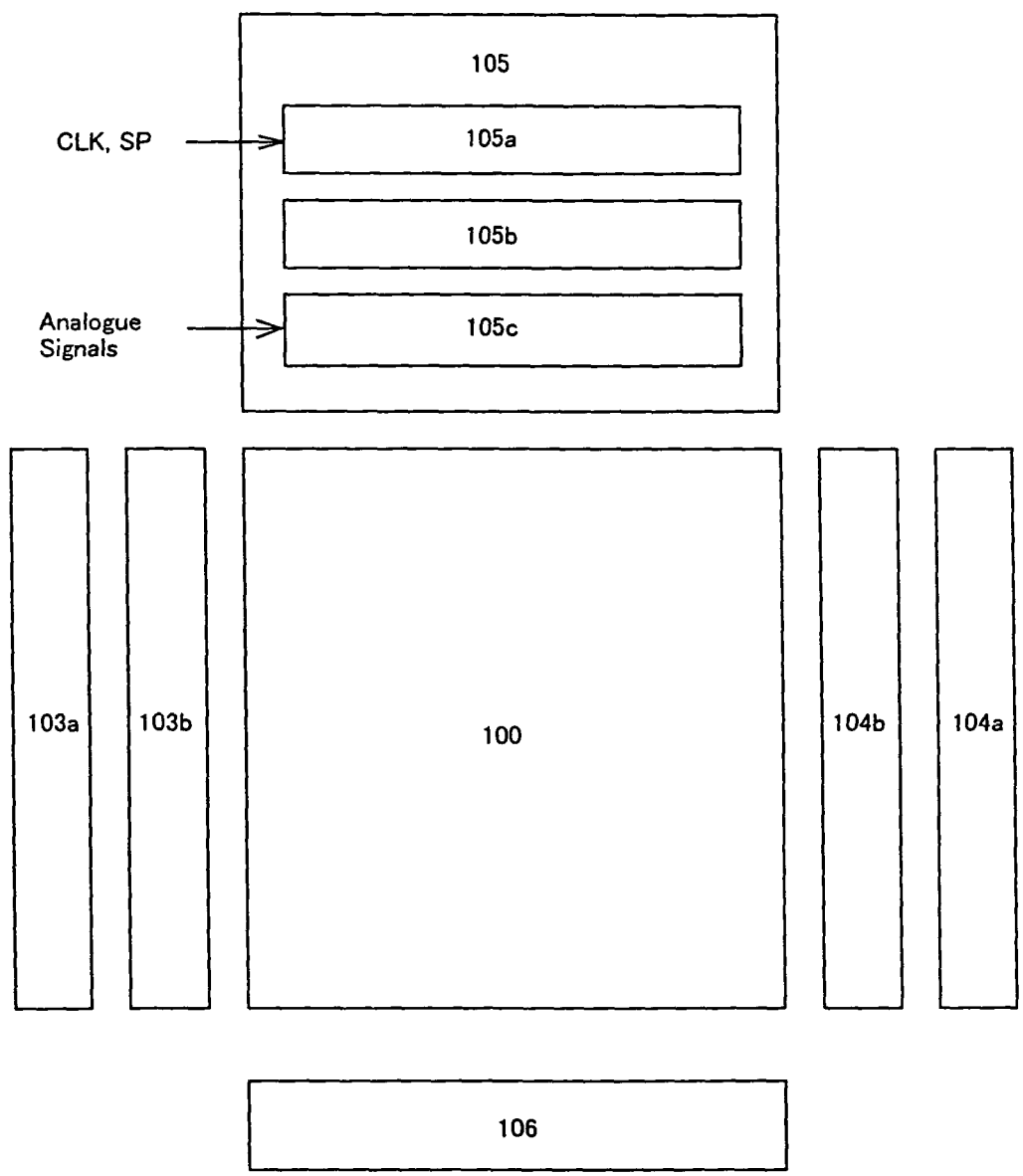
FIG. 14 is a schematic diagram of a semiconductor device of the present invention.

FIG. 14 shows a block diagram of a semiconductor device of embodiment 7. The selection signal line driver circuit 103*a* and the selection output switching circuit 103*b* are formed in the periphery of the pixel portion 100, and the reset signal line driver circuit 104*a* and the reset output switching circuit 104*b* are also formed. Further, the source signal line driver circuit 105 and the sensor source signal line driver circuit 106 are formed.

The source signal line driver circuit 105 has a shift register 105*a*, a level shifter 105*b*, and a sampling circuit 105*c*. Note that the level shifter 105*b* may be used by the designer when necessary. Further, although a structure is used in embodiment 7 in which the level shifter 105*b* is formed between the shift register 105*a* and the sampling circuit 105*c*, the present invention is not limited to this structure. A structure in which the level shifter 105*b* is incorporated within the shift register 105*a* may also be used.

A clock signal CLK and a start pulse signal SP are input to the shift register 105*a*. A sampling signal is output from the shift register 105*a* in order to sample an analog signal. The output sampling signal is input to the level shifter 105*b*, its electric potential amplitude is increased, and it is output.

The sampling signal output from the level shifter 105*b* is input to the sampling circuit 105*c*. The analog signal input to the sampling circuit 105*c* is then sampled by the sampling signal, and input to source signal lines S.

On the other hand, the selection signal line driver circuit 103*a* has a shift register and a buffer (neither shown in the figure).

A timing signal is supplied to the buffer (not shown in the figure) from the shift register (also not shown in the figure) in the selection signal line driver circuit 103*a*, and this is supplied to a corresponding selection signal line. Gate electrodes of the selection TFTs 212 of one line portion of pixels are connected to the selection signal lines EG, and all of the selection TFTs 212 of the one line portion of pixels must be placed in an on state simultaneously. Therefore, a buffer in which a large electric current is capable of flowing is used.

Figure 15:
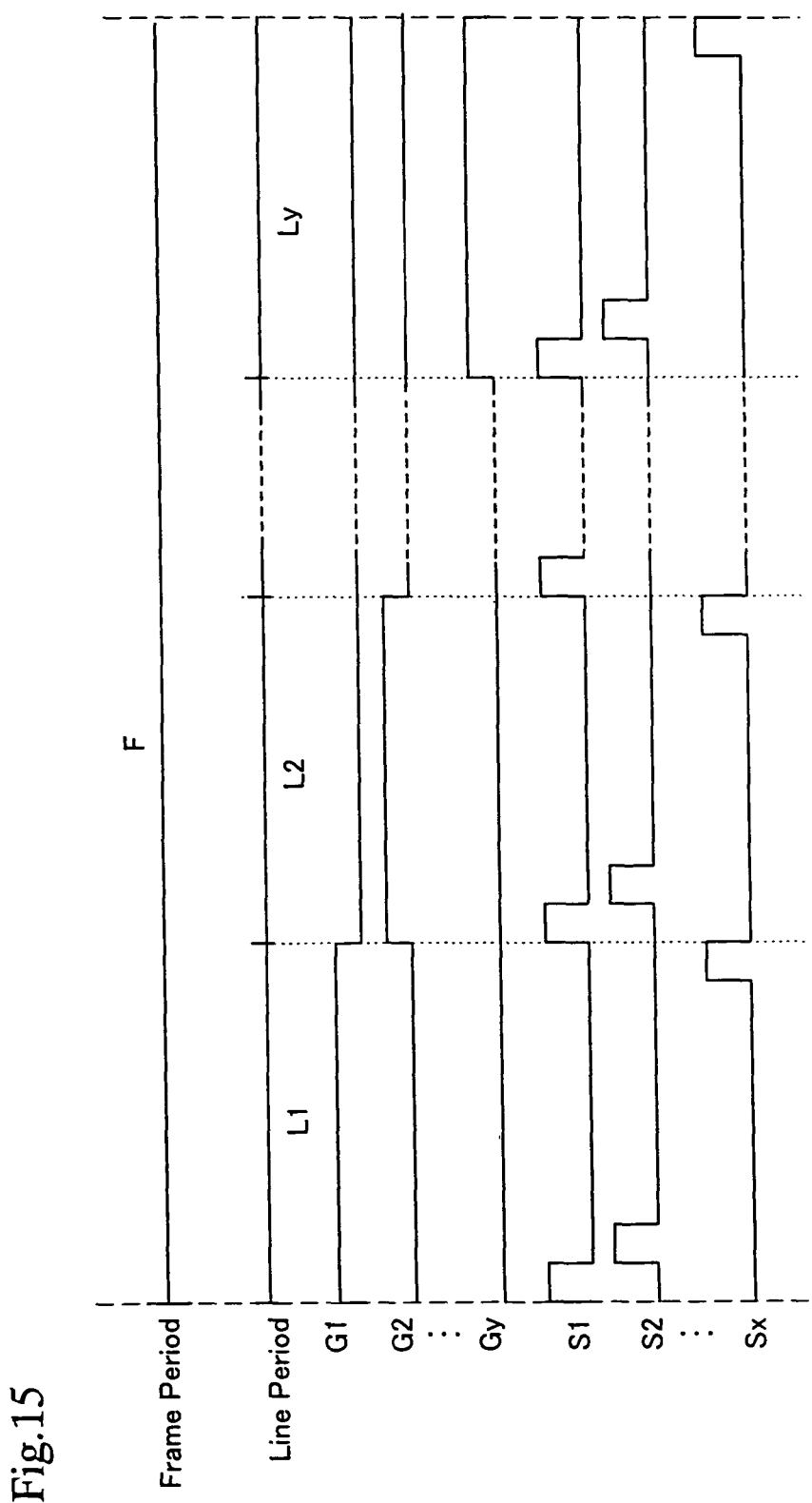

Next, a timing chart in the case of driving the selection TFTs 212 and the driver TFTs 213 by an analog method is shown in FIG. 15. A period through which all of the pixels of the pixel portion 100 emit light is referred to as one frame period F. One line period L shows a period from the selection of one selection signal line to the selection of the next, another, selection signal line. In the case of the semiconductor device shown in FIG. 15, there are y selection signal lines, and therefore y line periods L1 to Ly are formed within one frame period.

The number of line periods within one frame period increases along with increasing resolution, and the driver circuits must be driven at a high frequency.

First, the electric potential of the electric power source supply lines V is maintained at a constant electric power source potential. The opposing electric potential, the electric potential of the opposing electrodes of the light emitting elements, is also maintained at a constant electric potential. The electric power source potential has an electric potential difference from the opposing electric potential at a level at which the light emitting elements will emit light when the electric power supply potential is applied to the pixel electrodes of the light emitting elements.

In the first line period L1, all of the selection TFTs 212 connected to the selection signal line EG1 are placed in an on state in accordance with a timing signal input to the selection signal line EG1 from the selection signal line driver circuit 103*a*. The analog signal is then input to the source signal lines S, in order, from the source signal line driver circuit 105. The analog signal input to the source signal lines S is input to the gate electrodes of the driver TFTs 213 through the selection TFTs 212 which are in an on state.

The size of the electric current flowing in a channel forming region of the driver TFTs 213 is controlled by the level of the electric potential (voltage) of the signal input to the gate electrodes of the driver TFTs 213. Therefore, the electric potential applied to the pixel electrodes of the light emitting elements 216 is determined by the value of the electric potential of the analog signal input to the gate electrodes of the driver TFTs 213. The light emitting elements 216 are controlled by the electric potential of the analog signal, and perform the emission of light. Note that the analog signal input to all of the pixels is maintained at the same electric potential level in embodiment 7.

The first line period L1 is complete when input of the analog signal to the source signal lines S is complete. Note that the period until the input of the analog signal to the source signal lines S may also be combined with a horizontal return period and taken as one line period. The second line period L2 begins next, and all of the selection TFTs 212 connected to the selection signal line EG1 are placed in an off state. All of the selection TFTs 212 connected to the selection signal line EG2 are then placed in an on state in accordance with a gate signal input to the selection signal line EG2. Then, similarly in the first line period L1, the analog signal is input in order to the source signal lines S.

The above operations are repeated through the selection signal line EGy, and all of the line periods L1 to Ly are complete. When all of the line periods L1 to Ly are complete, one frame period is complete. The light emitting elements of all of the pixels perform light emission by completing one frame period. Note that all of the line periods L1 to Ly and a vertical return period may also be combined and taken as one frame period.

It is necessary for the pixels to emit light in all of the sampling periods ST1 to STy in the present invention, and it is important that the sensor frame period SF is included within the frame period in the case of the driving method of embodiment 7, Note that although an explanation of a method of driving a semiconductor device for reading in a monochrome image is explained in embodiment 4, a case of reading in a color image is similar. However, one frame period is divided into three sub-frame periods corresponding to RGB in the case of a semiconductor device which reads in a color image. An analog signal is then input to all of the pixels such that only the light emitting elements of pixels corresponding to R will emit light in an R sub-frame period, and only the light emitting elements for the color R perform light emission. Similarly in the sub-frame periods for G and B, only light emitting elements of pixels corresponding to the respective colors perform light emission.

It is important that each sustain period of the three sub-frame periods corresponding to RGB contains a sensor frame period for R, G, and B (SFr, SFg, SFb), respectively, in a semiconductor device that reads in color images.

Note that it is possible to freely combine embodiment 7 with embodiment modes 1 to 3. and with embodiments 1 to 6.

[Embodiment 8]

Figure 16:
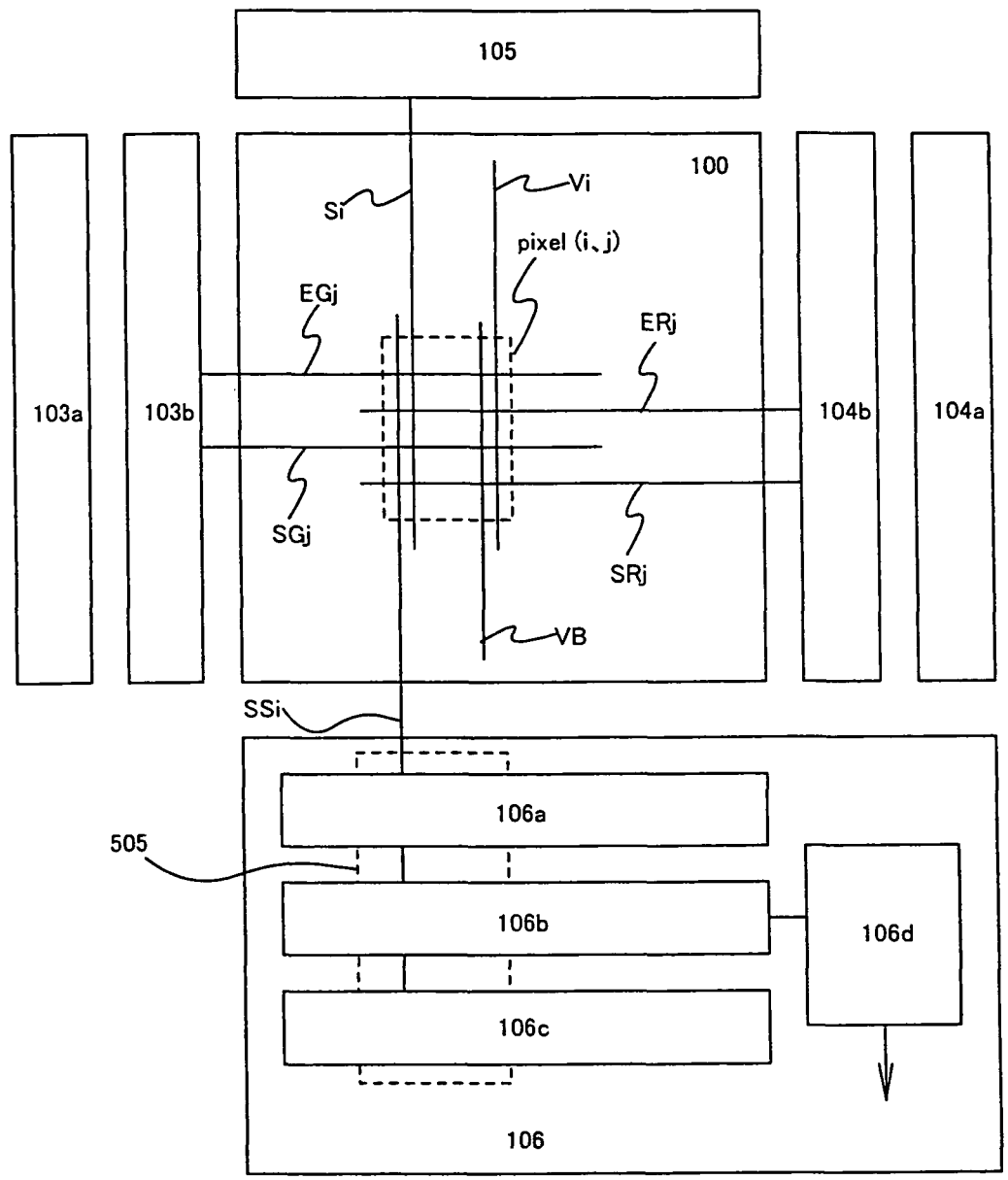
FIG. 16 is a schematic diagram of a semiconductor device of the present invention.

FIG. 16 shows a block diagram of a semiconductor device of embodiment 8. The selection signal line driver circuit 103*a* and the selection output switching circuit 103*b* are formed in the periphery of the pixel portion 100, and the reset signal line driver circuit 104*a* and the reset output switching circuit 104*b* are also formed. Further, the source signal line driver circuit 105 and the sensor source signal line driver circuit 106 are formed.

Note that FIGS. 6 and 7 may be referred to regarding the structure of the pixel portion 100 in embodiment 8. A method of driving the sensor portion 221 is explained while focusing on the sensor portion 221 which structures the pixel portion 100, in embodiment 8.

The sensor source signal line driver circuit 106 has a bias circuit 106*a*, a sample hold and signal processing circuit 106*b*, a signal output driver circuit 106*c*, and a final output amplifier circuit 106*d*.

The bias circuit 106*a* forms a pair with the sensor driver TFT 212 of each pixel to form a source follower circuit. The sample hold and signal processing circuit 106*b* is formed in the lower portion of the bias circuit 106*a*. The sample hold and signal processing circuit 106*b* is a circuit formed to temporarily store a signal, to perform analog to digital conversion, and to reduce noise.

The signal output driver circuit 106*c* is formed in the lower portion of the sample hold and signal processing circuit 106*b*. The signal output driver circuit 106*c* outputs signals for outputting the temporarily stored signals to the pixel portion 100. The final output amplifier circuit 106*d* amplifies signals output from the sample hold and signal processing circuit 106*b* and from the signal output driver circuit 106*c* in order to perform output to the outside. In other words, it is unnecessary when the signals are not amplified, but is often formed.

Figure 17:
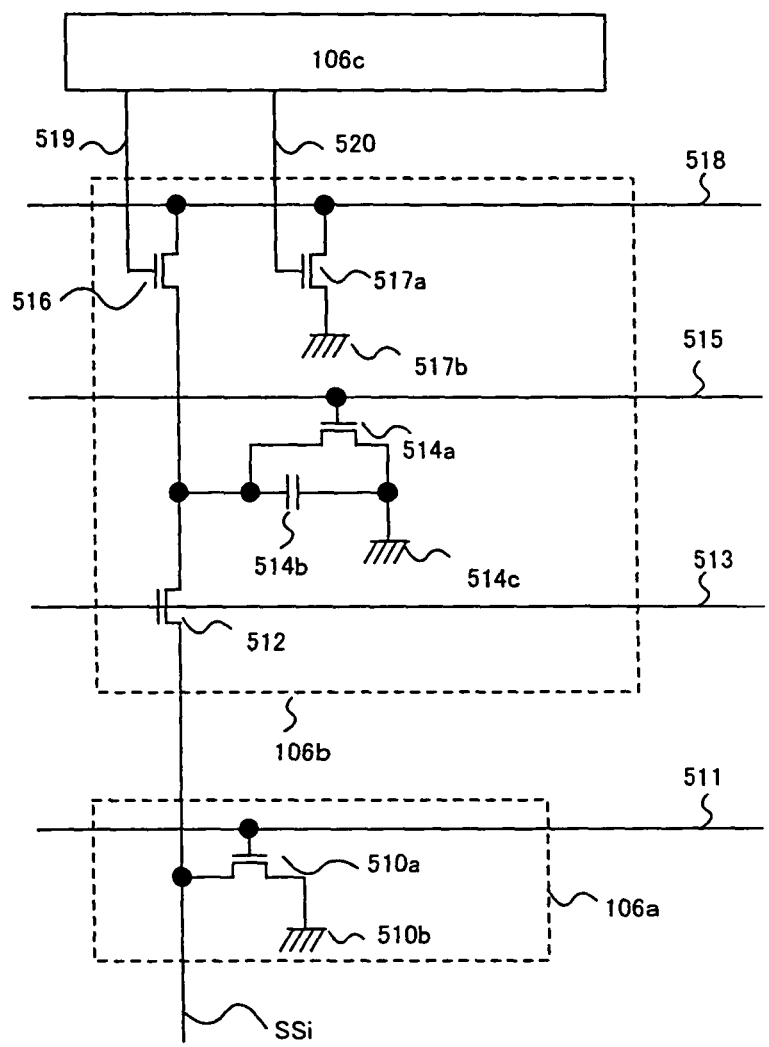
FIG. 17 is a circuit diagram of a sensor source signal line driver circuit.

Please refer to FIG. 17. A circuit diagram of a number i column peripheral circuit 505 of the bias circuit 106*a*, the sample hold and signal processing circuit 106*b*, and the signal output driver circuit 106*c* is shown in FIG. 17. Embodiment 8 shows a case in which all of the TFTs are n-channel. The bias circuit 106*a* has a bias TFT 510*a*. The polarity of the bias TFT 510*a* is the same as the polarity of the sensor driver TFTs 223 of each pixel, and forms source follower circuits with the sensor driver TFTs 223.

A gate electrode of the bias TT 510*a* is connected to a bias signal line 511. One of a source electrode and a drain electrode of the bias TFT 510*a* is connected to the sensor signal output line SSi, and the other one is connected to an electric power source reference line 510*b*. Note that although embodiment 8 shows a case in which the bias TFT 510*a* is an n-channel TFT, the bias TFT 510*a* is connected to an electric power source line when the bias TFT 510*a* is a p-channel TFT.

A transfer signal line 513 is connected to a gate electrode of a transfer TFT 512. One of a source electrode and a drain electrode of the transfer TFT 512 is connected to the sensor signal output line SSi, and the other one is connected to a capacitor 514*b*. The transfer TFT 512 operates in the case of transferring the electric potential of the sensor signal output line SSi to the capacitor 514*b*. Further, although only an n-channel transfer TFT 512 is used in embodiment 8, a p-channel transfer TFT can also be added and connected in parallel with the n-channel transfer TFT 512.

The capacitor 514*b* is connected to the transfer TFT 512 and to a electric power source reference line 514*c*. The capacitor 514*b* temporarily stores signals output from the sensor signal output lines SSi. A gate electrode of a discharge TFT 514*a* is connected to a pre-discharge signal line 515. Further, one of a source electrode and a drain electrode of the discharge TFT 514*a* is connected to the capacitor 514*b*, and the other one is connected to the electric power source reference line 514*c*. The discharge TFT 514*a* plays the role of discharging an electric charge on the capacitor 514*b* before the electric potential of the sensor signal output line SSi is input to the capacitor 514*b*.

Note that the structure of the sensor source signal line driver circuit 106 of the present invention is not limited to the structure of FIG. 16. It is possible to form the sensor source signal line driver circuit by adding circuits such as an analog to digital signal converter circuit or a noise reduction circuit to the structure shown in FIG. 16, and the source signal line driver circuit can be freely designed.

A final selection TFT 516 is formed between the capacitor 514*b* and a final output wiring 518. One of a source electrode and a drain electrode of the final selection TFT 516 is connected to the capacitor 514*b*, and the other one is connected to the final output wiring 518. A gate electrode of the final selection TFT 516 is connected to a number i column final selection line 519.

The final selection lines 519 are scanned in order from the first column. If the number i column final selection line 519 is selected and the final selection TFT 516 is placed in a conductive state, then the electric potential of the capacitor 514*b* and the electric potential of the number i column final selection line 519 become equal. The signal stored in the capacitor 514*b* can then be output to the final output line 518.

However, if electric charge is stored in the final output line 518 before the signal is output to the final output line 518, then the electric potential is influenced by that electric charge when the signal is output to the final output line 518. It is therefore necessary to perform an initialization operation of the electric potential of the final output line 518 to a certain electric potential value before outputting the signal to the final output wiring 518.

A final reset TFT 517*a* is arranged between the final output line 518 and the electric power source reference line 517*b* in FIG. 17. An i-th column final reset line 520 is connected to a gate electrode of the final reset TFT 517*a*. The number i column final reset line 520 is selected before selecting the number i column final selection line 519, and the electric potential of the final output line 518 is initialized to the electric potential of the electric power source reference line 517*b*. The number i column final selection line 519 is then selected, and the signal stored in the capacitor 514*b* is output to the final output line 518.

Figure 18:
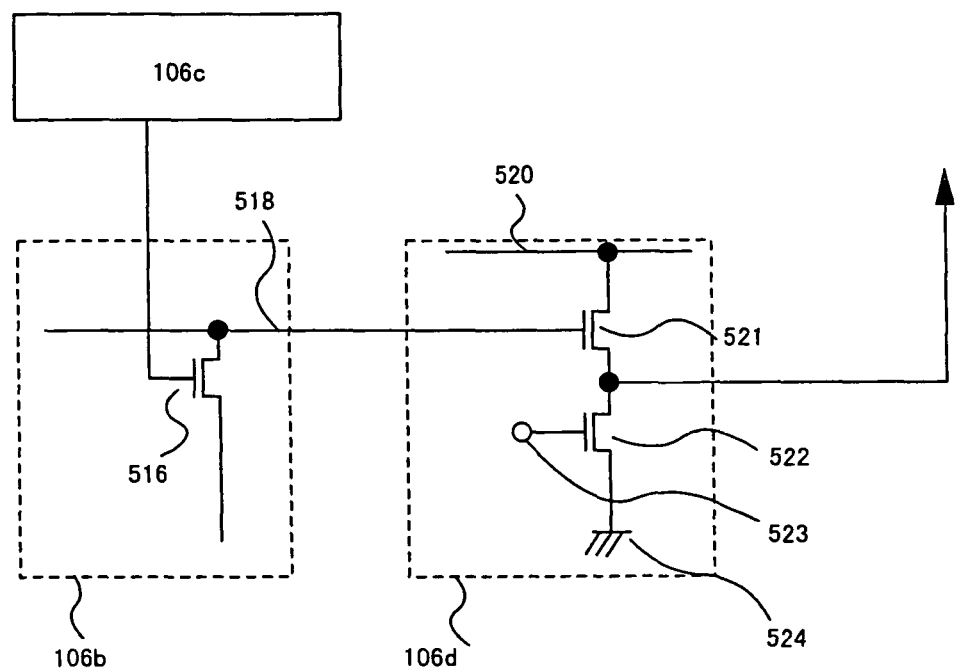
FIG. 18 is a circuit diagram of a sensor source signal line driver circuit.
Figure 19:
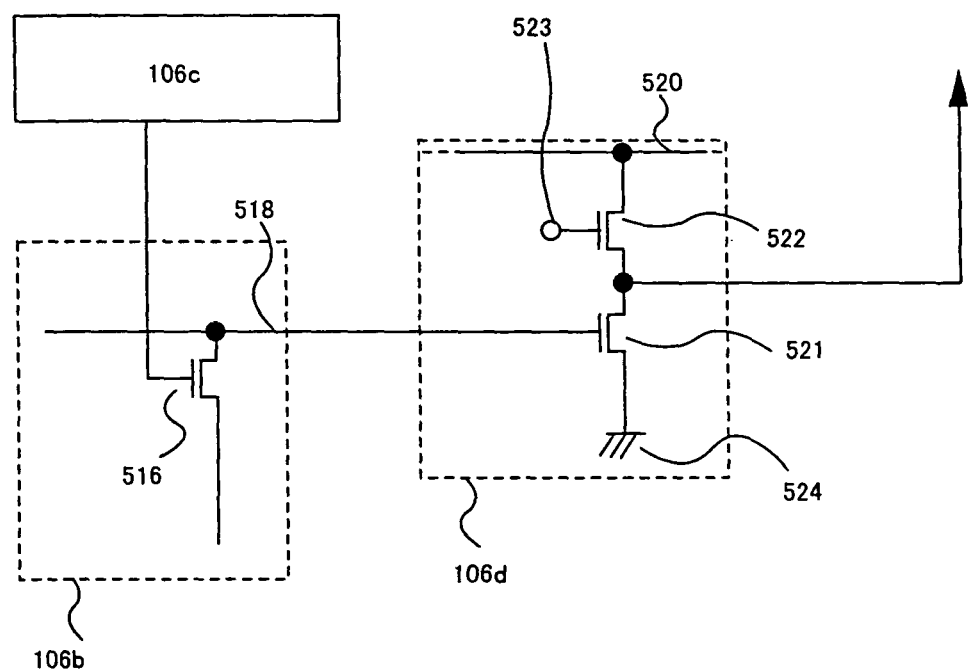
FIG. 19 is a circuit diagram of a sensor source signal line driver circuit.

It is possible to extract the signal output to the final output line 518 as is to the outside. However, the signal is weak, and it is therefore preferable to amplify the signal before sending to the outside. Final output amplifier circuits 106*d* are shown in FIGS. 18 and 19 as circuits for amplifying signals. Although there are various types of circuits for amplifying signals, such as operational amplifiers, a source follower circuit, the simplest circuit structure, is shown as the amplifier circuit structure in embodiment 8. Note that FIG. 18 shows an n-channel source follower circuit, and that FIG. 19 shows a p-channel source follower circuit.

FIG. 18 shows a circuit diagram of an n-channel source follower circuit. Input of signals to the final output amplifier circuit 106*d* is performed through the final output lines 518. The final output lines 518 are arranged in a matrix shape in the pixel portion. and signals are output in order from the first column. Signals output from the final output lines 518 are amplified by the final output amplifier circuit 106*d*, and are then output to the outside. The final output line 518 is connected to a gate electrode of an amplification TFT 521 for final output amplification. A drain electrode of the amplification TFT 521 for final output amplification is connected to the electric power source line 520, and a source electrode of the amplification TFT 521 is connected to an output terminal. A gate electrode of a bias TFT 522 for final output amplification is connected to a final output amplification bias signal line 523. One of a source electrode and a drain electrode of the bias TFT 522 for final output amplification is connected to an electric power source reference line 524, and the other one is connected to a source electrode of the amplification TFT 521 for final output amplification.

Next, FIG. 19 shows a circuit diagram of a p-channel source follower. The final output line 518 is connected to the gate electrode of the amplification TFT 521 for final output amplification. The drain electrode of the amplification TFT 521 for final output amplification is connected to the electric power source reference line 524, and the source electrode is connected to the output terminal. The gate electrode of the bias TFT 522 for final output amplification is connected to the final output amplification bias signal line 523. One of the source electrode and the drain electrode of the final output amplification bias TFT 522 is connected to the electric power line 520, and the other one is connected to the source electrode of the amplification TFT 521 for final output amplification. Note that the electric potential of the final output amplification bias signal line 523 shown in FIG. 19 is different from the electric potential of the final output amplification bias signal line 523 in using the n-channel source follower circuit shown in FIG. 18.

Further, it is possible to freely combine embodiment 8 with embodiment modes 1 to 3, and with embodiments 1 to 8.

[Embodiment 9]

Figure 20:
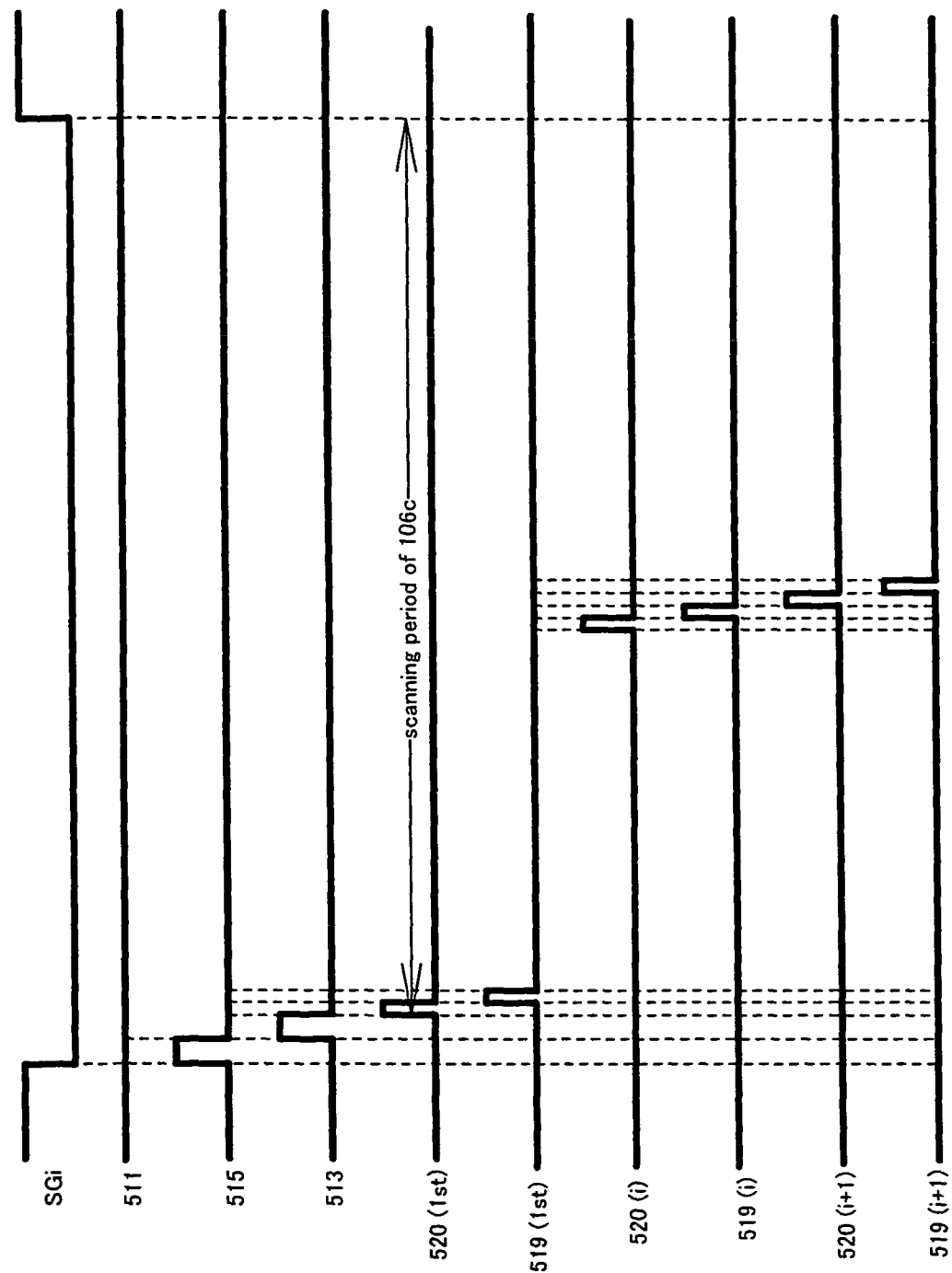
FIG. 20 is a timing chart diagram of a sensor source signal line driver circuit.

Operation of the sensor source signal line driver circuit 106 used in the semiconductor device shown in FIG. 16 is explained next. A signal timing chart for the sensor source signal line driver circuit 106 is shown in FIG. 20. A case of selecting the number i column sensor selection signal line SGi is shown as an example in embodiment 9.

First, the pre-discharge signal line 515 is selected when the number i column sensor selection signal line SGi is selected, and a discharge TFT 514 is placed in a conductive state. The transfer signal line 513 is then selected. Then, signals in each column are thus output to the capacitor 514b of each column from the pixels.

After signals of all the pixel are stored in each column of the capacitors 514b, the signals of each column are output to the final output lines 518 in order. All columns are scanned by the signal output driver circuit 106c during a period from non-selection of the transfer signal line 513 until selection of the sensor selection signal line SGi. First, the final reset line of the first column is selected, the final reset TFT 517a is placed in a conductive state, and the final output line 518 is initialized to the electric potential of the electric power source reference line 517b. The final selection line of the first column is then selected, the final selection TFT 516 is placed in a conductive state, and the signals of the first column of the capacitors 514b are output to the final output lines 518.

Next, the final reset line of the second column is selected, the final reset TFT 517a is placed in a conductive state, and the final output line 518 is initialized to the electric potential of the electric power source reference line 517b. The final selection line of the second column is then selected, the final selection TFT 516 is placed in a conductive state, and the signals of the second column of the capacitors 514b are output to the final output lines 518. Similar operations are then repeated.

In the case of the number i column, the number i column final reset line 520 is first selected, the final reset TFT 517a is placed in a conductive state, and the final output line 518 is initialized to the electric potential of the electric power source reference line 517b. The number i column final selection line 519 is then selected, the final selection TFT 516 is placed in a conductive state, and the signal in the number i column capacitor 514b is output to the final output line 518.

Next, the number (i+1) column final reset line 520 is selected, the final reset TFT 517a is placed in a conductive state, and the final output line 518 is initialized to the electric potential of the electric power source reference line 517b. The number (i+1) column final selection line 519 is then selected, the final selection TFT 516 is placed in a conductive state, and the signal in the number (i+1) column capacitor 514 is output to the final output line 518. Similar operations are then repeated, and the signals of all columns are output to the final output lines 518 in order. The electric potential of the bias signal line 511 is kept fixed during this period. The signals output to the final output wirings 518 are amplified by the final output amplification circuit 106d, and then output to the outside.

Note that in addition to PN type photodiodes, other components such as PIN type diodes, avalanche type diodes, NPN embedded type diodes, Schottky type diodes, x-ray photoconductors, and infrared sensors may also be used in the sensor portion for performing photoelectric conversion and the like. Further, after converting x-rays to light, the light may also be read in by using a fluorescing material or a scintillator.

The photoelectric conversion elements are often connected to the input terminals of source follower circuits, as discussed above. However, the photoelectric conversion elements structured by sandwiching switches therebetween, as photogate type, can also be used. Furthermore, the signals also be input to the input terminals after processing so that the light intensity values becomes logarithmic values.

Note that although a semiconductor device in which the pixels are arranged in a two dimensional manner is described in embodiment 9, a line sensor in which pixels are arranged in one dimension can also be realized.

Furthermore, it is possible to freely combine embodiment 9 with embodiment modes 1 to 3, and with embodiments 1 to 8.

[Embodiment 10]

A cross sectional structure in a pixel portion of a semiconductor device of the present invention is explained in embodiment 10.

Figure 21:
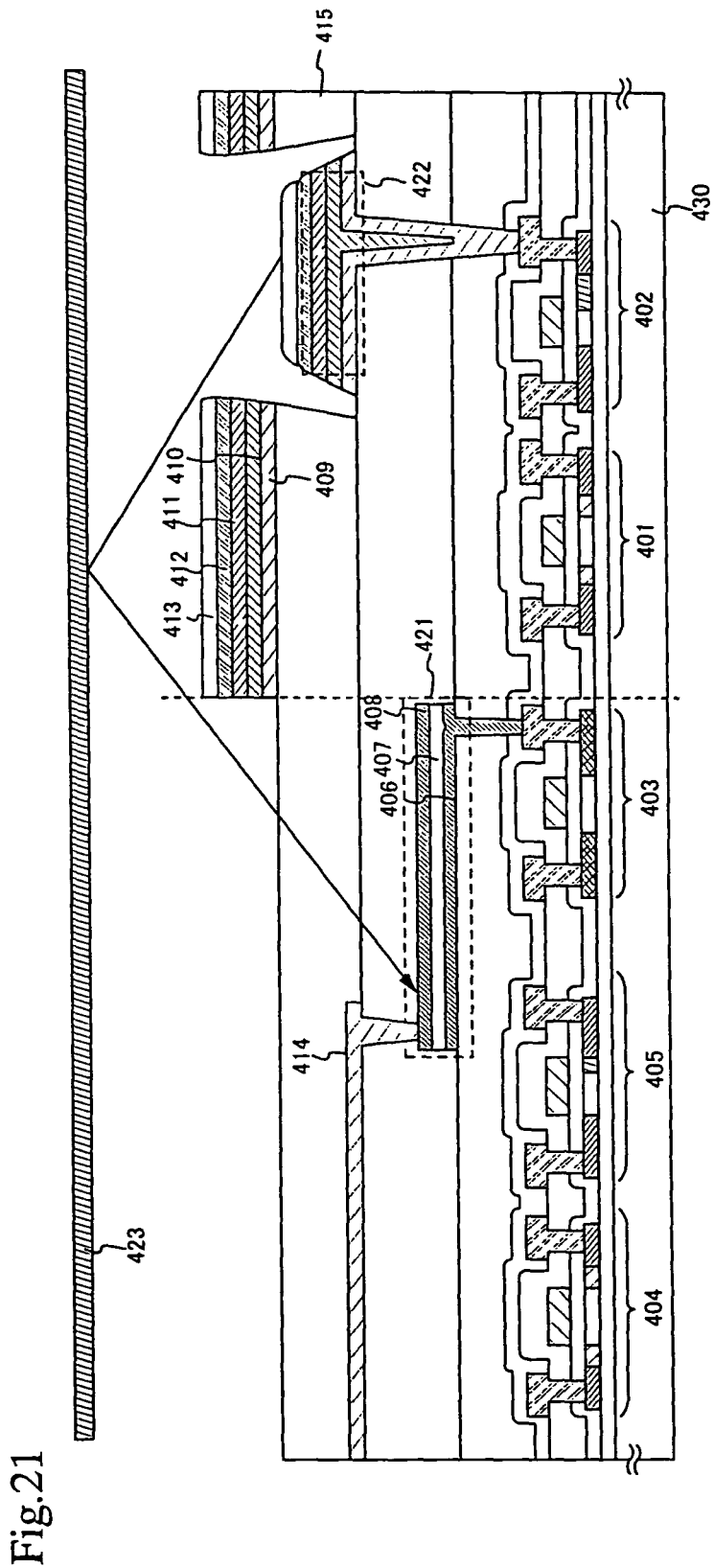
FIG. 21 is a cross sectional structure diagram of a semiconductor device of the present invention.

FIG. 21 shows a cross sectional diagram of a semiconductor device of embodiment 10. Reference numeral 401 denotes a selection TFT, reference numeral 402 denotes a driver TFT, 403 denotes a sensor reset TFT, 404 denotes a sensor driver TFT, and reference numeral 405 denotes a sensor selection TFT.

Further, reference numeral 406 denotes a cathode electrode, 407 denotes a photoelectric conversion layer, and 408 denotes an anode electrode. A photodiode 421 is formed by the cathode electrode 406, the photoelectric conversion layer 407, and the anode electrode 408. Reference numeral 414 denotes a sensor wiring, and the anode electrode 408 and an external electric power source are connected by the sensor wiring 414.

Reference numeral 409 denotes a pixel electrode (anode), 410 denotes a light emitting layer, 411 denotes a hole injecting layer, and 412 denotes an opposing electrode (cathode). A light emitting element 422 is formed by the pixel electrode (anode) 409, the light emitting layer 410, the hole injecting layer 411 and the opposing electrode (cathode) 412. Reference numeral 413 denotes a protective film. Reference numeral 415 denotes an interlayer insulating film, and the interlayer insulating film functions as a bank and has a role in separating EL layers of adjacent pixels.

Reference numeral 423 denotes a subject, and light emitted form the light emitting element 422 is reflected by the subject 423 and irradiated to the photodiode 421. The subject 423 is placed on the side of the substrate 430 on which the TFTs are formed in embodiment 10.

The selection TFT 401, the driver TFT 402, the sensor driver TFT 404, and the sensor selection TFT 405 are all n-channel TFTs in embodiment 10. Further, the sensor reset TFT 403 is a p-channel TFT. Note that the present invention is not limited to this structure. The selection TFT 401, the driver TFT 402, the sensor driver TFT 404, the sensor selection TFT 405, and the sensor reset TFT 403 may each therefore be n-channel TFTs or p-channel TFTs.

However, if a source region or a drain region of the driver TFT 402 is electrically connected to the cathode of the light emitting element as in embodiment 10, then it is preferable that the driver TFT 402 be a n-channel TFT. Conversely, if the source region or the drain region of the driver TFT 402 is electrically connected to the anode of the light emitting element, then it is preferable that the driver TFT 402 be a p-channel TFT.

Furthermore, if a drain region of the sensor reset TFT 403 is electrically connected to the cathode electrode 406 of the photodiode 421 as in embodiment 10, then it is preferable that the sensor reset TFT 403 be a p-channel TFT and that the sensor driver TFT 404 be an n-channel TFT. Conversely, if the drain region of the sensor reset TFT 403 is electrically connected to the anode electrode 408 of the photodiode 421, and the sensor wiring 414 is electrically connected to the cathode electrode 406, then it is preferable that the sensor reset TFT 403 be an n-channel TFT, and that the sensor driver TFT 404 be a p-channel TFT.

Furthermore, it is possible to freely combine embodiment 10 with embodiment modes 1 to 3, and with embodiments 1 to 9.

[Embodiment 11]

An example of a cross sectional structure in a pixel portion of a semiconductor device of the present invention is explained in embodiment 11, differing from the example of embodiment 10.

Figure 22:
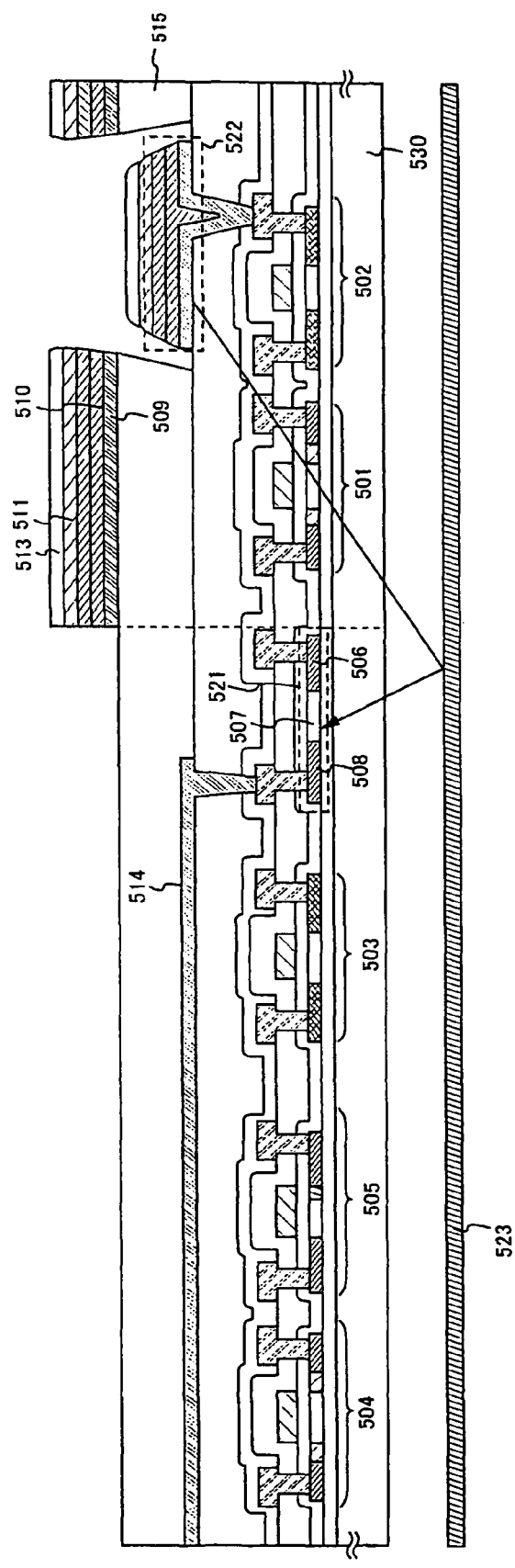
FIG. 22 is a cross sectional structure diagram of a semiconductor device of the present invention.

FIG. 22 shows a cross sectional diagram of a semiconductor device of embodiment 11. Reference numeral 501 denotes a selection TFT, reference numeral 502 denotes a driver TFT, 503 denotes a sensor reset TFT, 504 denotes a sensor driver TFT, and reference numeral 505 denotes a sensor selection TFT.

Further, reference numeral 506 denotes a cathode electrode, 507 denotes a photoelectric conversion layer, and 508 denotes an anode electrode. A photodiode 521 is formed by the cathode electrode 506, the photoelectric conversion layer 507, and the anode electrode 508. Reference numeral 514 denotes a sensor wiring, and the anode electrode 508 and an external electric power source are electrically connected by the sensor wiring 514. Further, the cathode electrode 506 of the photodiode 521 and a drain region of the sensor reset TFT 503 are electrically connected.

Reference numeral 509 denotes a pixel electrode (anode), 510 denotes a light emitting layer, and 511 denotes an opposing electrode (cathode). A light emitting element 522 is formed by the pixel electrode (anode) 509, the light emitting layer 510, and the opposing electrode (cathode) 511. Reference numeral 513 denotes a protective film. Reference numeral 515 denotes an interlayer insulating film, and the interlayer insulating film functions as a bank and plays a role in separating EL layers of adjacent pixels.

Reference numeral 523 denotes a subject, and light emitted form the light emitting element 522 is reflected by the subject 523 and irradiated to the photodiode 521. Differing from embodiment 10, the subject is placed on the side of the substrate 530 on which the TFTs are not formed in embodiment 11.

The selection TFT 501, the sensor driver TFT 504, and the sensor selection TFT 505 are all n-channel TFTs in embodiment 11. Further, the driver TFT 502 and the sensor reset TFT 503 are p-channel TFTs. Note that the present invention is not limited to this structure. The selection TFT 501, the driver TFT 502, the sensor driver TFT 504, the sensor selection TFT 505, and the sensor reset TFT 503 may each therefore be n-channel TFTs or p-channel TFTs.

However, if a source region or a drain region of the driver TFT 502 is electrically connected to the anode 509 of the light emitting element 522, then it is preferable that the driver TFT 502 be a p-channel TFT, as in embodiment 11. Conversely, if the source region or the drain region of the driver TFT 502 is electrically connected to the cathode of the light emitting element 522, then it is preferable that the driver TFT 502 be an n-channel TFT.

Furthermore, if a drain region of the sensor reset TFT 503 is electrically connected to the cathode electrode 506 of the photodiode 521, as in embodiment 11, then it is preferable that the sensor reset TFT 503 be a p-channel TFT and that the sensor driver TFr 504 be an n-channel TFT. Conversely, if the drain region of the sensor reset TFT 503 is electrically connected to the anode electrode 508 of the photodiode 521, and the sensor wiring 514 is electrically connected to the cathode electrode 506, then it is preferable that the sensor reset TFT 503 be an n-channel TFT, and that the sensor driver TFT 504 be a p-channel TFT.

Note that the photodiode of embodiment 11 can be formed at the same time as the other TFTs, and therefore the number of processing steps can be suppressed.

Furthermore, it is possible to freely combine embodiment 11 with embodiment modes 1 to 3, and with embodiments 1 to 10.

[Embodiment 12]

An example of a cross sectional structure in a pixel portion of a semiconductor device of the present invention is explained in embodiment 12, which is different from the example of embodiments 10 and 11.

Figure 23:
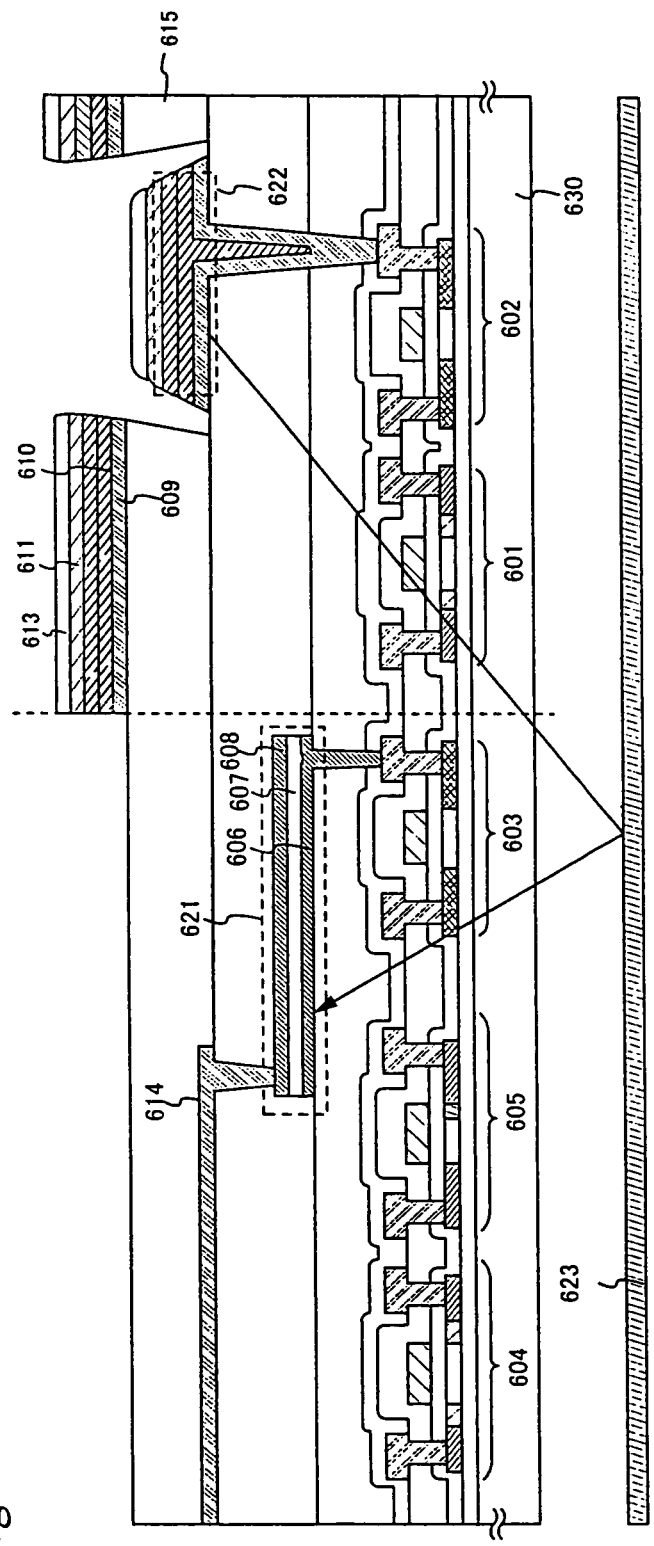
FIG. 23 is a cross sectional structure diagram of a semiconductor device of the present invention.

FIG. 23 shows a cross sectional diagram of a semiconductor device of embodiment 12. Reference numeral 601 denotes a selection TFT, reference numeral 602 denotes a driver TFT, 603 denotes a sensor reset TFT, 604 denotes a sensor driver TFT, and reference numeral 605 denotes a sensor selection TFT.

Further, reference numeral 606 denotes a cathode electrode, 607 denotes a photoelectric conversion layer, and 608 denotes an anode electrode. A photodiode 621 is formed by the cathode electrode 606, the photoelectric conversion layer 607, and the anode electrode 608. Reference numeral 614 denotes a sensor wiring, and the anode electrode 608 and an external electric power source are electrically connected by the sensor wiring 614. Further, the cathode electrode 606 of the photodiode and a drain region of the sensor reset TFT 603 are electrically connected.

Reference numeral 609 denotes a pixel electrode (anode), 610 denotes a light emitting layer, and 611 denotes an opposing electrode (cathode). A light emitting element 622 is formed by the pixel electrode (anode) 609, the light emitting layer 610, and the opposing electrode (cathode) 611. Reference numeral 613 denotes a protective film. Reference numeral 615 denotes an interlayer insulating film, and the interlayer insulating film functions as a bank and has a role in separating EL layers of adjacent pixels.

Reference numeral 623 denotes a subject, and light emitted form the light emitting element 622 is reflected by the subject 623 and irradiated to the photodiode 621. Unlike in embodiment 10, the subject 623 is placed on the side of the substrate 630 on which the TFTs are not formed in embodiment 12.

The selection TFT 601, the sensor driver TFT 604, and the sensor selection TFT 605 are all n-channel TFTs in embodiment 12. Further, the driver TFT 602 and the sensor reset TFF 603 are p-channel TFTs. Note that the present invention is not limited to this structure. The selection TFT 601, the driver TFT 602, the sensor driver TFT 604, the sensor selection TFT 605, and the sensor reset TFT 603 may each therefore be n-channel TFTs or p-channel TFTs.

However, if a source region or a drain region of the driver TFT 602 is electrically connected to the anode of the light emitting element as in embodiment 12, then it is preferable that the driver TFT 602 be a p-channel TFT. Conversely, if the source region or the drain region of the driver TFT 602 is electrically connected to the cathode of the light emitting element, then it is preferable that the driver TFT 602 be an n-channel TFT.

Furthermore, if a drain region of the sensor reset TFT 603 is electrically connected to the cathode electrode 606 of the photodiode 621 as in embodiment 12, then it is preferable that the sensor reset TFT be a p-channel TFT and that the sensor driver TFT 604 be an n-channel TFT. Conversely, if the drain region of the sensor reset TFT 603 is electrically connected to the anode electrode 608 of the photodiode 621, and the sensor wiring 614 is electrically connected to the cathode electrode 606, then it is preferable that the sensor reset TFT 603 be an n-channel TFT, and that the sensor driver TFT 504 be a p-channel TFT.

Furthermore, it is possible to freely combine embodiment 12 with embodiment modes 1 to 3, and with embodiments 1 to 11.

[Embodiment 13]

An example of a cross sectional structure in a pixel portion of a semiconductor device of the present invention is explained in embodiment 13, which is different from the example of embodiments 10 to 12.

Figure 24:
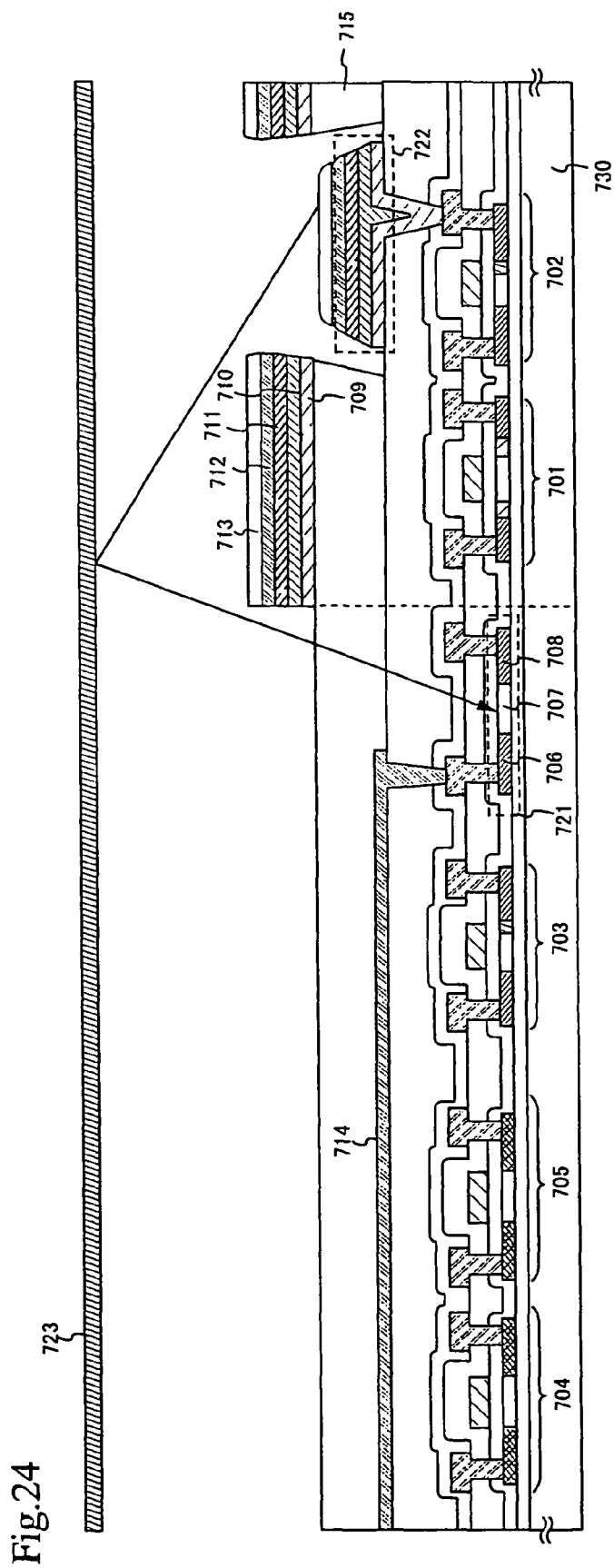
FIG. 24 is a cross sectional structure diagram of a semiconductor device of the present invention.

FIG. 24 shows a cross sectional diagram of a semiconductor device of embodiment 13. Reference numeral 701 denotes a selection TFT, reference numeral 702 denotes a driver TFT, 703 denotes a sensor reset TFT, 704 denotes a sensor driver TFT, and reference numeral 705 denotes a sensor selection TFT.

Further, reference numeral 706 denotes a cathode electrode, 707 denotes a photoelectric conversion layer, and 708 denotes an anode electrode. A photodiode 721 is formed by the cathode electrode 706, the photoelectric conversion layer 707, and the anode electrode 708. Reference numeral 714 denotes a sensor wiring, and the anode electrode 706 and an external electric power source are electrically connected by the sensor wiring 714. Further, the anode electrode 708 of the photodiode 721 and a drain region of the sensor reset TFT 703 are electrically connected.

Further, reference numeral 709 denotes a pixel electrode (cathode), 710 denotes a light emitting layer, 711 denotes a hole injecting layer, and 712 denotes an opposing electrode (anode). A light emitting element 722 is formed by the pixel electrode (cathode) 709, the light emitting layer 710, hole injecting layer 711, and the opposing electrode (anode) 712. Reference numeral 713 denotes a protective film. Reference numeral 715 denotes an interlayer insulating film. and the interlayer insulating film functions as a bank and has a role in separating EL layers of adjacent pixels.

Reference numeral 723 denotes a subject, and light emitted form the light emitting element 722 is reflected by the subject 723 and irradiated to the photodiode 721. The subject 723 is placed on the side of the substrate 730 on which the TFTs are formed in embodiment 13.

The selection TFT 701, the driver TFT 702, and the sensor reset TFT 703 are all n-channel TFTs in embodiment 13. Further, the sensor driver TFT 704 and the sensor selection TFT 705 are p-channel TFTs. Note that the present invention is not limited to this structure. The selection TFT 701, the driver TFT 702, the sensor driver TFT 704, the sensor selection TFT 705, and the sensor reset TFT 703 may each therefore be n-channel TFTs or p-channel TFTs.

However, if a source region or a drain region of the driver TFT 702 is electrically connected to the anode 709 of the light emitting element 722 as in embodiment 13, then it is preferable that the driver TFT 702 be an n-channel TFT. Conversely, if the source region or the drain region of the driver TFT 702 is electrically connected to the cathode 712 of the light emitting element 722, then it is preferable that the driver TFT 702 be a p-channel TFT.

Furthermore, if a drain region of the sensor reset TFT 703 is electrically connected to the anode electrode 708 of the photodiode 721 as in embodiment 11, then it is preferable that the sensor reset TFT 703 be an n-channel TFT and that the sensor driver TFT 704 be a p-channel TFT. Conversely, if the drain region of the sensor reset TFT 703 is connected to the cathode electrode 706 of the photodiode 721, and the sensor wiring 714 is connected to the anode electrode 708, then it is preferable that the sensor rest TFT 703 be a p-channel TFT, and that the sensor driver TFT 704 be an n-channel TFT.

Note that the photodiode 721 of embodiment 13 can be formed at the same time when other TFTs are formed, and therefore the number of processing steps can be suppressed.

Furthermore, it is possible to freely combine embodiment 13 with embodiment modes 1 to 3, and with embodiments 1 to 12.

[Embodiment 14]

An example of a cross sectional structure of a pixel portion of a semiconductor device of the present invention is explained in embodiment 14, differing from the examples of embodiments 10 to 13.

Figure 25:
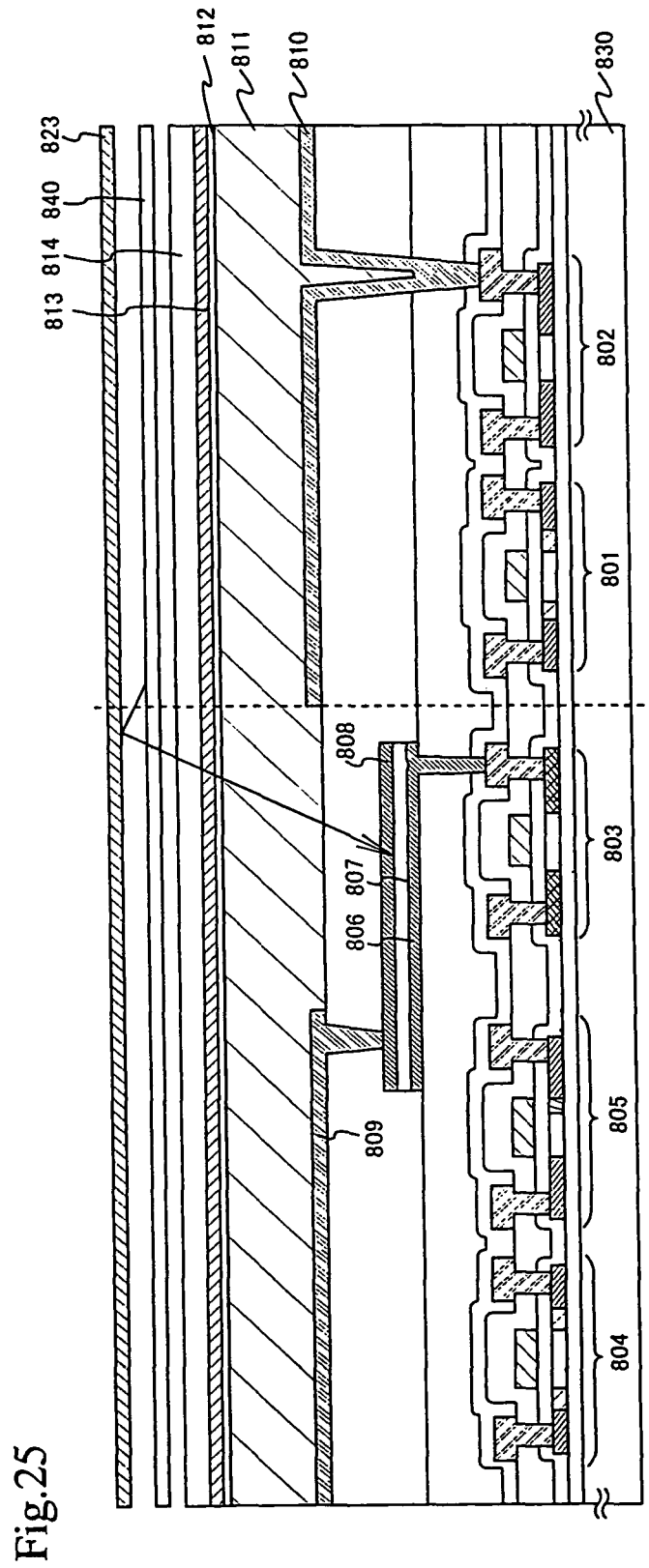
FIG. 25 is a cross sectional structure diagram of a semiconductor device of the present invention.

A cross sectional diagram of a semiconductor device of embodiment 14 is shown in FIG. 25. Reference numeral 801 denotes a liquid crystal selection TFT, reference numeral 802 denotes a capacitor, 803 denotes a sensor reset TFT, 804 denotes a sensor driver TFT, and reference numeral 805 denotes a sensor selection TFT.

Further, reference numeral 806 denotes a light shielding layer which is made from Mg or Ti. Reference numeral 807 denotes a photodiode which is formed from three layers, a p-type semiconductor layer, a photoelectric conversion layer, and an n-type semiconductor layer. Reference numeral 808 denotes a transparent conductive layer made from ITO, and reference numeral 809 denotes a sensor signal output line SS.

Reference numeral 810 denotes a pixel electrode (cathode), 811 denotes a liquid crystal layer, 812 denotes an orientation film, 813 denotes an ITO film, and reference numeral 814 denotes a transparent insulating substrate.

Reference numeral 840 denotes a photoconductive plate, and a front light is formed in an edge of the photoconductive plate. Reference numeral 823 denotes a substrate, and light emitted from the photoconductive plate 840 is reflected by the subject 823 and irradiated to the photodiode 807. The subject is placed on the side of a substrate 830 on which the TFTs are formed in embodiment 14.

The liquid crystal selection TFT 801, the capacitor 802, and the sensor reset TFT 803 are all n-channel TFTs in embodiment 14. Further, the sensor driver TFT 804 and the sensor selection TFT 805 are p-channel TFTs. Note that the present invention is not limited to this structure. The liquid crystal selection TFT 801, the capacitor 802, the sensor driver TFT 804, the sensor selection TFT 805, and the sensor reset TFT 803 each can therefore be n-channel TIFTs or p-channel TFITs.

Note that it is possible to freely combine embodiment 14 with embodiment modes 1 to 3, and with embodiments 1 to 13.

[Embodiment 15]

An example of a cross sectional structure in a pixel portion of a semiconductor device of the present invention is explained in embodiment 15, which is different from those of embodiments 10 to 14.

Figure 26:
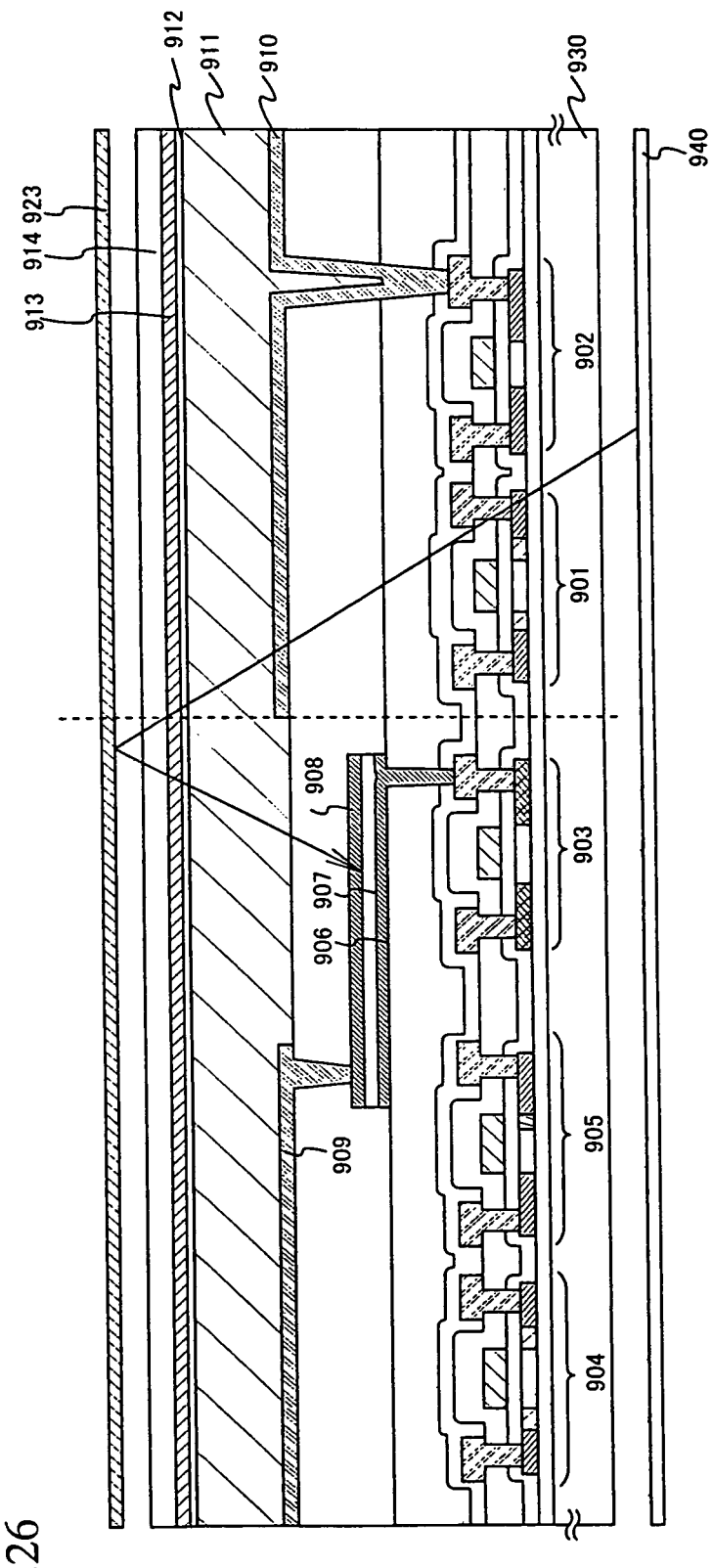
FIG. 26 is a cross sectional structure diagram of a semiconductor device of the present invention.

A cross sectional diagram of a semiconductor device of embodiment 15 is shown in FIG. 26. Reference numeral 901 denotes a liquid crystal selection TFT, reference numeral 902 denotes a capacitor, 903 denotes a sensor reset TFT, 904 denotes a sensor driver TFT, and reference numeral 905 denotes a sensor selection TFT.

Further, reference numeral 906 denotes a light shielding layer which is made from Mg or Ti. Reference numeral 907 denotes a photodiode which is formed from three layers, a p-type semiconductor layer, a photoelectric conversion layer, and an n-type semiconductor layer. Reference numeral 908 denotes a transparent conductive layer made from ITO, and reference numeral 909 denotes a sensor signal output line SS.

Reference numeral 910 denotes a pixel electrode (cathode), 911 denotes a liquid crystal layer, 912 denotes an orientation film, 913 denotes an ITO film (transparent conductive film), and reference numeral 914 denotes a transparent insulating substrate.

Reference numeral 940 denotes a photoconductive plate, and a back light is formed in an edge of the photoconductive plate 940. Reference numeral 923 denotes a substrate, and light emitted from the photoconductive plate 940 is reflected by the subject 923 and irradiated to the photodiode 907. The subject 923 is placed on the side of the substrate 930 on which the TFTs are formed in embodiment 15.

The liquid crystal selection TFT 901, the capacitor 902, and the sensor reset TFT 903 are all n-channel TFTs in embodiment 15. Further, the sensor driver TFT 904 and the sensor selection TFT 905 are p-channel TFTs. Note that the present invention is not limited to this structure. The liquid crystal selection TFT 901, the capacitor 902, the sensor driver TFT 904, the sensor selection TFT 905, and the sensor reset TFT 903 can therefore each be n-channel TFTs or p-channel TFTs.

Note that it is possible to freely combine embodiment 15 with embodiment modes 1 to 3, and with embodiments 1 to 14.

[Embodiment 16]

The following can be given as examples of electronic equipment using a semiconductor device of the present invention: video cameras, digital cameras, goggle type displays (head mounted displays), navigation systems, audio playback devices (such as car stereos, and audio components), notebook type personal computers, game devices, portable information terminals (such as mobile computers, portable telephones, portable game machines, or electronic books), and image playback devices prepared with a recording medium (specifically, a device which plays a recording medium such as a digital video disk (DVD) and is equipped with a display for displaying the images played). In particular, it is preferable to use a light emitting device for portable information terminals, whose screens are often viewed from an angle, in order to increase the angle of view. Specific examples of these electronic devices are shown in FIGS. 27A to 27C.

Figure 27A:
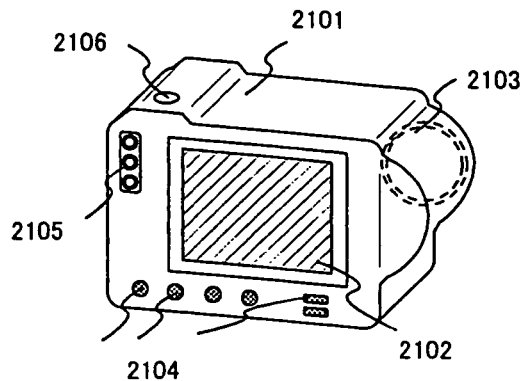
FIGS. 27A to 27C are diagrams of examples of electronic equipment to which the present invention is applied.

FIG. 27A is a digital video camera, and contains components such as a main body 2101, a display portion 2102, an external connection port 2105, an image receiving portion 2103, operation keys 2104, and a shutter 2106. The semiconductor device of the present invention can be used in the display portion 2102.

Figure 27B:
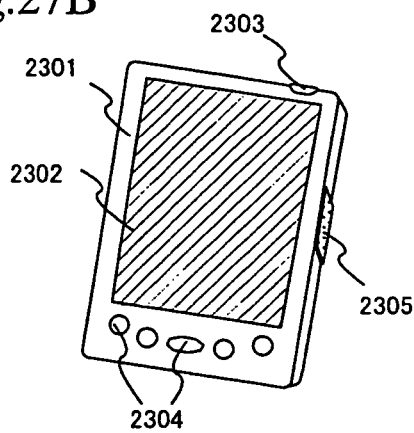

FIG. 27B is a mobile computer, and contains components such as a main body 2301, a display portion 2302, a switch 2303, operation keys 2304, and an infrared port 2305. The semiconductor device of the present invention can be used in the display portion 2302.

Figure 27C:
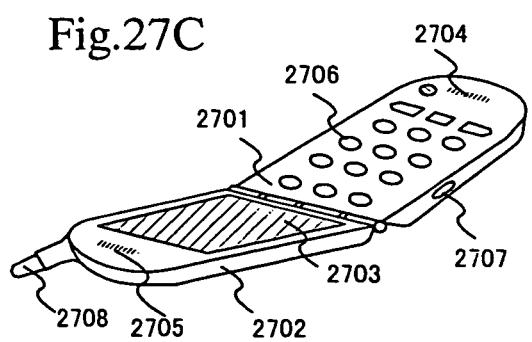

FIG. 27C is a portable telephone, and contains components such as a main body 2701, a frame 2702, a display portion 2703, a voice input portion 2704, a voice output portion 2705, operation keys 2706, an external connection port 2707, and an antenna 2708. The semiconductor device of the present invention can be used in the display portion 2703. Note that the display portion 2703 can reduce the electric power consumption of the portable telephone by displaying white color characters in a black color background.

Note that it will become possible to use the semiconductor device of the present invention in front type and rear type projectors by magnifying and projecting the light containing image information output by the semiconductor device, provided that the brightness of the light emitted by the light emitting material increases in the future. Further, the aforementioned electronic equipment often display information distributed through electronic communication circuits such as the Internet and cable television (CATV), and in particular, the display of dynamic image information has increased. The response speed of the light emitting materials in the semiconductor device of the present invention when using light emitting elements is extremely high, and therefore the semiconductor device is desirable for the display of dynamic images.

Further, portions emitting light consume energy in the semiconductor device of the present invention when using light emitting elements, and it is therefore preferable to display information such that the light emitting portions become as small as possible. It is therefore preferable to drive the light emitting portions so that non-light emitting portions are used as a background and character information is formed by the light emitting portions when using the light emitting device in display portions which mainly display character information such as those of portable information terminals, in particular portable telephones and audio playback devices.

The applicable range of the present invention is thus extremely wide. and it is possible to use the present invention in electronic equipment of all fields. Further, it is possible to freely combine embodiment 16 with embodiments 1 to 3, and with embodiments 1 to 15.

[Embodiment 17]

Figure 28A:
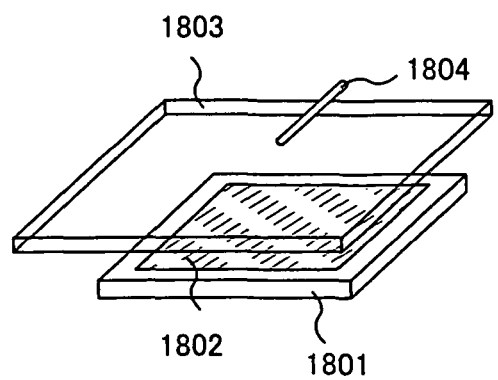
FIGS. 28A to 28C are diagrams of examples of electronic equipment to which the present invention is applied.
Figure 28B:
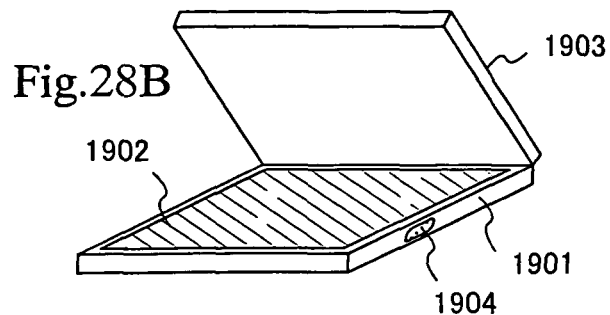
Figure 28C:
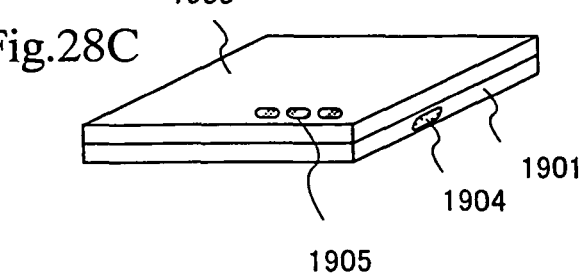

A portable hand scanner is explained in embodiment 17 using FIG. 28A to 28C, differing from the examples of electronic equipment using a semiconductor device of the present invention discussed in embodiment 16.

Reference numeral 1801 denotes a substrate, reference numeral 1802 denotes a pixel portion, reference numeral 1803 denotes a touch panel, and reference numeral 1804 denotes a touch pen. The touch panel 1803 has transparency, and light emitted form the pixel portion 1802, as well as light made incident on the pixel portion 1802, can pass through the touch panel 1803. An image of a subject can be read in through the touch panel 1803. Further, it is possible to see an image on the pixel portion 1802 through the touch panel 1803 in the case where an image is displayed in the pixel portion 1802.

Information on the position at which the touch pen 1804 and the touch panel 1803 are in contact with each other can be taken in by the semiconductor device as an electronic signal if the touch pen 1804 touches the touch panel 1803. The touch panel 1803 and the touch pen 1804 used in embodiment 17 has transparency, and provided that information on the position of portions at which the touch pen 1804 and the touch panel 1803 contact can be read in by the semiconductor device as an electronic signal, known touch panels and touch pens can be used.

An image is read in, the image read in the pixel portion 1802 is displayed, and write in by the touch pen 1804 can be performed to the read in image in the semiconductor device of the present invention having the above structure. The semiconductor device of the present invention can perform read in of an image, display of the image, and write in to the image in the pixel portion 1802. The size of the semiconductor device itself can therefore be controlled, and the semiconductor device can be made to possess many types of functions.

FIG. 28B is a portable hand scanner differing from that of FIG. 28A, and is structured by a main body 1901, a pixel portion 1902, an upper over 1903, an external connection port 1904, and operation switches 1905. FIG. 28C is a diagram of the same portable hand scanner as in FIG. 28B, in which the cover 1903 is closed.

It is possible to display a read in image in the pixel portion 1902 in the semiconductor device of the present invention, and verification of the input image can be made as it is read in, without forming a new semiconductor device for electronic display.

Furthermore, it is possible to send the image signal input by the semiconductor device 1902 to electronic equipment connected externally to the portable hand scanner from the external connection port 1904, and image correction, synthesis, editing, and the like can be performed by software.

Note that it is possible to freely combine embodiment 17 with embodiment modes 1 to 3, and with embodiments 1 to 16.

By forming light emitting elements as a light source, and by forming photodiodes as photoelectric conversion elements on the same substrate, the semiconductor device of the present invention can realize miniaturization. Further, it becomes possible to control two signal lines by using one driver circuit by using an output switching circuit. As a result, it becomes possible to make the surface area occupied by the driver circuits of the semiconductor device smaller, and to realize a reduction in size of the semiconductor device.

What is claimed is:

1. A semiconductor device configured to selectively drive either of a sensor portion and a light emitting portion from a shift register output, comprising:
    a pixel portion comprising a pixel, the pixel comprising the sensor portion and the light emitting element portion;
    a selection signal line drive circuit comprising a shift register configured to output a signal;
    a selection output switching circuit electrically connected to the shift register, the selection output switching circuit comprising a first logical circuit and a second logical circuit each comprising a first input terminal electrically connected to the shift register, and
    a mode control wiring electrically connected to a second input terminal of the first logical circuit and to a second input terminal of the second logical circuit, the first and second logical circuits of the selection output switching circuit being configured to receive from the mode control wiring a read in mode signal and a display mode signal,
    wherein the sensor portion and the light emitting element portion are electrically connected to an output terminal of the first logical circuit and to an output terminal of the second logical circuit, respectively,
    wherein the selection signal line drive circuit is configured to output the signal to the first input terminal of the first logical circuit and to the first input terminal of the second logical circuit, and
    wherein the selection output switching circuit is configured to transmit the outputted signal exclusively to the sensor portion when the read in mode signal is received and is configured to transmit the outputted signal exclusively to the light emitting element portion when the display mode signal is received.

2. The semiconductor device according to claim 1, wherein one of the first logical circuit and the second logical circuit is a AND circuit and the other is a NOR circuit.

3. The semiconductor device according to claim 1, wherein one of the first logical circuit and the second logical circuit is an AND circuit and the other is a NOR circuit.

4. The semiconductor device according to claim 1, wherein one of the first logical circuit and the second logical circuit is a NAND circuit and the other is an OR circuit.

5. The semiconductor device according to claim 1, wherein one of the first logical circuit and the second logical circuit is an AND circuit and the other is an OR circuit.

6. The semiconductor device according to claim 1, wherein the output terminal of the first logical circuit is electrically connected to the sensor portion through at least one inverter circuit.

7. The semiconductor device according to claim 1, wherein the output terminal of the second logical circuit is electrically connected to the light emitting element portion through at least one inverter circuit.

8. The semiconductor device according to claim 1, wherein the pixel comprises a light emitting element, a selection transistor, a driver transistor, a reset transistor, a photoelectric conversion element, a sensor selection transistor, a sensor driver transistor, and a sensor reset transistor.

9. The semiconductor device according to claim 1, wherein the pixel comprises a light emitting element, a selection transistor, a driver transistor, a photoelectric conversion element, a sensor selection transistor, a sensor driver transistor, and a sensor reset transistor.

10. The semiconductor device according to claim 1, wherein the pixel comprises three light emitting elements and one photoelectric conversion element.

11. A display device using the semiconductor device according to claim 1.

12. A scanner using the semiconductor device according to claim 1.

13. A portable information terminal using the semiconductor device according to claim 1.

14. The semiconductor device according to claim 1, wherein the first logical circuit and the second logical circuit belong to two distinct branches of the selection output switching circuit, the two distinct branches being both directly connected to the selection signal line drive circuit and to the mode control wiring.

15. A semiconductor device configured to selectively drive either of a sensor portion and a liquid crystal element portion from a shift register output, comprising:
    a pixel portion comprising a pixel, the pixel comprising the sensor portion and the liquid crystal element portion;
    a selection signal line drive circuit comprising a shift register configured to output a signal;
    a selection output switching circuit electrically connected to the shift register, the selection output switching circuit comprising a first logical circuit and a second logical circuit each comprising a first input terminal electrically connected to the shift register, and
    a mode control wiring electrically connected to a second input terminal of the first logical circuit and to a second input terminal of the second logical circuit, the first and second logical circuits of the selection output switching circuit being configured to receive from the mode control wiring a read in mode signal and a display mode signal,
    wherein the sensor portion and the liquid crystal element portion are electrically connected to an output terminal of the first logical circuit and to an output terminal of the second logical circuit, respectively,
    wherein the selection signal line drive circuit is configured to output the signal to the first input terminal of the first logical circuit and to the first input terminal of the second logical circuit, and
    wherein the selection output switching circuit is configured to transmit the outputted signal exclusively to the sensor portion when the read in mode signal is received and is configured to transmit the outputted signal exclusively to the liquid crystal element portion when the display mode signal is received.

16. The semiconductor device according to claim 15, wherein one of the first logical circuit and the second logical circuit is a NAND circuit and the other is a NOR circuit.

17. The semiconductor device according to claim 15, wherein one of the first logical circuit and the second logical circuit is an AND circuit and the other is a NOR circuit.

18. The semiconductor device according to claim 15, wherein one of the first logical circuit and the second logical circuit is a NAND circuit and the other is an OR circuit.

19. The semiconductor device according to claim 15, wherein one of the first logical circuit and the second logical circuit is an AND circuit and the other is an OR circuit.

20. The semiconductor device according to claim 15, wherein the output terminal of the first logical circuit is electrically connected to the sensor portion through at least one inverter circuit.

21. The semiconductor device according to claim 15, wherein the output terminal of the second logical circuit is electrically connected to the liquid crystal element portion through at least one inverter circuit.

22. The semiconductor device according to claim 15, wherein the pixel comprises a liquid crystal selection transistor, a photoelectric conversion element, a sensor selection transistor, a sensor driver transistor, and a sensor reset transistor.

23. The semiconductor device according to claim 15, wherein the pixel comprises three liquid crystal elements and one photoelectric conversion element.

24. A display device using the semiconductor device according to claim 15.

25. A scanner using the semiconductor device according to claim 15.

26. A portable information terminal using the semiconductor device according to claim 15.

27. The semiconductor device according to claim 15, wherein the first logical circuit and the second logical circuit belong to two distinct branches of the selection output switching circuit, the two distinct branches being both directly connected to the selection signal line drive circuit and to the mode control wiring.

28. A semiconductor device configured to selectively drive either of a sensor portion and a light emitting portion from a shift register output, comprising:
a pixel portion comprising a pixel, the pixel comprising the sensor portion and the light emitting element portion;
a selection signal line drive circuit comprising a shift register configured to output a signal;
a selection output switching circuit electrically connected to the shift register, the selection output switching circuit comprising a first logical circuit and a second logical circuit each comprising a first input terminal electrically connected to the shift register,
a mode control wiring electrically connected to a second input terminal of the first logical circuit and to a second input terminal of the second logical circuit, the first and second logical circuits of the selection output switching circuit being configured to receive from the mode control wiring a read in mode signal and a display mode signal, and
a first transistor in the sensor portion and a second transistor in the light emitting element portion,
wherein a gate of the first transistor is electrically connected to the first logical circuit, and a gate of the second transistor is electrically connected to the second logical circuit, wherein the selection signal line drive circuit is configured to output the signal to the first input terminal of the first logical circuit and to the first input terminal of the second logical circuit, and
wherein the selection output switching circuit is configured to transmit the outputted signal exclusively to the gate of the first transistor when the read in mode signal is received and is configured to transmit the outputted signal exclusively to the gate of the second transistor when the display mode signal is received.

29. The semiconductor device according to claim 28, wherein one of the first logical circuit and the second logical circuit is a NAND circuit and the other is a NOR circuit.

30. The semiconductor device according to claim 28, wherein one of the first logical circuit and the second logical circuit is an AND circuit and the other is a NOR circuit.

31. The semiconductor device according to claim 28, wherein one of the first logical circuit and the second logical circuit is a NAND circuit and the other is an OR circuit.

32. The semiconductor device according to claim 28, wherein one of the first logical circuit and the second logical circuit is an AND circuit and the other is an OR circuit.

33. The semiconductor device according to claim 28, wherein one of the first transistor and the second transistor is a selection transistor, and the other is a sensor selection transistor.

34. The semiconductor device according to claim 28, wherein one of the first transistor and the second transistor is a selection transistor, and the other is a sensor reset transistor.

35. The semiconductor device according to claim 28, wherein one of the first transistor and the second transistor is a reset transistor, and the other is a sensor reset transistor.

36. The semiconductor device according to claim 28, wherein one of the first transistor and the second transistor is a reset transistor, and the other is a sensor selection transistor.

37. The semiconductor device according to claim 28, wherein the output terminal of the first logical circuit is electrically connected to the sensor portion through at least one inverter circuit.

38. The semiconductor device according to claim 28, wherein the output terminal of the second logical circuit is electrically connected to the light emitting element portion through at least one inverter circuit.

39. The semiconductor device according to claim 28, wherein the pixel comprises a light emitting element, a selection transistor, a driver transistor, a reset transistor, a photoelectric conversion element, a sensor selection transistor, a sensor driver transistor, and a sensor reset transistor.

40. The semiconductor device according to claim 28, wherein the pixel comprises a light emitting element, a selection transistor, a driver transistor, a photoelectric conversion element, a sensor selection transistor, a sensor driver transistor, and a sensor reset transistor.

41. The semiconductor device according to claim 28, wherein the pixel comprises three light emitting elements and one photoelectric conversion element.

42. A display device using the semiconductor device according to claim 28.

43. A scanner using the semiconductor device according to claim 28.

44. A portable information terminal using the semiconductor device according to claim 28.

45. The semiconductor device according to claim 28, wherein the first logical circuit and the second logical circuit belong to two distinct branches of the selection output switching circuit, the two distinct branches being both directly connected to the selection signal line drive circuit and to the mode control wiring.

46. A semiconductor device configured to selectively drive either of a sensor portion and a liquid crystal element portion from a shift register output, comprising:
 a pixel portion comprising a pixel, the pixel comprising the sensor portion and the liquid crystal element portion;
 a selection signal line drive circuit comprising a shift register configured to output a signal;
 a selection output switching circuit electrically connected to the shift register, the selection output switching circuit comprising a first logical circuit and a second logical circuit each comprising a first input terminal electrically connected to the shift register,
 a mode control wiring electrically connected to a second input terminal of the first logical circuit and to a second input terminal of the second logical circuit, the first and second logical circuits of the selection output switching circuit being configured to receive from the mode control wiring a read in mode signal and a display mode signal, and
 a first transistor in the sensor portion and a second transistor in the liquid crystal element portion,
 wherein a gate of the first transistor is electrically connected to the first logical circuit, and a gate of the second transistor is electrically connected to the second logical circuit,
 wherein the selection signal line drive circuit is configured to output the signal to the first input terminal of the first logical circuit and to the first input terminal of the second logical circuit, and
 wherein the selection output switching circuit is configured to transmit the outputted signal exclusively to the gate of the first transistor when the read in mode signal is received and is configured to transmit the outputted signal exclusively to the gate of the second transistor when the display mode signal is received.

47. The semiconductor device according to claim 46, wherein one of the first logical circuit and the second logical circuit is a NAND circuit and the other is a NOR circuit.

48. The semiconductor device according to claim 46, wherein one of the first logical circuit and the second logical circuit is an AND circuit and the other is a NOR circuit.

49. The semiconductor device according to claim 46, wherein one of the first logical circuit and the second logical circuit is a NAND circuit and the other is an OR circuit.

50. The semiconductor device according to claim 46, wherein one of the first logical circuit and the second logical circuit is an AND circuit and the other is an OR circuit.

51. The semiconductor device according to claim 46, wherein one of the first transistor and the second transistor is a liquid crystal selection transistor, and the other is a sensor selection transistor.

52. The semiconductor device according to claim 46, wherein one of the first transistor and the second transistor is a liquid crystal selection transistor, and the other one is a sensor reset transistor.

53. The semiconductor device according to claim 46, wherein the output terminal of the first logical circuit is electrically connected to the sensor portion through at least one inverter circuit.

54. The semiconductor device according to claim 46, wherein the output terminal of the second logical circuit is electrically connected to the liquid crystal element portion through at least one inverter circuit.

55. The semiconductor device according to claim 46, wherein the pixel comprises a liquid crystal selection transistor, a photoelectric conversion element, a sensor selection transistor, a sensor driver transistor, and a sensor reset transistor.

56. The semiconductor device according to claim 46, wherein the pixel comprises three liquid crystal elements and one photoelectric conversion element.

57. A display device using the semiconductor device according to claim 46.

58. A scanner using the semiconductor device according to claim 46.

59. A portable information terminal using the semiconductor device according to claim 46.

60. The semiconductor device according to claim 46, wherein the first logical circuit and second logical circuit belong to two distinct branches of the selection output switching circuit, the two distinct branches being both directly connected to the selection signal line drive circuit and to the mode control wiring.

61. A semiconductor device configured to selectively drive either of a sensor and a light emitting element from a shift register output, comprising:
 a pixel portion comprising a pixel, the pixel comprising the sensor, a sensor selection transistor electrically connected to the sensor, the light emitting element, and a light emitting element selection transistor electrically connected to the light emitting element;
 a selection signal line drive circuit comprising a shift register configured to output signal;
 a selection output switching circuit electrically connected to the shift register to receive the outputted signal, and
 a mode control wiring electrically connected to the selection output switching circuit, the selection output switching circuit being configured to receive from the mode control wiring a read in mode signal and a display mode signal,
 wherein a gate of the sensor selection transistor and a gate of the light emitting element selection transistor are both electrically connected to the selection output switching circuit, and
 wherein the selection output switching circuit is configured to transmit the outputted signal exclusively to the gate of the sensor selection transistor when the read mode signal is received and is configured to transmit the outputted signal exclusively to the gate of the light emitting selection transistor when the display mode signal is received.

62. The semiconductor device according to claim 61, wherein the selection output switching circuit comprises a first logical circuit and a second logical circuit, the first logical circuit being configured to transmit the outputted signal to the sensor selection transistor and not to the light emitting element selection transistor, and the second logical circuit being configured to transmit the outputted signal to the light emitting element selection transistor and not to the sensor selection transistor.

63. The semiconductor device according to claim 62, wherein one of the first logical circuit and the second logical circuit is a NAND circuit and the other is a NOR circuit.

64. The semiconductor device according to claim 62, wherein one of the first logical circuit and the second logical circuit is an AND circuit and the other is a NOR circuit.

65. The semiconductor device according to claim 62, wherein one of the first logical circuit and the second logical circuit is a NAND circuit and the other is an OR circuit.

66. The semiconductor device according to claim 62, wherein one of the first logical circuit and the second logical circuit is an AND circuit and the other is an OR circuit.

67. The semiconductor device according to claim 62, wherein an output terminal of the first logical circuit is electrically connected to at least one inverter circuit.

68. The semiconductor device according to claim 62, wherein an output terminal of the first logical circuit is electrically connected to at least one inverter circuit.

69. A display device using the semiconductor device according to claim 61.

70. A scanner using the semiconductor device according to claim 61.

71. A portable information terminal using the semiconductor device according to claim 61.

72. The semiconductor device according to claim 61,
wherein the sensor selection transistor and the light emitting element selection transistor are connected to a corresponding one of two distinct branches of the selection output switching circuit, the two distinct branches being both directly connected to the selection signal line drive circuit and to the mode control wiring.

73. The semiconductor device according to claim 61,
wherein the sensor selection transistor and the light emitting element selection transistor are each directly connected to a corresponding one of two distinct branches of the selection output switching circuit, the two distinct branches being both directly connected to the selection signal line drive circuit and to the mode control wiring.

74. A semiconductor device configured to selectively drive either of a sensor and a liquid crystal element from a shift register output, comprising:
   a pixel portion comprising a pixel, the pixel comprising the sensor, a sensor selection transistor electrically connected to the sensor, the liquid crystal element, and a liquid crystal element selection transistor electrically connected to the liquid crystal element;
   a selection signal line drive circuit comprising a shift register configured to output a signal;
   a selection output switching circuit electrically connected to the shift register to receive the outputted signal, and
   a mode control wiring electrically connected to the selection output switching circuit, the selection output switching circuit being configured to receive from the mode control wiring a read in mode signal and a display mode signal,
   wherein a gate of the sensor selection transistor and a gate of the liquid crystal element selection transistor are both electrically connected to the selection output switching circuit, and
   wherein the selection output switching circuit is configured to transmit the outputted signal exclusively to the gate of the sensor selection transistor when the read in mode signal is received and is configured to transmit the outputted signal exclusively to the gate of the liquid crystal element selection transistor when the display ,ode signal is received.

75. The semiconductor device according to claim 74, wherein the selection output switching circuit comprises a first logical circuit and a second logical circuit, the first logical circuit being configured to transmit the outputted signal to the sensor selection transistor and not to the liquid crystal element selection transistor, and the second logical circuit being configured to transmit the outputted signal to the liquid crystal element selection transistor and not to the sensor selection transistor.

76. The semiconductor device according to claim 75, wherein one of the first logical circuit and the second logical circuit is a NAND circuit and the other is a NOR circuit.

77. The semiconductor device according to claim 75, wherein one of the first logical circuit and the second logical circuit is an AND circuit and the other is a NOR circuit.

78. The semiconductor device according to claim 75, wherein one of the first logical circuit and the second logical circuit is a NAND circuit and the other is an OR circuit.

79. The semiconductor device according to claim 75, wherein one of the first logical circuit and the second logical circuit is an AND circuit and the other is an OR circuit.

80. The semiconductor device according to claim 75, wherein an output terminal of the first logical circuit is connected to at least one inverter circuit.

81. The semiconductor device according to claim 75, wherein an output terminal of the second logical circuit is electrically connected to at least one inverter circuit.

82. A display device using the semiconductor device according to claim 74.

83. A scanner using the semiconductor device according to claim 74.

84. A portable information terminal using the semiconductor device according to claim 74.

85. The semiconductor device according to claim 74,
wherein the sensor selection transistor and the liquid crystal element selection transistor are each directly connected to a corresponding one of two distinct branches of the selection output switching circuit, the two distinct branches being both directly connected to the selection signal line drive circuit and to the mode control wiring.

* * * * *

UNITED STATES PATENT AND TRADEMARK OFFICE
CERTIFICATE OF CORRECTION

PATENT NO. : 9,123,672 B2
APPLICATION NO. : 10/822848
DATED : September 1, 2015
INVENTOR(S) : Hajime Kimura It is certified that error appears in the above-identified patent and that said Letters Patent is hereby corrected as shown below:

In The Specification

At column 5, line 7, "a selection-" should be --a selection--;

At column 6, line 12, "TFr" should be --TFT--;

At column 6, line 14, "TFr" should be --TFT--;

At column 6, line 30, "TFr" should be --TFT--;

At column 6, line 41, "TFTs-within" should be --TFTs within--;

At column 12, line 32, "are. shown" should be --are shown--;

At column 12, line 43, "Further.," should be --Further,--;

At column 13, line 62, "line SG." should be --line SG,--;

At column 14, line 14, "(i.,j)" should be --(i,j)--;

At column 15, line 53, "251$b$." should be --251b,--;

At column 16, line 34, "254$d$." should be --254b--;

At column 17, line 19, "252$d$." should be --252d,--;

At column 17, line 60, "TFFs" should be --TFTs--;

At column 18, line 32, "on. signal" should be --on signal--;

At column 19, line 13, "line Si." should be --line Si,--;

At column 19, line 20, "TFr" should be --TFT--;

At column 22, line 3, "and B." should be --and B,--;

At column 22, line 67, "TFTrs" should be --TFTs--;

At column 23, line 56, "Tsl" should be --Ts1--;

At column 24, line 21, ":$2^{-2}$: . . ." should be --:$2^{-2}$: . . . :--;

At column 26, line 11, "readino" should be --reading--;

At column 26, line 27, "1 to 3." should be --1 to 3,--;

Signed and Sealed this
Fifteenth Day of March, 2016

Michelle K. Lee
*Director of the United States Patent and Trademark Office*

CERTIFICATE OF CORRECTION (continued)
U.S. Pat. No. 9,123,672 B2

At column 27, line 4, "TT" should be --TFT--;

At column 28, line 22, "portion." should be --portion,--;

At column 31, line 57, "TFr" should be --TFT--;

At column 32, line 41, "TFF" should be --TFT--;

At column 33, line 32, "film." should be --film,--;

At column 34, line 43, "TIFTs" should be --TFTs--;

At column 34, line 44, "TFITs." should be --TFTs.--;

At column 36, line 19, "wide." should be --wide,--;

In The Claims

In claim 2, column 37, line 58, "AND" should be --NAND--;

In claim 60, column 42, line 14, "and second" should be --and the second--;

In claim 61, column 42, line 28, "output signal;" should be --output a signal;--;

In claim 61, column 42, line 42, "read mode" should be --read in mode--;

In claim 61, column 42, lines 44-45, "emitting selection" should be --emitting element selection--;

In claim 68, column 43, line 5, "the first" should be --the second--;

In claim 74, column 44, line 6, ",ode" should be --mode--;

In claim 80, column 44, line 30-31, "is connected" should be --is electrically connected--.